(12) United States Patent
Takagi et al.

(10) Patent No.: US 11,630,252 B2
(45) Date of Patent: Apr. 18, 2023

(54) OPTICAL FILTER AND IMAGING APPARATUS

(71) Applicant: Nippon Sheet Glass Company, Limited, Tokyo (JP)

(72) Inventors: Tomitaka Takagi, Tokyo (JP); Katsuhide Shimmo, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 280 days.

(21) Appl. No.: 16/652,925

(22) PCT Filed: Sep. 19, 2018

(86) PCT No.: PCT/JP2018/034697
§ 371 (c)(1),
(2) Date: Apr. 1, 2020

(87) PCT Pub. No.: WO2019/069689
PCT Pub. Date: Apr. 11, 2019

(65) Prior Publication Data
US 2020/0319387 A1    Oct. 8, 2020

(30) Foreign Application Priority Data
Oct. 3, 2017 (JP) .............................. JP2017-193908

(51) Int. Cl.
*G02B 5/20* (2006.01)
*G03B 11/00* (2021.01)

(52) U.S. Cl.
CPC .............. *G02B 5/208* (2013.01); *G03B 11/00* (2013.01)

(58) Field of Classification Search
CPC ............ G02B 5/208; G02B 5/20; G02B 5/22; G02B 5/223; G03B 11/00
See application file for complete search history.

(56) References Cited

U.S. PATENT DOCUMENTS

| 9,762,874 B2 | 9/2017 | Ando et al. |
| 10,809,427 B2 | 10/2020 | Kubo et al. |
| 2014/0063597 A1 | 3/2014 | Shimmo et al. |

(Continued)

FOREIGN PATENT DOCUMENTS

| JP | 2012103340 | 5/2012 |
| JP | 2014048402 A | 3/2014 |

(Continued)

OTHER PUBLICATIONS

International Search Report and Written Opinion issued for International Patent Application No. PCT/JP2018/034697, dated Nov. 20, 2018, 8 pages including English translation of Search Report.

(Continued)

*Primary Examiner* — Derek S. Chapel
*Assistant Examiner* — Adam W Booher
(74) *Attorney, Agent, or Firm* — Hamre, Schumann, Mueller & Larson, P.C.

(57) ABSTRACT

An optical filter (1a) includes a light-absorbing layer (10). The light-absorbing layer absorbs light in at least a portion of the near-infrared region. When light with a wavelength of 300 nm to 1200 nm is incident on the optical filter (1a) at incident angles of 0°, 30°, and 40°, the optical filter (1a) satisfies given transmittance requirements. Nine differences each obtained as a difference between one and another of $IE_\theta^{xR}$, $IE_\theta^{yG}$, and $IE_\theta^{zB}$ defined for incident angles θ° of 0°, 30°, and 40° satisfy given requirements, and ranges satisfy given requirements, each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°.

10 Claims, 26 Drawing Sheets

(56) References Cited

U.S. PATENT DOCUMENTS

| | | |
|---|---|---|
| 2014/0091418 A1 | 4/2014 | Taguchi et al. |
| 2014/0300956 A1 | 10/2014 | Kubo et al. |
| 2015/0130008 A1* | 5/2015 | Muro .............. H01L 27/14625 438/70 |
| 2015/0146057 A1 | 5/2015 | Konishi et al. |
| 2015/0160386 A1 | 6/2015 | Takemura |
| 2015/0293284 A1 | 10/2015 | Tatemura |
| 2016/0116653 A1* | 4/2016 | Murayama ........ H01L 27/14618 359/359 |
| 2016/0252664 A1 | 9/2016 | Kim et al. |
| 2016/0259103 A1 | 9/2016 | Kim et al. |
| 2017/0017024 A1 | 1/2017 | Hasegawa et al. |
| 2018/0282521 A1 | 10/2018 | Kubo et al. |
| 2019/0219749 A1 | 7/2019 | Shimmo et al. |
| 2020/0233130 A1 | 7/2020 | Kubo |
| 2020/0333516 A1 | 10/2020 | Takagi et al. |
| 2020/0333518 A1 | 10/2020 | Takagi et al. |
| 2020/0379150 A1 | 12/2020 | Takagi et al. |
| 2020/0386928 A1 | 12/2020 | Takagi et al. |
| 2021/0024754 A1 | 1/2021 | Hayashi et al. |
| 2021/0356638 A1 | 11/2021 | Kubo et al. |

FOREIGN PATENT DOCUMENTS

| | | |
|---|---|---|
| JP | 2014052482 | 3/2014 |
| JP | 2014203044 | 10/2014 |
| JP | 6087464 B | 3/2017 |
| JP | 6119920 | 4/2017 |
| JP | 2017072748 A | 4/2017 |
| KR | 101474902 | 12/2014 |
| KR | 101527822 | 6/2015 |
| WO | 2013042738 A1 | 3/2013 |
| WO | 2014030628 | 2/2014 |
| WO | 2014034386 | 3/2014 |
| WO | 2014104370 | 7/2014 |
| WO | 2016114363 | 7/2016 |

OTHER PUBLICATIONS

International Search Report and Written Opinion issued for International Patent Application No. PCT/JP2018/034696, dated Dec. 18, 2018, 7 pages including English translation of Search Report.

* cited by examiner

Incident angle —— θ=0°   ---- θ=30°   —·— θ=40°

OPTICAL FILTER AND IMAGING APPARATUS

TECHNICAL FIELD

The present invention relates to an optical filter and imaging apparatus.

BACKGROUND ART

Imaging apparatuses including an optical filter such as a near-infrared cut filter are conventionally known. For example, Patent Literature 1 describes a near-infrared cut filter including a laminated sheet having a near-infrared-absorber-including resin layer provided on at least one side of a glass sheet substrate. For example, this near-infrared cut filter has a dielectric multilayer film provided on at least one side of the laminated sheet. For this near-infrared cut filter, the absolute value |Ya−Yb| of the difference between a wavelength value (Ya) and a wavelength value (Yb) is less than 15 nm. The wavelength value (Ya) is a value of a wavelength which lies in the wavelength range of 560 to 800 nm and at which the transmittance measured in the direction perpendicular to the near-infrared cut filter is 50%. The wavelength value (Yb) is a value of a wavelength which lies in the wavelength range of 560 to 800 nm and at which the transmittance measured at an incident angle of 30° to the near-infrared cut filter is 50%. As just described, the angle dependence of the transmission characteristics of the near-infrared cut filter according to Patent Literature 1 is adjusted to be small.

Patent Literature 2 describes a near-infrared cut filter including a near-infrared-absorbing glass substrate, near-infrared-absorbing layer, and dielectric multilayer film. The near-infrared-absorbing layer includes a near-infrared-absorbing dye and transparent resin. Patent Literature 2 describes a solid-state imaging apparatus including this near-infrared cut filter and a solid-state imaging device. According to Patent Literature 2, the influence of the angle dependence which dielectric multilayer films inherently have and which is an incident-angle-dependent shift of a shielding wavelength can be almost completely eliminated by laminating the near-infrared-absorbing glass substrate and near-infrared-absorbing layer. For example, in Patent Literature 2, a transmittance ($T_0$) at an incident angle of 0° and a transmittance ($T_{30}$) at an incident angle of 30° are measured for the near-infrared cut filter.

Patent Literatures 3 and 4 each describe an infrared cut filter including a dielectric substrate, an infrared-reflecting layer, and an infrared-absorbing layer. The infrared-reflecting layer is formed of a dielectric multilayer film. The infrared-absorbing layer includes an infrared-absorbing dye. Patent Literatures 3 and 4 each describe an imaging apparatus including this infrared cut filter. Patent Literatures 3 and 4 each describe transmittance spectra shown by the infrared cut filter for light incident at incident angles of 0°, 25°, and 35°.

Patent Literature 5 describes a near-infrared cut filter including an absorbing layer and a reflecting layer and satisfying given requirements. For example, the difference $|T_{0(600-725)}-T_{30(600-725)}|$ between an integral $T_{0(600-725)}$ of transmittances of light with wavelengths of 600 to 725 nm in a spectral transmittance curve shown by this near-infrared cut filter at an incident angle of 0° and an integral $T_{30(600-725)}$ of transmittances of light with wavelengths of 600 to 725 nm in a spectral transmittance curve shown thereby at an incident angle of 30° is 3%·nm or less. Patent Literature 5 also describes an imaging apparatus including this near-infrared cut filter.

Patent Literatures 6 and 7 each describe an optical filter including a light-absorbing layer and near-infrared-reflecting layer and satisfying ΔE*≤1.5. ΔE* is a color difference between light having been perpendicularly incident on the optical filter and transmitted therethrough and light having been incident on the optical filter at an angle of 30° to the direction perpendicular to the optical filter and transmitted therethrough. The light-absorbing layer includes, for example, a binder resin, in which a light absorber is dispersed. The near-infrared-reflecting layer is, for example, a dielectric multilayer film. Patent Literatures 6 and 7 each also describe an imaging apparatus, such as a camera, including this optical filter.

CITATION LIST

Patent Literature

Patent Literature 1: JP 2012-103340 A
Patent Literature 2: WO 2014/030628 A1
Patent Literature 3: US 2014/0300956 A1
Patent Literature 4: US 2014/0063597 A1
Patent Literature 5: JP 6119920 B2
Patent Literature 6: KR 10-1474902 B1
Patent Literature 7: KR 10-1527822 B1

SUMMARY OF INVENTION

Technical Problem

The above patent literatures fail to specifically discuss the characteristics which would be exhibited by the optical filters when light is incident on the optical filters at an incident angle larger than 35° (e.g., 40°). Moreover, in spite of the fact that imaging apparatuses such as cameras are equipped with an image sensor that includes a color filter having R (red), G (green), and B (blue), the above patent literatures fail to discuss compatibility with the characteristics of such a color filter. Therefore, the present invention provides an optical filter that is likely to be compatible with the characteristics of a color filter used in an image sensor mounted in an imaging apparatus even when the incident angle of light is larger and that exhibits characteristics advantageous to prevent uneven coloring of an image generated by an imaging apparatus such as a camera. The present invention also provides an imaging apparatus including this optical filter.

Solution to Problem

The present invention provides an optical filter including:
a light-absorbing layer that includes a light absorber absorbing light in at least a portion of the near-infrared region, wherein
when light with a wavelength of 300 nm to 1200 nm is incident on the optical filter at incident angles of 0°, 30°, and 40°, the optical filter satisfies the following requirements:
(i) the spectral transmittance at a wavelength of 700 nm is 3% or less;
(ii) the spectral transmittance at a wavelength of 715 nm is 1% or less;
(iii) the spectral transmittance at a wavelength of 1100 nm is 7.5% or less;

(iv) the average transmittance in the wavelength range of 700 nm to 800 nm is 1% or less;

(v) the average transmittance in the wavelength range of 500 nm to 600 nm is 85% or more;

(vi) the spectral transmittance at a wavelength of 400 nm is 45% or less; and (vii) the spectral transmittance at a wavelength of 450 nm is 80% or more, and in the case where the spectral transmittance of the optical filter at a wavelength λ and an incident angle θ° is expressed by $T_θ(λ)$, where $R(λ)$, $G(λ)$, and $B(λ)$ are functions of the wavelength λ and defined by Table (I) in a domain ranging between wavelengths of 400 nm and 700 nm, where functions obtained by normalization of three functions being products of $T_θ(λ)$ and $R(λ)$, $G(λ)$, and $B(λ)$ and defined for the incident angle θ° are expressed by $CR_θ(λ)$, $CG_θ(λ)$, and $CB_θ(λ)$, the normalization being such that a maximum value of each of the three functions is 1, where functions of the wavelength λ obtained by normalization of the CIE 1964 supplementary standard colorimetric observer color-matching functions specified in Table 2 of Japanese Industrial Standards (JIS) Z 8781-1:2012 are expressed by $x(λ)$, $y(λ)$, and $z(λ)$, the normalization being such that a maximum value of each of the color-matching functions is 1, and where the wavelength λ being a variable of $CR_θ(λ)$, $CG_θ(λ)$, and $CB_θ(λ)$ is expressed by $λ(n)=(Δλ×n+400)$ nm $(Δλ=5)$ as a function of an integer n of 0 or more, nine differences each obtained as a difference between one and another of $IE_θ^{xR}$, $IE_θ^{yG}$, and $IE_θ^{zB}$ defined by the following equations (1) to (3) for incident angles θ° of 0°, 30°, and 40° satisfy requirements shown in Table (II), and ranges satisfy requirements shown in Table (II), each range being a difference obtained by subtracting the smallest value of three differences from the largest value of the three differences, the three differences obtained from $IE_θ^{xR}$, $IE_θ^{yG}$, and $IE_θ^{zB}$ collectively defined for the same pair selected from the incident angles θ°.

TABLE 1

| Wavelength λ [nm] | R(λ) | G(λ) | B(λ) |
|---|---|---|---|
| 400 | 0.103 | 0.066 | 0.490 |
| 405 | 0.092 | 0.067 | 0.562 |
| 410 | 0.081 | 0.068 | 0.635 |
| 415 | 0.071 | 0.068 | 0.690 |
| 420 | 0.061 | 0.068 | 0.746 |
| 425 | 0.053 | 0.072 | 0.789 |
| 430 | 0.046 | 0.076 | 0.832 |
| 435 | 0.041 | 0.082 | 0.879 |
| 440 | 0.036 | 0.089 | 0.926 |
| 445 | 0.032 | 0.100 | 0.955 |
| 450 | 0.028 | 0.112 | 0.984 |
| 455 | 0.026 | 0.133 | 0.992 |
| 460 | 0.025 | 0.153 | 1.000 |
| 465 | 0.027 | 0.213 | 0.986 |
| 470 | 0.028 | 0.272 | 0.972 |
| 475 | 0.031 | 0.358 | 0.934 |
| 480 | 0.035 | 0.444 | 0.897 |
| 485 | 0.037 | 0.523 | 0.837 |
| 490 | 0.040 | 0.602 | 0.777 |
| 495 | 0.044 | 0.669 | 0.702 |
| 500 | 0.048 | 0.737 | 0.628 |
| 505 | 0.057 | 0.797 | 0.546 |
| 510 | 0.067 | 0.857 | 0.463 |
| 515 | 0.080 | 0.903 | 0.394 |
| 520 | 0.094 | 0.948 | 0.325 |

TABLE 1-continued

| Wavelength λ [nm] | R(λ) | G(λ) | B(λ) |
|---|---|---|---|
| 525 | 0.099 | 0.974 | 0.280 |
| 530 | 0.104 | 1.000 | 0.236 |
| 535 | 0.099 | 0.998 | 0.209 |
| 540 | 0.094 | 0.995 | 0.182 |
| 545 | 0.091 | 0.970 | 0.163 |
| 550 | 0.087 | 0.944 | 0.144 |
| 555 | 0.093 | 0.907 | 0.125 |
| 560 | 0.099 | 0.870 | 0.106 |
| 565 | 0.146 | 0.825 | 0.097 |
| 570 | 0.192 | 0.780 | 0.087 |
| 575 | 0.342 | 0.728 | 0.084 |
| 580 | 0.492 | 0.675 | 0.081 |
| 585 | 0.672 | 0.616 | 0.080 |
| 590 | 0.853 | 0.556 | 0.080 |
| 595 | 0.927 | 0.485 | 0.076 |
| 600 | 1.000 | 0.414 | 0.071 |
| 605 | 1.000 | 0.354 | 0.066 |
| 610 | 1.000 | 0.294 | 0.061 |
| 615 | 0.989 | 0.255 | 0.062 |
| 620 | 0.978 | 0.216 | 0.063 |
| 625 | 0.964 | 0.200 | 0.063 |
| 630 | 0.949 | 0.184 | 0.063 |
| 635 | 0.929 | 0.173 | 0.066 |
| 640 | 0.910 | 0.161 | 0.070 |
| 645 | 0.896 | 0.157 | 0.076 |
| 650 | 0.881 | 0.152 | 0.083 |
| 655 | 0.865 | 0.155 | 0.089 |
| 660 | 0.849 | 0.157 | 0.096 |
| 665 | 0.821 | 0.168 | 0.100 |
| 670 | 0.793 | 0.178 | 0.104 |
| 675 | 0.774 | 0.196 | 0.112 |
| 680 | 0.756 | 0.215 | 0.120 |
| 685 | 0.742 | 0.237 | 0.123 |
| 690 | 0.729 | 0.259 | 0.127 |
| 695 | 0.727 | 0.277 | 0.132 |
| 700 | 0.725 | 0.296 | 0.136 |

$$IE_θ^{xR} = \sum_{n=0}^{300/Δλ} \{x(λ(n)) - CR_θ(λ(n))\} \times Δλ \quad (1)$$

$$IE_θ^{yG} = \sum_{n=0}^{300/Δλ} \{y(λ(n)) - CG_θ(λ(n))\} \times Δλ \quad (2)$$

$$IE_θ^{zB} = \sum_{n=0}^{300/Δλ} \{z(λ(n)) - CB_θ(λ(n))\} \times Δλ \quad (3)$$

TABLE 2

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −4 to 4 | −4 to 4 | −2 to 2 |
| $IE_0^{yG} - IE_{30}^{yG}$ | $IE_0^{yG} - IE_{40}^{yG}$ | $IE_{30}^{yG} - IE_{40}^{yG}$ |
| −4 to 4 | −4 to 4 | −2 to 2 |
| $IE_0^{zB} - IE_{30}^{zB}$ | $IE_0^{zB} - IE_{40}^{zB}$ | $IE_{30}^{zB} - IE_{40}^{zB}$ |
| −4 to 4 | −4 to 4 | −2 to 2 |
| Range | Range | Range |
| 0 to 6 | 0 to 6 | 0 to 3 |

The present invention also provides an imaging apparatus including:

a lens system;

an imaging device that receives light having been transmitted through the lens system;

a color filter that is disposed ahead of the imaging device and is a filter of three colors, R (red), G (green), and B (blue); and the above optical filter that is disposed ahead of the color filter.

Advantageous Effects of Invention

The above optical filter is likely to be compatible with the characteristics of a color filter used in an imaging apparatus such as a camera even when the incident angle of light is larger and exhibits characteristics advantageous to prevent uneven coloring of an image generated by an imaging apparatus. Moreover, an image generated by the above imaging apparatus of the present invention is unlikely to be colored unevenly even when the incident angle of light is larger.

DESCRIPTION OF EMBODIMENTS

Figure 1A:
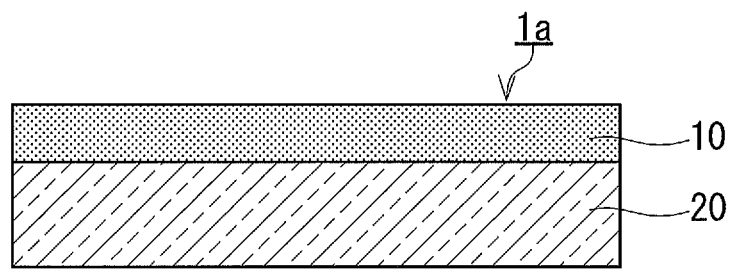
FIG. 1A is a cross-sectional view of an example of an optical filter of the present invention.

Hereinafter, embodiments of the present invention will be described with reference to the drawings. The following description is directed to some examples of the present invention, and the present invention is not limited by these examples.

The present inventors have invented the optical filter according to the present invention based on new findings obtained from the following studies of optical filters.

An optical filter shielding against unnecessary light other than visible light is disposed in an imaging apparatus or a camera module mounted in a personal digital assistant such as a smartphone. The use of an optical filter including a light-absorbing layer has been discussed to shield against unnecessary light. Like the optical filters described in Patent Literatures 1 to 7, many optical filters including a light-absorbing layer further include a reflecting film composed of a dielectric multilayer film.

Interference of light reflecting on the front and back surfaces of each layer of a reflecting film composed of a dielectric multilayer film determines a wavelength band of transmitted light and a wavelength band of reflected light. Light can be incident on an optical filter at various incident angles. The optical path length in the reflecting film included in an optical filter changes depending on the incident angle of light incident on the optical filter. As a result, the wavelength bands of transmitted light and reflected light shift to the short wavelength side. Therefore, it is conceivable that in order not to greatly vary the transmittance characteristics of the optical filter depending on the incident angle of light, the boundary between a wavelength band of light to be blocked and a wavelength band of light to be transmitted is determined by a wavelength band of light absorption, and a wavelength band of light to be reflected by the dielectric multilayer film is separated apart from the wavelength band of light to be transmitted.

In Patent Literatures 1 and 2, the transmission characteristics of the near-infrared cut filters for light incident at incident angles of 0° and 30° are evaluated. In Patent Literatures 3 and 4, transmittance spectra shown by the infrared cut filters for light incident at incident angles of 0°, 25°, and 35° are evaluated. In recent years, camera modules mounted in personal digital assistants such as smartphones have been expected to achieve a wider angle of view and a much lower profile. Therefore, it is desirable that the wavelength band and amount of light transmitted through optical filters be unlikely to vary even when the incident angle of light is larger (e.g., 40°).

When light is incident on an optical filter including a reflecting film composed of a dielectric multilayer film at a large incident angle, the reflectance of light can locally increase in a wavelength band of light reflection of which should be reduced to achieve a high transmittance. As a result, the optical filter involves a defect called a ripple, i.e., a local decrease in transmittance. For example, even an optical filter designed not to produce a ripple upon incidence of light at an incident angle of 0° to 30° tends to produce a ripple when the incident angle of light is increased to 40°.

A measure has not yet been established for comprehensive evaluation of the effects arising from occurrence of a ripple and from an incident-angle-dependent shift of the boundary between a wavelength band of transmitted light and a wavelength band of blocked light. According to the technique described in Patent Literature 5, the boundary between the wavelength band of visible light which is expected to be transmitted and the wavelength band of near-infrared light which is expected to be reflected or absorbed is stable with respect to a variation in incident angle of light. However, the technique described in Patent Literature 5 has room for improvement in view of occurrence of a ripple and an incident-angle-dependent shift of the boundary between the wavelength band of visible light and the wavelength band of ultraviolet light.

In each of Patent Literatures 6 and 7, the characteristics of the optical filter itself are determined with the use of a color difference ΔE*, but it does not ensure that the optical filter is compatible with a practical imaging apparatus. This is because R, G, and B segments of a color filter each correspond to a pixel of an image sensor included in an imaging apparatus and the amount of light detected by each pixel of the sensor correlates with a product of a spectral transmittance of the optical filter shielding against unnecessary light and a spectral transmittance of each segment of the color filter. Therefore, optical filters desirably have characteristics compatible with characteristics of a color filter used in an imaging apparatus.

Under these circumstances, the present inventors made intensive studies to discover an optical filter that is likely to be compatible with the characteristics of a color filter used in an imaging apparatus even when the incident angle of light is larger. Additionally, the present inventors made intensive studies to discover an optical filter that exhibits characteristics advantageous to prevent uneven coloring of an image generated by an imaging apparatus. As a result, the present inventors have invented the optical filter according to the present invention.

Herein, the term "spectral transmittance" refers to a transmittance obtained when light with a given wavelength is incident on an object such as a specimen and the term "average transmittance" refers to an average of spectral transmittances in a given wavelength range. Additionally, the term "transmittance spectrum" herein refers to one in which spectral transmittances at wavelengths in a given wavelength range are arranged in the wavelength order.

Herein, the term "IR cut-off wavelength" refers to a wavelength which is determined by incidence of light with a wavelength of 300 nm to 1200 nm on an optical filter at a given incident angle, which lies in the wavelength range of 600 nm or more, and at which the spectral transmittance is 50%. The term "UV cut-off wavelength" refers to a wavelength which is determined by incidence of light with a wavelength of 300 nm to 1200 nm on an optical filter at a given incident angle, which lies in the wavelength range of 450 nm or less, and at which the spectral transmittance is 50%.

As shown in FIG. 1A, the optical filter 1a includes a light-absorbing layer 10. The light-absorbing layer 10 includes a light absorber. The light absorber absorbs light in at least a portion of the near-infrared region. When light with a wavelength of 300 nm to 1200 nm is incident on the optical filter 1a at incident angles of 0°, 30°, and 40°, the optical filter 1a satisfies the following requirements:

(i) the spectral transmittance at a wavelength of 700 nm is 3% or less;

(ii) the spectral transmittance at a wavelength of 715 nm is 1% or less;

(iii) the spectral transmittance at a wavelength of 1100 nm is 7.5% or less;

(iv) the average transmittance in the wavelength range of 700 nm to 800 nm is 1% or less;

(v) the average transmittance in the wavelength range of 500 nm to 600 nm is 85% or more;

(vi) the spectral transmittance at a wavelength of 400 nm is 45% or less; and (vii) the spectral transmittance at a wavelength of 450 nm is 80% or more.

Since the optical filter 1a satisfies the above requirements (i) to (vii), the optical filter 1a incorporated in a wide-angle-lens-equipped camera module or imaging apparatus can shield against unnecessary light without reducing brightness.

The spectral transmittance of the optical filter 1a at a wavelength λ and an incident angle θ° of light is expressed by $T_\theta(\lambda)$, $R(\lambda)$, $G(\lambda)$, and $B(\lambda)$ are functions of the wavelength λ and defined by the following Table (I) in a domain ranging between wavelengths of 400 nm and 700 nm. Functions obtained by normalization of three functions being products of $T_\theta(a)$ and $R(\lambda)$, $G(\lambda)$, and $B(\lambda)$ and defined for the incident angle θ° are expressed by $CR_\theta(\lambda)$, $CG_\theta(\lambda)$, and $CB_\theta(\lambda)$, the normalization being such that a maximum value of each of the three functions is 1. Herein, $CR_\theta(\lambda)$, $CG_\theta(\lambda)$, and $CB_\theta(\lambda)$ are also called normalized spectral sensitivity functions. Functions of the wavelength λ obtained by normalization of the CIE 1964 supplementary standard colorimetric observer color-matching functions specified in Table 2 of Japanese Industrial Standards (JIS) Z 8781-1:2012 are expressed by $x(\lambda)$, $y(\lambda)$, and $z(\lambda)$, the normalization being such that a maximum value of each of the color-matching functions is 1. Herein, $x(\lambda)$, $y(\lambda)$, and $(\lambda)$ are also called normalized color-matching functions. The wavelength λ being a variable of $CR_\theta(\lambda)$, $CG_\theta(\lambda)$, and $CB_\theta(\lambda)$ is expressed by $\lambda(n)=(\Delta\lambda \times n+400)$ nm ($\Delta\lambda=5$) as a function of an integer n of 0 or more. On the basis of these, nine differences each obtained as a difference between one and another of $IE_\theta^{xR}$, $IE_\theta^{yG}$, and $IE_\theta^{zB}$ defined by the following equations (1) to (3) for incident angles θ° of 0°, 30°, and 40° satisfy requirements shown in the following Table (II), and ranges satisfy requirements shown in the following Table (II), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°. Since the wavelength range chiefly used for evaluation of the optical filter ranges from 400 nm to 700 nm, the value of Δλ is a positive constant that is a divisor of 300. Herein, Δλ=1. That is, $\lambda(n)$ is defined at 5-nm intervals. When Δλ is a positive constant other than 5, a function, such as $T_\theta(\lambda)$, of the wavelength λ can also be determined by linear interpolation.

TABLE 3

Table (I)

| Wavelength λ [nm] | R(λ) | G(λ) | B(λ) |
|---|---|---|---|
| 400 | 0.103 | 0.066 | 0.490 |
| 405 | 0.092 | 0.067 | 0.562 |
| 410 | 0.081 | 0.068 | 0.635 |
| 415 | 0.071 | 0.068 | 0.690 |

TABLE 3-continued

Table (I)

| Wavelength λ [nm] | R(λ) | G(λ) | B(λ) |
|---|---|---|---|
| 420 | 0.061 | 0.068 | 0.746 |
| 425 | 0.053 | 0.072 | 0.789 |
| 430 | 0.046 | 0.076 | 0.832 |
| 435 | 0.041 | 0.082 | 0.879 |
| 440 | 0.036 | 0.089 | 0.926 |
| 445 | 0.032 | 0.100 | 0.955 |
| 450 | 0.028 | 0.112 | 0.984 |
| 455 | 0.026 | 0.133 | 0.992 |
| 460 | 0.025 | 0.153 | 1.000 |
| 465 | 0.027 | 0.213 | 0.986 |
| 470 | 0.028 | 0.272 | 0.972 |
| 475 | 0.031 | 0.358 | 0.934 |
| 480 | 0.035 | 0.444 | 0.897 |
| 485 | 0.037 | 0.523 | 0.837 |
| 490 | 0.040 | 0.602 | 0.777 |
| 495 | 0.044 | 0.669 | 0.702 |
| 500 | 0.048 | 0.737 | 0.628 |
| 505 | 0.057 | 0.797 | 0.546 |
| 510 | 0.067 | 0.857 | 0.463 |
| 515 | 0.080 | 0.903 | 0.394 |
| 520 | 0.094 | 0.948 | 0.325 |
| 525 | 0.099 | 0.974 | 0.280 |
| 530 | 0.104 | 1.000 | 0.236 |
| 535 | 0.099 | 0.998 | 0.209 |
| 540 | 0.094 | 0.995 | 0.182 |
| 545 | 0.091 | 0.970 | 0.163 |
| 550 | 0.087 | 0.944 | 0.144 |
| 555 | 0.093 | 0.907 | 0.125 |
| 560 | 0.099 | 0.870 | 0.106 |
| 565 | 0.146 | 0.825 | 0.097 |
| 570 | 0.192 | 0.780 | 0.087 |
| 575 | 0.342 | 0.728 | 0.084 |
| 580 | 0.492 | 0.675 | 0.081 |
| 585 | 0.672 | 0.616 | 0.080 |
| 590 | 0.853 | 0.556 | 0.080 |
| 595 | 0.927 | 0.485 | 0.076 |
| 600 | 1.000 | 0.414 | 0.071 |
| 605 | 1.000 | 0.354 | 0.066 |
| 610 | 1.000 | 0.294 | 0.061 |
| 615 | 0.989 | 0.255 | 0.062 |
| 620 | 0.978 | 0.216 | 0.063 |
| 625 | 0.964 | 0.200 | 0.063 |
| 630 | 0.949 | 0.184 | 0.063 |
| 635 | 0.929 | 0.173 | 0.066 |
| 640 | 0.910 | 0.161 | 0.070 |
| 645 | 0.896 | 0.157 | 0.076 |
| 650 | 0.881 | 0.152 | 0.083 |
| 655 | 0.865 | 0.155 | 0.089 |
| 660 | 0.849 | 0.157 | 0.096 |
| 665 | 0.821 | 0.168 | 0.100 |
| 670 | 0.793 | 0.178 | 0.104 |
| 675 | 0.774 | 0.196 | 0.112 |
| 680 | 0.756 | 0.215 | 0.120 |
| 685 | 0.742 | 0.237 | 0.123 |
| 690 | 0.729 | 0.259 | 0.127 |
| 695 | 0.727 | 0.277 | 0.132 |
| 700 | 0.725 | 0.296 | 0.136 |

$$IE_\theta^{xR} = \sum_{n=0}^{300/\Delta\lambda} \{x(\lambda(n)) - CR_\theta(\lambda(n))\} \times \Delta\lambda \quad (1)$$

$$IE_\theta^{yG} = \sum_{n=0}^{300/\Delta\lambda} \{y(\lambda(n)) - CG_\theta(\lambda(n))\} \times \Delta\lambda \quad (2)$$

$$IE_\theta^{zB} = \sum_{n=0}^{300/\Delta\lambda} \{z(\lambda(n)) - CB_\theta(\lambda(n))\} \times \Delta\lambda \quad (3)$$

TABLE 4

Table (II)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −4 to 4 | −4 to 4 | −2 to 2 |
| $IE_0^{yG} - IE_{30}^{yG}$ | $IE_0^{yG} - IE_{40}^{yG}$ | $IE_{30}^{yG} - IE_{40}^{yG}$ |
| −4 to 4 | −4 to 4 | −2 to 2 |
| $IE_0^{zB} - IE_{30}^{zB}$ | $IE_0^{zB} - IE_{40}^{zB}$ | $IE_{30}^{zB} - IE_{40}^{zB}$ |
| −4 to 4 | −4 to 4 | −2 to 2 |
| Range | Range | Range |
| 0 to 6 | 0 to 6 | 0 to 3 |

Figure 2:
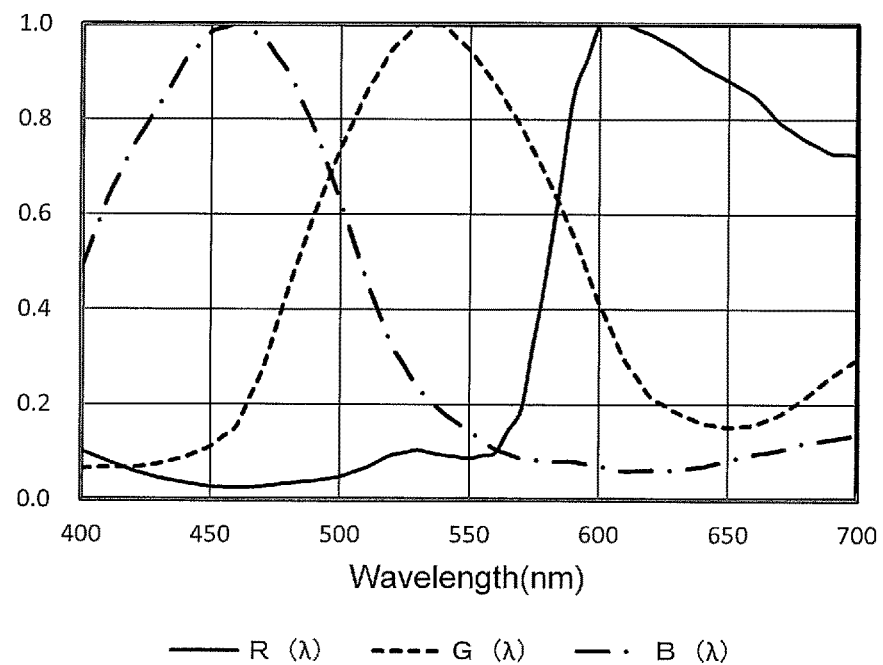
FIG. 2 is a graph showing $R(\lambda)$, $G(\lambda)$, and $B(\lambda)$.

FIG. 2 is a graph showing R(λ), G(λ), and B(λ) shown in Table (I). The functions R(λ), G(λ), and B(λ) were determined as follows. First, 10 different commercially-available color image sensors (hereinafter simply referred to as "image sensors") were prepared. These image sensors each included an imaging device such as a charge-coupled device (CCD) or complementary metal oxide semiconductor (CMOS) and a color filter consisting of R (red), G (green) and B (blue) segments. For each image sensor, spectral sensitivity characteristics for R, G, and B were available as sensitivity spectra with respect to wavelength. For each image sensor, the color segment (attribute) having the largest value was selected from the maximum spectral sensitivity characteristic for R, the maximum spectral sensitivity characteristic for G, and the maximum spectral sensitivity characteristic for B. A coefficient was determined so that the maximum spectral sensitivity characteristic of the selected color segment was 1, and the spectral sensitivity characteristics for R, the spectral sensitivity characteristics for G, and the spectral sensitivity characteristics for B were multiplied with respect to each wavelength by the coefficient. First normalization was thus performed. Such operations were performed for the spectral sensitivity characteristics of the prepared 10 different image sensors to obtain first normalized spectral sensitivity characteristics. Next, for the first normalized spectral sensitivity characteristics of the 10 different image sensors, an arithmetic mean of the spectral sensitivity characteristics for R, that of the spectral sensitivity characteristics for G, and that of the spectral sensitivity characteristics for B were calculated with respect to each wavelength to determine the average spectral sensitivity characteristics for each of R, G, and B. Then, a coefficient was determined for each attribute, namely, each of R, G, and B so that a maximum value of the average spectral sensitivity characteristics for each of R, G, and B is 1, and the average spectral sensitivity characteristics for each of R, G, and B were multiplied by the corresponding coefficient with respect to each wavelength. Second normalization was thus performed to determine the functions R(λ), G(λ), and B(λ).

The normalized spectral sensitivity functions $CR_\theta(\lambda)$, $CG_\theta(\lambda)$, and $CB_\theta(\lambda)$ are determined based on the products of the spectral transmittance $T_\theta(\lambda)$ of the optical filter 1a and the functions R(λ), G(λ), and B(λ). Specifically, a coefficient is determined so that a maximum value of the function determined as the product of the spectral transmittance $T_\theta(\lambda)$ of the optical filter at an incident angle of 0° and the function R(λ) shown in Table (I) is 1. The function as the product of $T_\theta(\lambda)$ and R(λ) is multiplied by the coefficient with respect to each wavelength to determine the normalized spectral sensitivity function $CR_\theta(\lambda)$. In the same manner, the normalized spectral sensitivity function $CG_\theta(\lambda)$ is determined based on $T_\theta(\lambda)$ and $G(\lambda)$ and the normalized spectral sensitivity function $CB_\theta(\lambda)$ is determined based on $T_\theta(\lambda)$ and $B(\lambda)$. Here, the products of the spectral transmittance $T_\theta(\lambda)$ and the other functions were determined by multiplication thereof with respect to each wavelength, unless otherwise specified. Therefore, it can be said that the normalized spectral sensitivity functions $CR_\theta(\lambda)$, $CG_\theta(\lambda)$, and $CB_\theta(\lambda)$ are functions determined in view of not only the characteristics of the optical filter 1a but also the characteristics of a color filter included in an image sensor mounted in an imaging apparatus. A chief ray is incident on the center of an image sensor or imaging device at an incident angle of nearly 0° while incident on the peripheral portion thereof at a large incident angle. When a departure of the shape of a curve of any of the normalized spectral sensitivity functions from the shape of a curve of the corresponding normalized color-matching function varies depending on the incident angle of light incident on the optical filter, color of an image generated by an imaging apparatus, such as a camera, including the optical filter is changed at the time of printing or displaying the image. Therefore, when an image taken by an imaging apparatus is displayed or printed, an object expected to be colored with one color may gradually discolor from the center toward the peripheral portion, and the discoloration may be recognized as color unevenness. Compared to image regions affected by variations in incident angle of light from 0° to 40° and from 0° to 30°, an image region affected by a variation in incident angle of light from 30° to 40° is narrow. Color unevenness is more easily recognized in the latter region. Therefore, when the shape of the curve of each normalized spectral sensitivity function varies little depending on the variation in incident angle of light incident on the optical filter, uneven coloring of an image generated by an imaging apparatus can be prevented. Since the optical filter 1a satisfies the requirements shown in Table (II), the shape of the curve of each normalized spectral sensitivity function varies little depending on the variation in incident angle of light. When an imaging apparatus includes the optical filter 1a, uneven coloring of an image generated by an imaging apparatus can be prevented.

As shown in the equations (1) to (3), differences obtained in the wavelength range of 400 nm to 700 nm by subtracting each normalized spectral sensitivity function from the corresponding normalized color-matching function are integrated to determine $IE_\theta^{xR}$, $IE_\theta^{yG}$, and $IE_\theta^{zB}$. Therefore, the directions in which the curves of the normalized spectral sensitivity functions depart from the curves of the normalized color-matching functions are revealed by reference to $IE_\theta^{xR}$, $IE_\theta^{yG}$, and $IE_\theta^{zB}$. For example, uneven coloring tends to occur in the case where one of $IE_0^{xR} - IE_{30}^{xR}$ and $IE_0^{zB} - IE_{30}^{zB}$ is a positive value and the other is a negative value, compared to the case where both $IE_0^{xR} - IE_{30}^{xR}$ and $IE_0^{zB} - IE_{30}^{zB}$ are positive. For the optical filter 1a, the ranges satisfy the requirements shown in Table (II), and thus uneven coloring of an image generated by an imaging apparatus including the optical filter 1a can be prevented.

When an image taken by an imaging apparatus is displayed or printed, correction for optimizing the brightness or color reproduction is performed for each pixel. Thus, actual spectral sensitivity values are not directly concerned to this correction. Therefore, as described above, the characteristics of the optical filter 1a can be appropriately determined by comparison between the functions obtained by normalization, namely, the normalized color-matching functions $x(\lambda)$, $y(\lambda)$, and $z(\lambda)$ and normalized spectral sensitivity functions $CR_\theta(\lambda)$, $CG_\theta(\lambda)$, and $CB_\theta(\lambda)$. Additionally, because the incident angle of a chief ray incident on each pixel of an imaging device is predictable, it is conceivable that before displayed or printed, an image taken by an imaging apparatus is corrected in consideration of a predicted incident angle.

In the optical filter 1a, nine differences each obtained as a difference between one and another of $IE_\theta^{xR}$, $IE_\theta^{yG}$, and $IE_\theta^{zB}$ defined for incident angles $\theta°$ of 0°, 30°, and 40° desirably satisfy requirements shown in Table (III), and ranges desirably satisfy requirements shown in Table (III), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$.

TABLE 5

Table (III)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −3 to 3 | −3 to 3 | −2 to 2 |
| $IE_0^{yG} - IE_{30}^{yG}$ | $IE_0^{yG} - IE_{40}^{yG}$ | $IE_{30}^{yG} - IE_{40}^{yG}$ |
| −3 to 3 | −3 to 3 | −2 to 2 |
| $IE_0^{zB} - IE_{30}^{zB}$ | $IE_0^{zB} - IE_{40}^{zB}$ | $IE_{30}^{zB} - IE_{40}^{zB}$ |
| −3 to 3 | −3 to 3 | −2 to 2 |
| Range | Range | Range |
| 0 to 4 | 0 to 4 | 0 to 2 |

In the optical filter 1a, nine differences each obtained as a difference between one and another of $IE_\theta^{xR}$, $IE_\theta^{yG}$, and $IE_\theta^{zB}$ defined for incident angles $\theta°$ of 0°, 30°, and 40° more desirably satisfy requirements shown in Table (IV), and ranges more desirably satisfy requirements shown in Table (IV), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$.

TABLE 6

Table (IV)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −2 to 2 | −2 to 2 | −1 to 1 |
| $IE_0^{yG} - IE_{30}^{yG}$ | $IE_0^{yG} - IE_{40}^{yG}$ | $IE_{30}^{yG} - IE_{40}^{yG}$ |
| −2 to 2 | −2 to 2 | −1 to 1 |
| $IE_0^{zB} - IE_{30}^{zB}$ | $IE_0^{zB} - IE_{40}^{zB}$ | $IE_{30}^{zB} - IE_{40}^{zB}$ |
| −2 to 2 | −2 to 2 | −1 to 1 |
| Range | Range | Range |
| 0 to 3 | 0 to 3 | 0 to 1.5 |

In the optical filter 1a, for example, nine differences each obtained as a difference between one and another of $IAE_\theta^{xR}$, $IAE_\theta^{yG}$, and $IAE_\theta^{zB}$ defined by the following equations (4) to (6) for incident angles $\theta°$ of 0°, 30°, and 40° satisfy requirements shown in Table (V), and ranges satisfy requirements shown in Table (V), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°.

$$IAE_\theta^{xR} = \sum_{n=0}^{300/\Delta\lambda} |x(\lambda(n)) - CR_\theta(\lambda(n))| \times \Delta\lambda \quad (4)$$

$$IAE_\theta^{yG} = \sum_{n=0}^{300/\Delta\lambda} |y(\lambda(n)) - CG_\theta(\lambda(n))| \times \Delta\lambda \quad (5)$$

$$IAE_\theta^{zB} = \sum_{n=0}^{300/\Delta\lambda} |z(\lambda(n)) - CB_\theta(\lambda(n))| \times \Delta\lambda \quad (6)$$

TABLE 7

Table (V)

| $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|
| −3 to 3 | −3 to 3 | −2 to 2 |
| $IAE_0^{yG} - IAE_{30}^{yG}$ | $IAE_0^{yG} - IAE_{40}^{yG}$ | $IAE_{30}^{yG} - IAE_{40}^{yG}$ |
| −3 to 3 | −3 to 3 | −2 to 2 |
| $IAE_0^{zB} - IAE_{30}^{zB}$ | $IAE_0^{zB} - IAE_{40}^{zB}$ | $IAE_{30}^{zB} - IAE_{40}^{zB}$ |
| −3 to 3 | −3 to 3 | −2 to 2 |
| Range | Range | Range |
| 0 to 4 | 0 to 4 | 0 to 2 |

As shown in the equations (4) to (6), the absolute values of the differences obtained in the wavelength range of 400 nm to 700 nm by subtracting each normalized spectral sensitivity function from the corresponding normalized color-matching function are integrated to determine $IAE_\theta^{xR}$, $IAE_\theta^{yG}$, and $IAE_\theta^{zB}$. It may sometimes be difficult to appropriately determine the characteristics of the optical filter only by the evaluation using $IE_\theta^{xR}$, $IE_\theta^{yG}$, and $IE_\theta^{zB}$ because an integrated value obtained in a wavelength band in which differences obtained by subtracting any of the normalized spectral sensitivity functions from the corresponding normalized color-matching function are negative can be offset by an integrated value obtained in a different wavelength band in which differences as described above are positive. When the optical filter 1a satisfies the requirements shown in Table (V), it is more certain that the shape of a curve of each normalized spectral sensitivity function varies little depending on the variation in incident angle of light. When an imaging apparatus includes the optical filter 1a as described above, uneven coloring of an image generated by an imaging apparatus can be prevented more effectively. As just described, the optical filter 1a can be more appropriately evaluated using $IAE_\theta^{xR}$, $IAE_\theta^{yG}$, and $IA_\theta^{zB}$.

In the optical filter 1a, nine differences each obtained as a difference between one and another of $IAE_\theta^{xR}$, $IAE_\theta^{yG}$, and $IAE_\theta^{zB}$ defined for incident angles θ° of 0°, 30°, and 40° desirably satisfy requirements shown in Table (VI), and ranges desirably satisfy requirements shown in Table (VI), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°.

TABLE (VI)

| $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|
| −2 to 2 | −2 to 2 | −1 to 1 |
| $IAE_0^{yG} - IAE_{30}^{yG}$ | $IAE_0^{yG} - IAE_{40}^{yG}$ | $IAE_{30}^{yG} - IAE_{40}^{yG}$ |
| −2 to 2 | −2 to 2 | −1 to 1 |
| $IAE_0^{zB} - IAE_{30}^{zB}$ | $IAE_0^{zB} - IAE_{40}^{zB}$ | $IAE_{30}^{zB} - IAE_{40}^{zB}$ |
| −2 to 2 | −2 to 2 | −1 to 1 |
| Range | Range | Range |
| 0 to 3 | 0 to 3 | 0 to 1.5 |

In the optical filter 1a, for example, nine differences each obtained as a difference between one and another of $ISE_\theta^{xR}$, $ISE_\theta^{yG}$, and $ISE_\theta^{zB}$ defined by the following equations (7) to (9) for incident angles θ° of 0°, 30°, and 40° satisfy requirements shown in Table (VII), and ranges satisfy requirements shown in Table (VII), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°.

$$ISE_\theta^{xR} = \sum_{n=0}^{300/\Delta\lambda} \{x(\lambda(n)) - CR_\theta(\lambda(n))\}^2 \times \Delta\lambda \quad (7)$$

$$ISE_\theta^{yG} = \sum_{n=0}^{300/\Delta\lambda} \{y(\lambda(n)) - CG_\theta(\lambda(n))\}^2 \times \Delta\lambda \quad (8)$$

$$ISE_\theta^{zB} = \sum_{n=0}^{300/\Delta\lambda} \{z(\lambda(n)) - CB_\theta(\lambda(n))\}^2 \times \Delta\lambda \quad (9)$$

TABLE 9

Table (VII)

| $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|
| −2 to 2 | −2 to 2 | −1 to 1 |
| $ISE_0^{yG} - ISE_{30}^{yG}$ | $ISE_0^{yG} - ISE_{40}^{yG}$ | $ISE_{30}^{yG} - ISE_{40}^{yG}$ |
| −2 to 2 | −2 to 2 | −1 to 1 |
| $ISE_0^{zB} - ISE_{30}^{zB}$ | $ISE_0^{zB} - ISE_{40}^{zB}$ | $ISE_{30}^{zB} - ISE_{40}^{zB}$ |
| −2 to 2 | −2 to 2 | −1 to 1 |
| Range | Range | Range |
| 0 to 2 | 0 to 2 | 0 to 1 |

As shown in the equations (7) to (9), the square values of the differences obtained in the wavelength range of 400 nm to 700 nm by subtracting each normalized spectral sensitivity function from the corresponding normalized color-matching function are integrated to determine $ISE_\theta^{xR}$, $ISE_\theta^{yG}$, and $ISE_\theta^{zB}$. As described above, it may sometimes be difficult to appropriately determine the characteristics of the optical filter only by the evaluation using $IE_\theta^{xR}$, $IE_\theta^{yG}$, and $IE_\theta^{zB}$. When the optical filter 1a satisfies the requirements shown in Table (VII), it is more certain that the shape of a curve of each normalized spectral sensitivity function varies little depending on the variation in incident angle of light. When an imaging apparatus includes the optical filter 1a as described above, uneven coloring of an image generated by an imaging apparatus can be prevented more effectively. As just described, the optical filter 1a can be more appropriately evaluated using $ISE_\theta^{xR}$, $ISE_\theta^{yG}$, and $ISE_\theta^{zB}$.

In the optical filter 1a, nine differences each obtained as a difference between one and another of $ISE_\theta^{xR}$, $ISE_\theta^{yG}$, and $ISE_\theta^{zB}$ defined for incident angles $\theta°$ of 0°, 30°, and 40° desirably satisfy requirements shown in Table (VIII), and ranges desirably satisfy requirements shown in Table (VIII), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$.

TABLE 10

Table (VIII)

| $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|
| −1 to 1 | −1 to 1 | −0.5 to 0.5 |
| $ISE_0^{yG} - ISE_{30}^{yG}$ | $ISE_0^{yG} - ISE_{40}^{yG}$ | $ISE_{30}^{yG} - ISE_{40}^{yG}$ |
| −1 to 1 | −1 to 1 | −0.5 to 0.5 |
| $ISE_0^{zB} - ISE_{30}^{zB}$ | $ISE_0^{zB} - ISE_{40}^{zB}$ | $ISE_{30}^{zB} - ISE_{40}^{zB}$ |
| −1 to 1 | −1 to 1 | −0.5 to 0.5 |
| Range | Range | Range |
| 0 to 1 | 0 to 1 | 0 to 0.5 |

The light absorber included in the light-absorbing layer 10 is not particularly limited as long as the light absorber absorbs light in at least a portion of the near-infrared region, the optical filter 1a satisfies the above requirements (i) to (vii), and the requirements shown in Table (II) are satisfied. The light absorber is, for example, formed by a phosphonic acid and copper ion. In this case, light in a wide wavelength band covering the near-infrared region and a part of the visible region adjacent to the near-infrared region can be absorbed by the light-absorbing layer 10. Therefore, the desired characteristics can be exhibited even when the optical filter 1a does not include a reflecting film. When the optical filter 1a includes a reflecting film, the optical filter 1a can be designed so that the wavelength band of light reflected by the reflecting film will be sufficiently separated apart from the wavelength band of light to be transmitted. For example, the wavelength band of light reflected by the reflecting film can be set 100 nm or more away toward the long wavelength side from the wavelength band of a transition region in which the transmittance sharply decreases with increased wavelength. Thus, when the incident angle of light is large and the wavelength band of light reflected by the reflecting film shifts to the short wavelength side, the wavelength band of light reflected by the reflecting film overlaps with the wavelength band of light absorbed by the light-absorbing layer 10 and the transmittance characteristics of the optical filter 1a in the transition region are unlikely to vary depending on the variation in incident angle of light. Additionally, light in a wide range included in the wavelength band of the ultraviolet region can be absorbed by the light-absorbing layer 10.

When the light-absorbing layer 10 includes the light absorber formed by a phosphonic acid and copper ion, the phosphonic acid includes, for example, a first phosphonic acid having an aryl group. In the first phosphonic acid, the aryl group is bonded to a phosphorus atom. Thus, the above requirements are easily satisfied by the optical filter 1a.

The aryl group of the first phosphonic acid is, for example, a phenyl group, benzyl group, toluyl group, nitrophenyl group, hydroxyphenyl group, halogenated phenyl group in which at least one hydrogen atom of a phenyl group is substituted by a halogen atom, or halogenated benzyl group in which at least one hydrogen atom of a benzene ring of a benzyl group is substituted by a halogen atom.

When the light-absorbing layer 10 includes the light absorber formed by the phosphonic acid and copper ion, the phosphonic acid desirably further includes a second phosphonic acid having an alkyl group. In the second phosphonic acid, the alkyl group is bonded to a phosphorus atom.

The alkyl group of the second phosphonic acid is, for example, an alkyl group having 6 or less carbon atoms. This alkyl group may be linear or branched.

When the light-absorbing layer 10 includes the light absorber formed by the phosphonic acid and copper ion, the light-absorbing layer 10 desirably further includes a phosphoric acid ester allowing the light absorber to be dispersed and matrix resin.

The phosphoric acid ester included in the light-absorbing layer 10 is not limited to any particular one, as long as the phosphoric acid ester allows good dispersion of the light absorber. For example, the phosphoric acid ester includes at least one of a phosphoric acid diester represented by the following formula (c1) and a phosphoric acid monoester represented by the following formula (c2). In the formulae (c1) and (c2), $R_{21}$, $R_{22}$, and $R_3$ are each a monovalent functional group represented by $-(CH_2CH_2O)_nR_4$, wherein n is an integer of 1 to 25 and $R_4$ is an alkyl group having 6 to 25 carbon atoms. $R_{21}$, $R_{22}$, and $R_3$ may be the same or different functional groups.

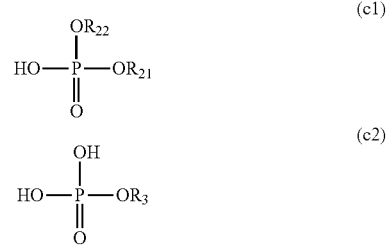

The phosphoric acid ester is not particularly limited. The phosphoric acid ester can be, for example, PLYSURF A208N (polyoxyethylene alkyl (C12, C13) ether phosphoric acid ester), PLYSURF A208F (polyoxyethylene alkyl (C8) ether phosphoric acid ester), PLYSURF A208B (polyoxyethylene lauryl ether phosphoric acid ester), PLYSURF A219B (polyoxyethylene lauryl ether phosphoric acid ester), PLYSURF AL (polyoxyethylene styrenated phenylether phosphoric acid ester), PLYSURF A212C (polyoxyethylene tridecyl ether phosphoric acid ester), or PLYSURF A215C (polyoxyethylene tridecyl ether phosphoric acid ester). All of these are products manufactured by DKS Co., Ltd. The phosphoric acid ester can be NIKKOL DDP-2 (polyoxyethylene alkyl ether phosphoric acid ester), NIKKOL DDP-4

(polyoxyethylene alkyl ether phosphoric acid ester), or NIKKOL DDP-6 (polyoxyethylene alkyl ether phosphoric acid ester). All of these are products manufactured by Nikko Chemicals Co., Ltd.

The matrix resin included in the light-absorbing layer 10 is, for example, a heat-curable or ultraviolet-curable resin in which the light absorber is dispersible. Additionally, as the matrix resin can be used a resin that has a transmittance of, for example, 80% or more, preferably 85% or more, and more preferably 90% or more for light with a wavelength of 350 nm to 900 nm in the form of a 0.1-mm-thick resin layer. The matrix resin is not particularly limited as long as the above requirements (i) to (vii) and the requirements shown in Table (II) are satisfied by the optical filter 1a. The content of the phosphonic acid in the light-absorbing layer 10 is, for example, 3 to 180 parts by mass with respect to 100 parts by mass of the matrix resin.

The matrix resin included in the light-absorbing layer 10 is not particularly limited as long as the above characteristics are satisfied. The matrix resin is, for example, a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, or silicone resin. The matrix resin may contain an aryl group such as a phenyl group and is desirably a silicone resin containing an aryl group such as a phenyl group. If the light-absorbing layer 10 is excessively hard (rigid), the likelihood of cure shrinkage-induced cracking during the production process of the optical filter 1a increases with increasing thickness of the light-absorbing layer 10. When the matrix resin is a silicone resin containing an aryl group, the light-absorbing layer 10 is likely to have high crack resistance. Moreover, with the use of a silicone resin containing an aryl group, the light absorber formed by the above phosphonic acid and copper ion is less likely to be aggregated when included. Further, when the matrix resin of the light-absorbing layer 10 is a silicone resin containing an aryl group, it is desirable for the phosphoric acid ester included in the light-absorbing layer 10 to have a flexible, linear organic functional group, such as an oxyalkyl group, just as does the phosphoric acid ester represented by the formula (c1) or formula (c2). This is because interaction derived from the combination of the above phosphonic acid, a silicone resin containing an aryl group, and phosphoric acid ester having a linear organic functional group such as an oxyalkyl group makes aggregation of the light absorber less likely and can impart good rigidity and good flexibility to the light-absorbing layer. Specific examples of the silicone resin available as the matrix resin include KR-255, KR-300, KR-2621-1, KR-211, KR-311, KR-216, KR-212, and KR-251. All of these are silicone resins manufactured by Shin-Etsu Chemical Co., Ltd.

As shown in FIG. 1A, the optical filter 1a further includes, for example, a transparent dielectric substrate 20. One principal surface of the transparent dielectric substrate 20 is covered with the light-absorbing layer 10. The characteristics of the transparent dielectric substrate 20 are not particularly limited as long as the above requirements (i) to (vii) and the requirements shown in Table (II) are satisfied by the optical filter 1a. The transparent dielectric substrate 20 is a dielectric substrate having a high average transmittance (for example, 80% or more, preferably 85% or more, and more preferably 90% or more) in the wavelength range of, for example, 450 nm to 600 nm.

The transparent dielectric substrate 20 is, for example, made of glass or resin. When the transparent dielectric substrate 20 is made of glass, the glass is, for example, borosilicate glass such as D 263 T eco, soda-lime glass (blue plate glass), white sheet glass such as B 270, alkali-free glass, or infrared-absorbing glass such as copper-containing phosphate glass or copper-containing fluorophosphate glass. When the transparent dielectric substrate 20 is made of infrared-absorbing glass such as copper-containing phosphate glass or copper-containing fluorophosphate glass, the desired infrared absorption performance can be imparted to the optical filter 1a by a combination of the infrared absorption performance of the transparent dielectric substrate 20 and the infrared absorption performance of the light-absorbing layer 10. Examples of such an infrared-absorbing glass include BG-60, BG-61, BG-62, BG-63, and BG-67 manufactured by SCHOTT AG, 500EXL manufactured by Nippon Electric Glass Co., Ltd., and CM5000, CM500, C5000, and C500S manufactured by HOYA CORPORATION. Moreover, the transparent dielectric substrate 20 may have ultraviolet absorption characteristics.

The transparent dielectric substrate 20 may be a transparent crystalline substrate, such as magnesium oxide, sapphire, or quartz. For example, sapphire is very hard and is thus scratch resistant. Therefore, as a scratch-resistant protective material (which may be called a protective filter or cover glass), a sheet-shaped sapphire is sometimes disposed ahead of a camera module or lens included in mobile devices such as smartphones and mobile phones. Formation of the light-absorbing layer 10 on such a sheet-shaped sapphire makes it possible to protect camera modules and lenses and cut off light with a wavelength of 650 nm to 1100 nm. This eliminates the need to dispose an optical filter that exhibits performance of shielding against infrared light with a wavelength of 650 nm to 1100 nm around an imaging device such as a charge-coupled device (CCD) sensor or complementary metal oxide semiconductor (CMOS) sensor or inside a camera module. Therefore, the formation of the light-absorbing layer 10 on a sheet-shaped sapphire can contribute to achievement of lower-profile camera modules and lower-profile imaging apparatuses.

When the transparent dielectric substrate 20 is made of resin, the resin is, for example, a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, or silicone resin.

The optical filter 1a can be produced, for example, by applying a coating liquid for forming the light-absorbing layer 10 to one principal surface of the transparent dielectric substrate 20 to form a film and drying the film. The method for preparing the coating liquid and the method for producing the optical filter 1a will be described with an example in which the light-absorbing layer 10 includes the light absorber formed by the phosphonic acid and copper ion.

First, an exemplary method for preparing the coating liquid will now be described. A copper salt such as copper acetate monohydrate is added to a given solvent such as tetrahydrofuran (THF), and the mixture is stirred to give a copper salt solution. To this copper salt solution is then added a phosphoric acid ester compound such as a phosphoric acid diester represented by the formula (c1) or a phosphoric acid monoester represented by the formula (c2), and the mixture is stirred to prepare a solution A. The first phosphonic acid is added to a given solvent such as THF, and the mixture is stirred to prepare a solution B. Next, the solution B is added to the solution A while the solution A is stirred, and the mixture is further stirred for a given period of time. To the resultant solution is then added a given solvent such as toluene, and the mixture is stirred to obtain a solution C. Subsequently, the solution C is subjected to solvent removal under heating for a given period of time to obtain a solution D. This process removes the solvent such as THF and the component such as acetic acid (boiling point: about 118° C.) generated by disassociation of the copper salt and yields a light absorber formed by the first phosphonic acid and copper ion. The temperature at which the solution C is heated is chosen based on the boiling point of the to-be-removed component disassociated from the copper salt. During the solvent removal, the solvent such as toluene (boiling point: about 110° C.) used to obtain the solution C is also evaporated. A certain amount of this solvent desirably remains in the coating liquid. This is preferably taken into account in determining the amount of the solvent to be added and the time period of the solvent removal. To obtain the solution C, o-xylene (boiling point: about 144° C.) may be used instead of toluene. In this case, the amount of o-xylene to be added can be reduced to about one-fourth of the amount of toluene to be added, because the boiling point of o-xylene is higher than the boiling point of toluene. A matrix resin such as a silicone resin is added to the solution D and the mixture is stirred. The coating liquid can thus be prepared.

The coating liquid is applied to one principal surface of the transparent dielectric substrate 20 to form a film. For example, the coating liquid is applied to one principal surface of the transparent dielectric substrate 20 by die coating or spin coating or with a dispenser to form a film. Next, this film is cured by a given heat treatment. For example, the film is exposed to an environment at a temperature of 50° C. to 200° C. for a given period of time.

In the optical filter 1a, the light-absorbing layer 10 may be formed as a single layer or may be formed as a plurality of layers. When the light-absorbing layer 10 is formed as a plurality of layers, the light-absorbing layer 10 includes, for example, a first layer including the light absorber formed by the first phosphonic acid and copper ion and a second layer including the light absorber formed by the second phosphonic acid and copper ion. In this case, a coating liquid for forming the first layer can be prepared in the above manner. The second layer is formed using a coating liquid prepared separately from the coating liquid for forming the first layer. The coating liquid for forming the second layer can be prepared, for example, in the following manner.

A copper salt such as copper acetate monohydrate is added to a given solvent such as tetrahydrofuran (THF), and the mixture is stirred to give a copper salt solution. To this copper salt solution is then added a phosphoric acid ester compound such as a phosphoric acid diester represented by the formula (c1) or a phosphoric acid monoester represented by the formula (c2), and the mixture is stirred to prepare a solution E. The second phosphonic acid is added to a given solvent such as THF, and the mixture is stirred to prepare a solution F. Next, the solution F is added to the solution E while the solution E is stirred, and the mixture is further stirred for a given period of time. To the resultant solution is then added a given solvent such as toluene, and the mixture is stirred. The solvent is evaporated to obtain a solution G. Subsequently, a matrix resin such as a silicone resin is added to the solution G, and the mixture is stirred. The coating liquid for forming the second layer can thus be obtained.

The first and second layers can be formed by applying the coating liquid for forming the first layer and that for forming the second layer to form films, which are cured by a given heat treatment. For example, the films are exposed to an environment at a temperature of 50° C. to 200° C. for a given period of time. The order of forming the first and second layers is not particularly limited. The first and second layers may be formed in different time periods, or may be formed in the same time period. A protective layer may be formed between the first and second layers. The protective layer is formed of, for example, a $SiO_2$-deposited film.

<Modifications>

The optical filter 1a can be modified in various respects. For example, the optical filter 1a may be modified to optical filters 1b to 1f shown in FIG. 1B to FIG. 1F. The optical filters 1b to 1f are configured in the same manner as the optical filter 1a, unless otherwise described. The components of the optical filters b to if that are the same as or correspond to those of the optical filter 1a are denoted by the same reference characters, and detailed descriptions of such components are omitted. The description given for the optical filter 1a can apply to the optical filters 1b to 1f, unless there is technical inconsistency.

Figure 1B:
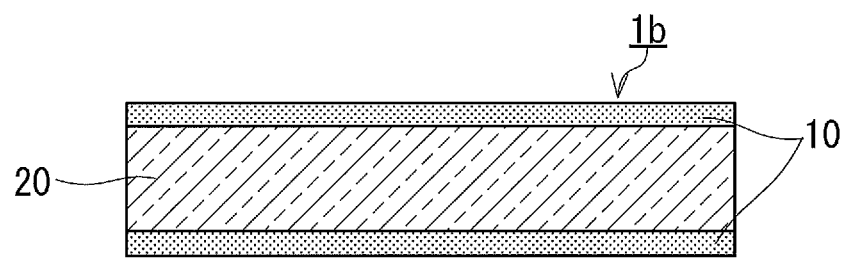
FIG. 1B is a cross-sectional view of another example of the optical filter of the present invention.

As shown in FIG. 1B, the optical filter 1b has the light-absorbing layers 10 formed on both principal surfaces of the transparent dielectric substrate 20. Therefore, the above requirements (i) to (vii) and the requirements shown in Table (II) are satisfied by the two light-absorbing layers 10 rather than one light-absorbing layer 10. The light-absorbing layers 10 on both principal surfaces of the transparent dielectric substrate 20 may have the same or different thicknesses. That is, the formation of the light-absorbing layers 10 on both principal surfaces of the transparent dielectric substrate 20 is done so that the two light-absorbing layers 10 account for equal or unequal proportions of the light-absorbing layer thickness required for the optical filter 1b to have desired optical characteristics. Thus, each of the light-absorbing layers 10 formed on both principal surfaces of the transparent dielectric substrate 20 of the optical filter 1b has a smaller thickness than the thickness of the light-absorbing layer 10 of the optical filter 1a. The formation of the light-absorbing layers 10 on both principal surfaces of the transparent dielectric substrate 20 can reduce warping of the optical filter 1b even when the transparent dielectric substrate 20 is thin. Each of the two light-absorbing layers 10 may be formed as a plurality of layers.

Figure 1C:
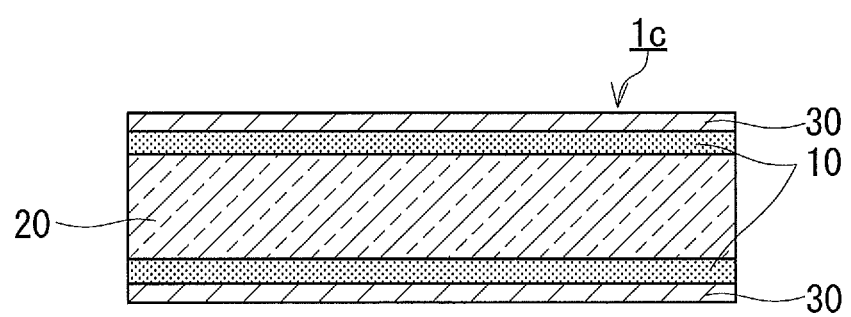
FIG. 1C is a cross-sectional view of yet another example of the optical filter of the present invention.

As shown in FIG. 1C, the optical filter 1c has the light-absorbing layers 10 formed on both principal surfaces of the transparent dielectric substrate 20. The optical filter 1c additionally includes an anti-reflection film 30. The anti-reflection film 30 is a film formed as an interface between the optical filter 1 and air and reducing reflection of visible light. The anti-reflection film 30 is, for example, a film formed of a dielectric made of, for example, a resin, an oxide, or a fluoride. The anti-reflection film 30 may be a multilayer film formed by laminating two or more types of dielectrics having different refractive indices. The anti-reflection film 30 may be, particularly, a dielectric multilayer film made of a low-refractive-index material such as $SiO_2$ and a high-refractive-index material such as $TiO_2$ or $Ta_2O_5$. In this case, Fresnel reflection at the interface between the optical filter 1c and air is reduced and the amount of visible light transmitted through the optical filter 1c can be increased. The anti-reflection film 30 may be formed on both sides of the optical filter 1c, or may be formed on one side thereof.

Figure 1D:
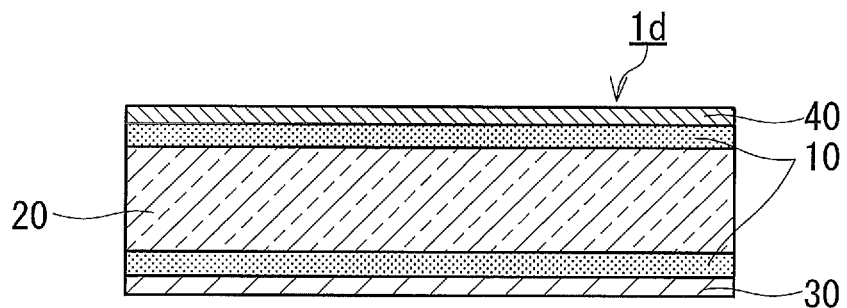
FIG. 1D is a cross-sectional view of yet another example of the optical filter of the present invention.

As shown in FIG. 1D, the optical filter id has the light-absorbing layers 10 formed on both principal surfaces of the transparent dielectric substrate 20. Additionally, the optical filter id further includes a reflecting film 40. The reflecting film 40 reflects infrared light and/or ultraviolet light. The reflecting film 40 is, for example, a film formed by vapor deposition of a metal such as aluminum or a dielectric multilayer film in which a layer formed of a high-refractive-index material and a layer formed of a low-refractive-index material are alternately laminated. A material, such as $TiO_2$, $ZrO_2$, $Ta_2O_5$, $Nb_2O_5$, ZnO, or $In_2O_3$, having a refractive index of 1.7 to 2.5 is used as the high-refractive-index material. A material, such as $SiO_2$, $Al_2O_3$, or $MgF_2$, having a refractive index of 1.2 to 1.6 is used as the low-refractive-index material. Examples of the method for forming the dielectric multilayer film include chemical vapor deposition (CVD), sputtering, and vacuum deposition. Such reflecting films may be formed to be both principal surfaces of the optical filter (not shown). The reflecting films formed on both principal surfaces of the optical filter balance the stress on the front side and that on the back side, and that offers an advantage of decreasing the likelihood of warping of the optical filter.

Figure 1E:
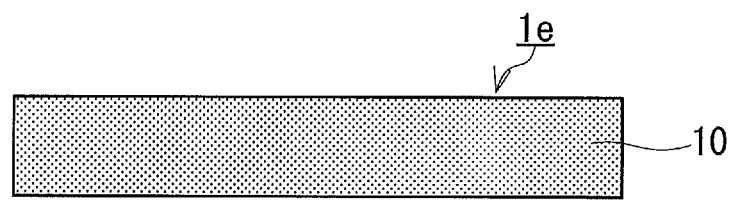
FIG. 1E is a cross-sectional view of yet another example of the optical filter of the present invention.

As shown in FIG. 1E, the optical filter 1e consists only of the light-absorbing layer 10. The optical filter 1e can be produced, for example, by applying the coating liquid onto a given substrate such as a glass substrate, resin substrate, or metal substrate (such as a steel substrate or stainless steel substrate) to form a film, curing the film, and then separating the film from the substrate. The optical filter 1e may be produced by casting. Not including the transparent dielectric substrate 20, the optical filter 1e is thin. The optical filter 1e can thus contribute to achievement of lower imaging apparatuses.

Figure 1F:
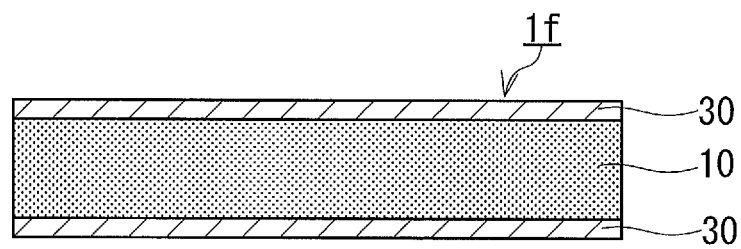
FIG. 1F is a cross-sectional view of yet another example of the optical filter of the present invention.

As shown in FIG. 1F, the optical filter if includes the light-absorbing layer 10 and a pair of the anti-reflection films 30 disposed on both sides of the light-absorbing layer 10. In this case, the optical filter if can contribute to achievement of lower-profile imaging apparatuses, and can increase the amount of visible light transmitted therethrough more than the optical filter 1e can.

The optical filters 1a to 1f may be modified to include an infrared-absorbing layer (not shown) in addition to the light-absorbing layer 10, if necessary. The infrared-absorbing layer includes, for example, an organic infrared absorber, such as a cyanine-based, phthalocyanine-based, squarylium-based, diimmonium-based, or azo-based infrared absorber or an infrared absorber composed of a metal complex. The infrared-absorbing layer includes, for example, one infrared absorber or two or more infrared absorbers selected from these infrared absorbers. The organic infrared absorber can absorb light in a relatively narrow wavelength range (absorption band) and is suitable for absorbing light with a given wavelength range.

The optical filters 1a to if may be modified to include an ultraviolet-absorbing layer (not shown) in addition to the light-absorbing layer 10, if necessary. The ultraviolet-absorbing layer includes, for example, an ultraviolet absorber, such as a benzophenone-based, triazine-based, indole-based, merocyanine-based, or oxazole-based ultraviolet absorber. The ultraviolet-absorbing layer, for example, includes one ultraviolet absorber or two or more ultraviolet absorbers selected from these ultraviolet absorbers. The ultraviolet absorber can include ultraviolet absorbers absorbing ultraviolet light around a wavelength of, for example, 300 nm to 340 nm, emitting light (fluorescence) with a wavelength longer than the absorbed wavelength, and functioning as a fluorescent agent or fluorescent brightener. The ultraviolet-absorbing layer can reduce incidence of ultraviolet light which deteriorates the materials, such as resin, used in the optical filter.

The above infrared absorber and/or ultraviolet absorber may be contained beforehand in the transparent dielectric substrate 20 made of resin to form a substrate having characteristics of absorbing infrared light and/or ultraviolet light. In this case, it is necessary for the resin to allow the infrared absorber and/or ultraviolet absorber to be appropriately dissolved or dispersed therein and be transparent. Examples of such a resin include a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, and silicone resin.

Figure 3:
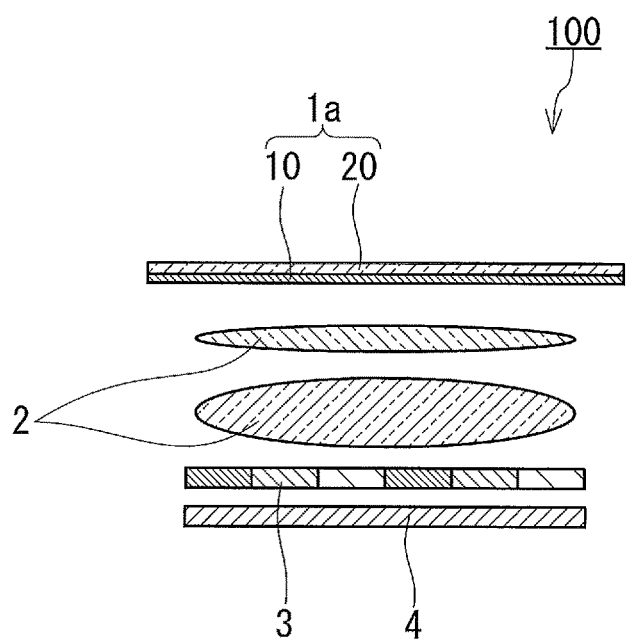
FIG. 3 is a cross-sectional view of an example of an imaging apparatus of the present invention.

As shown in FIG. 3, the optical filter 1a is used to produce, for example, an imaging apparatus 100 (camera module). The imaging apparatus 100 includes a lens system 2, an imaging device 4, a color filter 3, and the optical filter 1a. The imaging device 4 receives light having been transmitted through the lens system 2. The color filter 3 is disposed ahead of the imaging device 4 and is a filter of three colors, R (red), G (green), and B (blue). The optical filter 1a is disposed ahead of the color filter 3. The light-absorbing layer 10 is particularly arranged to be in contact with a side of the transparent dielectric substrate 20, the side being closer to the lens system 2. As described previously, the protecting effect on the lens system 2 or imaging device 4 increases when a hard material such as sapphire is used as the transparent dielectric substrate 20. For example, in the color filter 3, the three colors, R (red), G (green), and B (blue), are arranged in a matrix, and each of the R (red), G (green), and B (blue) colors is disposed immediately above a pixel of the imaging device 4. The imaging device 4 receives light coming from an object and having been transmitted through the lens system 2, optical filter 1a, and color filter 3. The imaging apparatus 100 generates an image based on information on electric charge produced by the light received by the imaging device 4. The color filter 3 and imaging device 4 may be combined to configure a color image sensor.

The above requirements (i) to (vii) and the requirements shown in Table (II) are satisfied by the optical filter 1a. The imaging apparatus 100 including the optical filter 1a can therefore generate images uneven coloring of which is prevented.

EXAMPLES

The present invention will be described in more detail by examples. The present invention is not limited to the examples given below.

<Measurement of Transmittance Spectra>

Transmittance spectra shown upon incidence of light with wavelengths of 300 nm to 1200 nm on optical filters according to Examples and Comparative Examples, intermediate products thereof, and laminates according to Reference Examples were measured using an ultraviolet-visible spectrophotometer (manufactured by JASCO Corporation, product name: V-670). The incident angle of light incident on the optical filters of Examples and Comparative Examples, some of the intermediate products thereof, and some of the laminates according to Reference Examples was set to 0°, 30°, and 40° to measure the transmittance spectra thereof. The incident angle of light incident on the other intermediate products and the other laminates according to Reference Examples was set to 0° to measure the transmittance spectra thereof.

Example 1

A coating liquid IRA1 was prepared in the following manner. 1.1 g of copper acetate monohydrate and 60 g of tetrahydrofuran (THF) were mixed, followed by stirring for 3 hours. To the obtained solution was added 2.3 g of a phosphoric acid ester (manufactured by DKS Co., Ltd., product name: PLYSURF A208F), followed by stirring for 30 minutes to obtain a solution A. 10 g of THF was added to 0.6 g of phenylphosphonic acid (manufactured by Tokyo Chemical Industry Co., Ltd.), followed by stirring for 30 minutes to obtain a solution B. The solution B was added to the solution A while the solution A was stirred, and the mixture was stirred at room temperature for 1 minute. To the resultant solution was added 45 g of toluene, followed by stirring at room temperature for 1 minute to obtain a solution C. The solution C was placed in a flask and subjected to solvent removal for 25 minutes using a rotary evaporator (manufactured by Tokyo Rikakikai Co., Ltd., product code: N-1110SF) under heating by means of an oil bath (manufactured by Tokyo Rikakikai Co., Ltd., product code: OSB-2100) controlled to 120° C. A solution D was thus obtained. The solution D was taken out of the flask, and to the solution D was added 4.4 g of a silicone resin (manufactured by Shin-Etsu Chemical Co., Ltd., product name: KR-300), followed by stirring at room temperature for 30 minutes to obtain a coating liquid IRAL.

A coating liquid IRA2 was prepared in the following manner. 2.25 g of copper acetate monohydrate and 120 g of tetrahydrofuran (THF) were mixed, followed by stirring for 3 hours. To the obtained solution was added 1.8 g of a phosphoric acid ester (manufactured by DKS Co., Ltd., product name: PLYSURF A208F), followed by stirring for 30 minutes to obtain a solution E. 20 g of THF was added to 1.35 g of butylphosphonic acid, followed by stirring for 30 minutes to obtain a solution F. The solution F was added to the solution E while the solution E was stirred, and the mixture was stirred at room temperature for 3 hours. To the resultant solution was added 40 g of toluene, and the solvent was evaporated in an 85° C. environment over 7.5 hours to obtain a solution G. To the solution G was added 8.8 g of a silicone resin (manufactured by Shin-Etsu Chemical Co., Ltd., product name: KR-300), followed by stirring for 3 hours to obtain a solution IRA2.

Figure 4A:
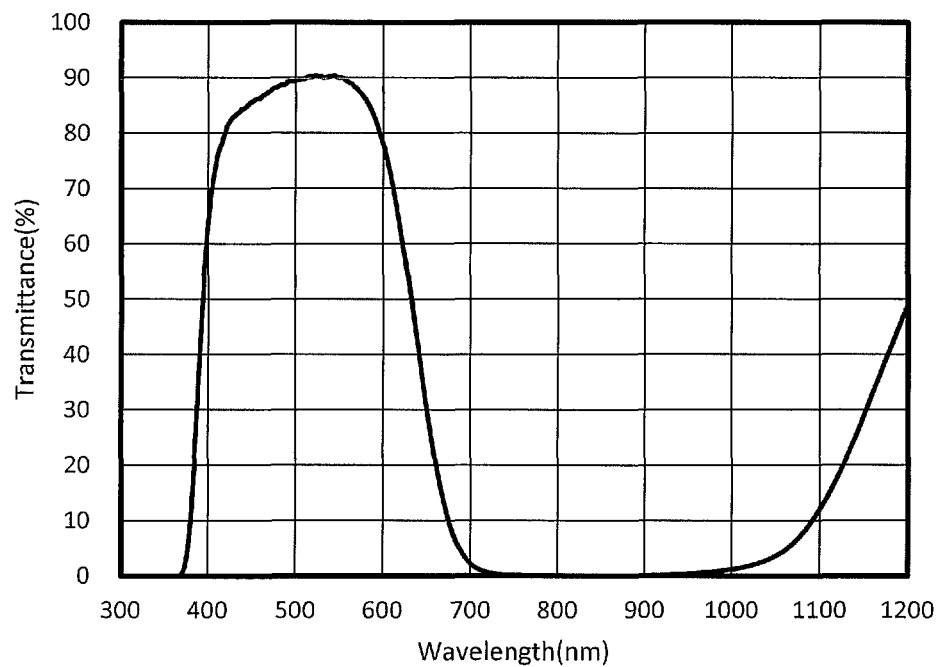
FIG. 4A shows a transmittance spectrum of an intermediate product of an optical filter according to Example 1.

The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. An intermediate product α of an optical filter according to Example 1 was thus obtained. The total thickness of the infrared-absorbing layer ira11 and infrared-absorbing layer ira12 is 0.2 mm. A transmittance spectrum shown by the intermediate product α at an incident angle of 0° is shown in FIG. 4A. The intermediate product α has the following characteristics (α1) to (α6).

(α1): The average transmittance in the wavelength range of 700 to 1000 nm is 0.5% or less.

(α2): The average transmittance in the wavelength range of 1100 to 1200 nm is 29.5%.

(α3): The average transmittance in the wavelength range of 450 to 600 nm is 88.0%.

(α4): The transmittance at a wavelength of 400 nm is 63.7%.

(α5): The IR cut-off wavelength is 632 nm, the UV cut-off wavelength is 394 nm, and when the difference between the IR cut-off wavelength and UV cut-off wavelength is regarded as a full width at half maximum in a transmission region, the full width at half maximum in the transmission region is 238 nm.

(α6): The wavelength which lies in the wavelength range of 600 to 800 nm and at which the spectral transmittance is 20% is 661 nm.

Figure 4B:
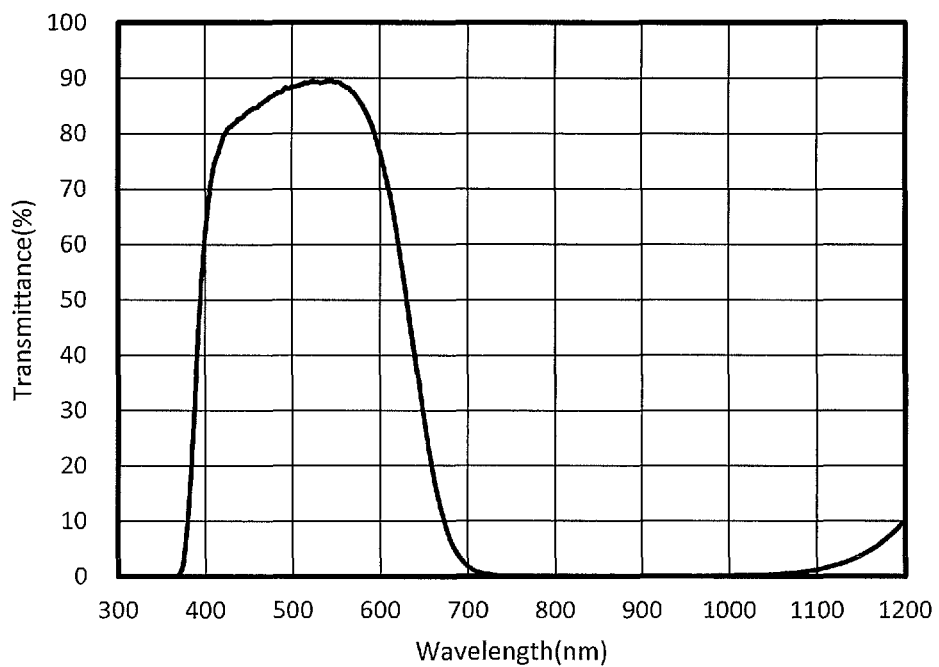
FIG. 4B shows a transmittance spectrum of another intermediate product of the optical filter according to Example 1.

A 500-nm-thick $SiO_2$-deposited film (protective layer p1) was formed on the infrared-absorbing layer ira11 of the intermediate product α using a vacuum deposition apparatus. In the same manner, a 500-nm-thick $SiO_2$-deposited film (protective layer p2) was formed on the infrared-absorbing layer ira12 of the intermediate product α. The coating liquid IRA2 was applied to the surface of the protective layer p1 with a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira21. The coating liquid IRA2 was applied also to the surface of the protective layer p2 with a die coater. The resultant film was cured under the same heating conditions to form an infrared-absorbing layer ira22. An intermediate product β was thus obtained. The total thickness of the infrared-absorbing layer ira21 and infrared-absorbing layer ira22 is 50 μm. A transmittance spectrum of the intermediate product β is shown in FIG. 4B. The intermediate product β has the following characteristics (β1) to (β6).

(β1): The average transmittance in the wavelength range of 700 to 1000 nm is 0.5% or less.

(β2): The average transmittance in the wavelength of 1100 to 1200 nm is 4.5%.

(β3): The average transmittance in the wavelength range of 450 to 600 nm is 86.9%.

(β4): The transmittance at a wavelength of 400 nm is 62.1%.

(85): The IR cut-off wavelength is 631 nm, the UV cut-off wavelength is 394 nm, and the full width at half maximum of the transmission region is 237 nm.

(β6): The wavelength which lies in the wavelength range of 600 to 800 nm and at which the spectral transmittance is 20% is 659 nm.

A 500-nm-thick $SiO_2$-deposited film (protective layer p3) was formed on the infrared-absorbing layer ira22 of the intermediate product β using a vacuum deposition apparatus.

Figure 4C:
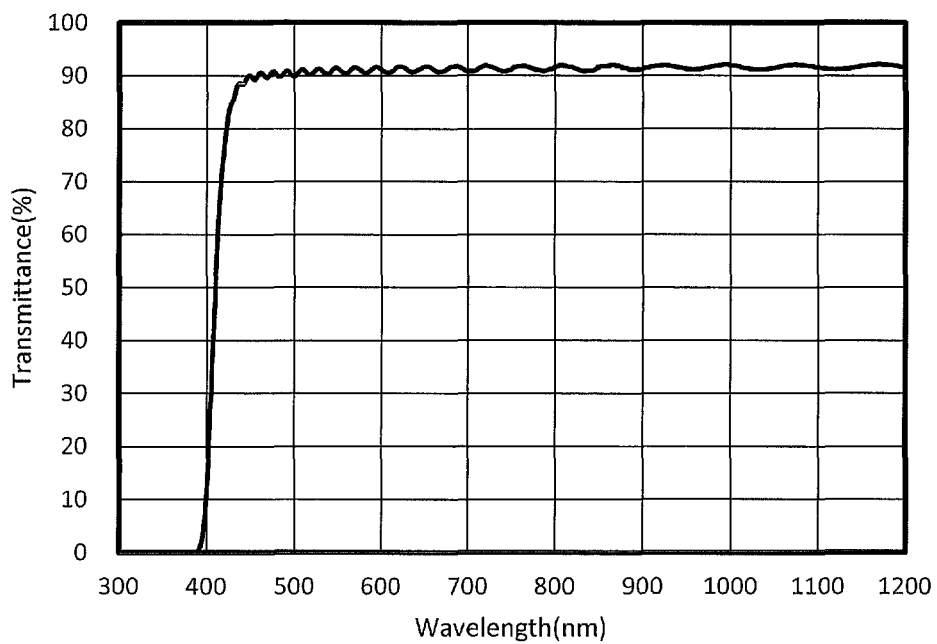
FIG. 4C shows a transmittance spectrum of a laminate according to Reference Example 1.

A coating liquid UVA1 was prepared in the following manner. A benzophenone-based ultraviolet-absorbing substance having low light absorption in the visible region and soluble in methyl ethyl ketone (MEK) was used as an ultraviolet-absorbing substance. This ultraviolet-absorbing substance was dissolved in MEK serving as a solvent, to which polyvinyl butyral (PVB) in which the solids account for 60 weight % was added, followed by stirring for 2 hours to obtain a coating liquid UVA1. The coating liquid UVA1 was applied onto the protective layer p3 by spin coating, followed by curing by heating at 140° C. for 30 minutes to form an ultraviolet-absorbing layer uva1. The thickness of the ultraviolet-absorbing layer uva1 is 6 μm. Separately, a laminate according to Reference Example 1 was obtained by forming a 6-μm-thick ultraviolet-absorbing layer on a surface of a transparent glass substrate (manufactured by SCHOTT AG, product name: D 263 T eco) using the coating liquid UVA1 by spin coating. A transmittance spectrum of the laminate according to Reference Example 1 is shown in FIG. 4C. The laminate according to Reference Example 1 has the following characteristics (r1) to (r3).

(r1): The transmittance in the wavelength range of 350 to 390 nm is 0.5% or less.

(r2): The transmittance at a wavelength of 400 nm is 12.9%, the transmittance at a wavelength of 410 nm is 51.8%, the transmittance at a wavelength of 420 nm is 77.1%, and the transmittance at a wavelength of 450 nm is 89.8%.

(r3): The average transmittance in the wavelength range of 450 to 750 nm is 91.0%.

Figure 4D:
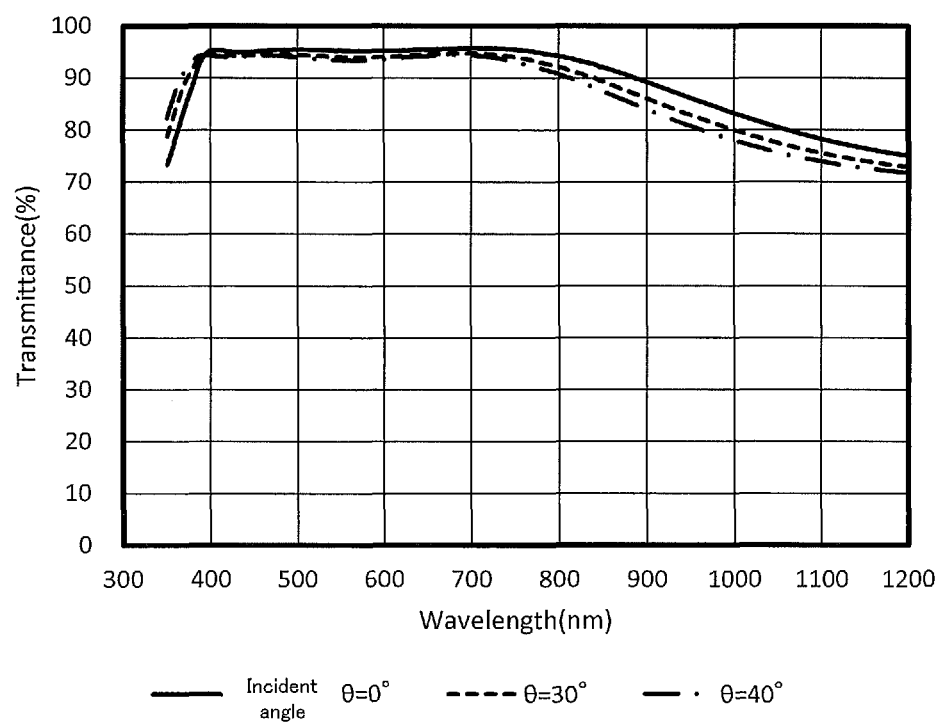
FIG. 4D shows transmittance spectra of a laminate according to Reference Example 2.

An anti-reflection film ar1 was formed on the infrared-absorbing layer ira21 using a vacuum deposition apparatus. An anti-reflection film ar2 was formed on the ultraviolet-absorbing layer uva1 using a vacuum deposition apparatus. The specifications of the anti-reflection film ar1 and anti-reflection film ar2 are the same. Each of the anti-reflection film ar1 and anti-reflection film ar2 is a film composed of $SiO_2$ and $TiO_2$ that are alternately laminated, includes 7 layers, and has a total thickness of about 0.4 μm. An optical filter according to Example 1 was thus obtained. An anti-reflection film was formed on one side of a transparent glass substrate (manufactured by SCHOTT AG, product name: D 263 T eco) under the same conditions as for the formation of the anti-reflection film ar1 to obtain a laminate according to Reference Example 2. Transmittance spectra of the laminate according to Reference Example 2 are shown in FIG. 4D. The laminate according to Reference Example 2 has the following characteristics (s1) to (s4).

(s1): When the incident angle of light is 0°, the transmittance at a wavelength of 350 nm is 73.4%, the transmittance at a wavelength of 380 nm is 88.9%, the transmittance at a wavelength of 400 nm is 95.3%, the average transmittance in the wavelength range of 400 to 700 nm is 95.3%, and the transmittance at a wavelength of 715 nm is 95.7%.

(s2): When the incident angle of light is 30°, the transmittance at a wavelength of 350 nm is 78.5%, the transmittance at a wavelength of 380 nm is 92.0%, the transmittance at a wavelength of 400 nm is 94.5%, the average transmittance in the wavelength range of 400 to 700 nm is 94.3%, and the transmittance at a wavelength of 715 nm is 94.6%.

(s3): When the incident angle of light is 40°, the transmittance at a wavelength of 350 nm is 82.3%, the transmittance at a wavelength of 380 nm is 93.3%, the transmittance at a wavelength of 400 nm is 94.3%, the average transmittance in the wavelength range of 400 to 700 nm is 94.0%, and the transmittance at a wavelength of 715 nm is 94.1%.

(s4): In the wavelength range of 400 to 700 nm, there is no wavelength band in which a ripple, i.e., a local decrease in transmittance, occurs, regardless of the incident angle of light.

Figure 4E:
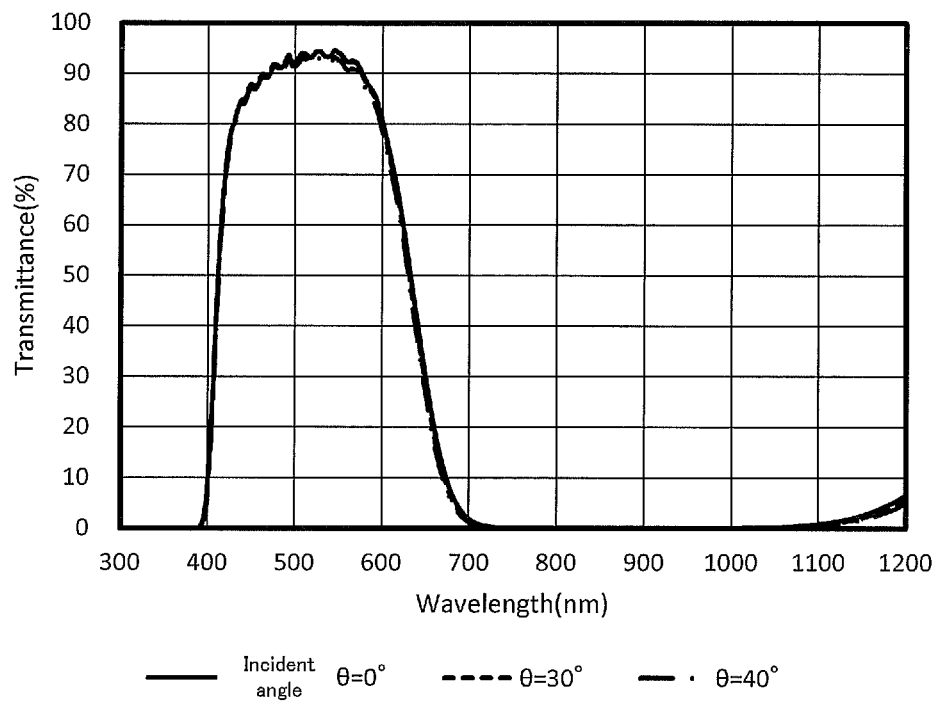
FIG. 4E shows transmittance spectra of the optical filter according to Example 1.
Figure 5A:
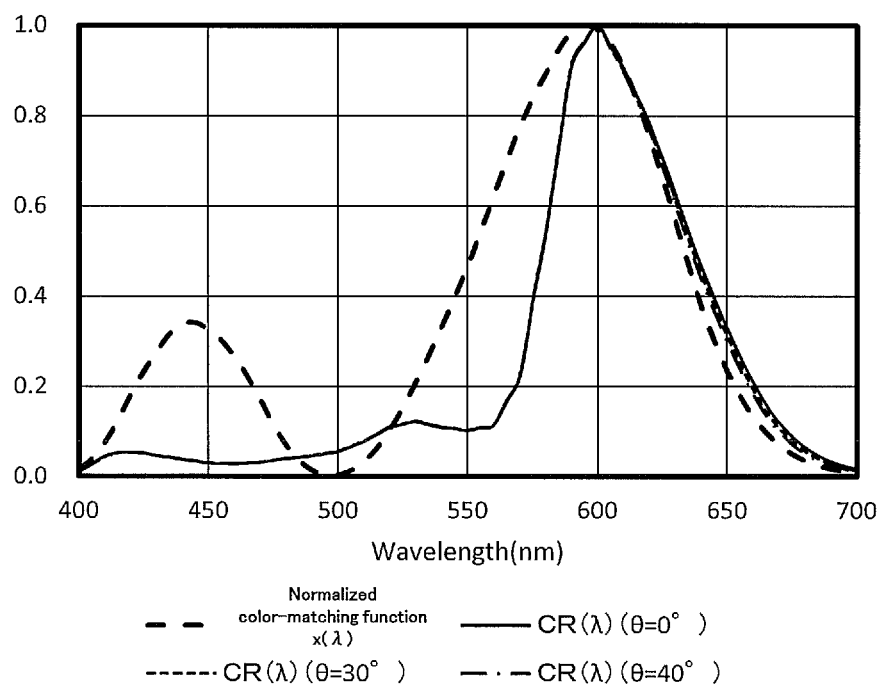
FIG. 5A is a graph showing a relationship between a normalized color-matching function $x(\lambda)$ and a normalized spectral sensitivity function $CG_\theta(\lambda)$ determined based on the transmittance spectra of the optical filter according to Example 1 and $R(\lambda)$.
Figure 5B:
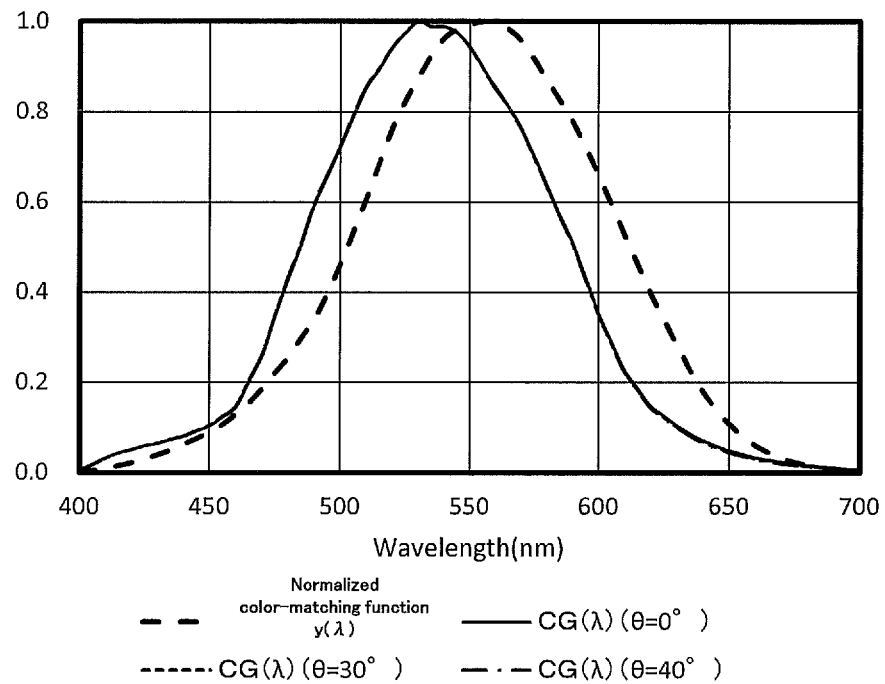
FIG. 5B is a graph showing a relationship between a normalized color-matching function $y(\lambda)$ and a normalized spectral sensitivity function $CG_\theta(\lambda)$ determined based on the transmittance spectra of the optical filter according to Example 1 and $G(\lambda)$.
Figure 5C:
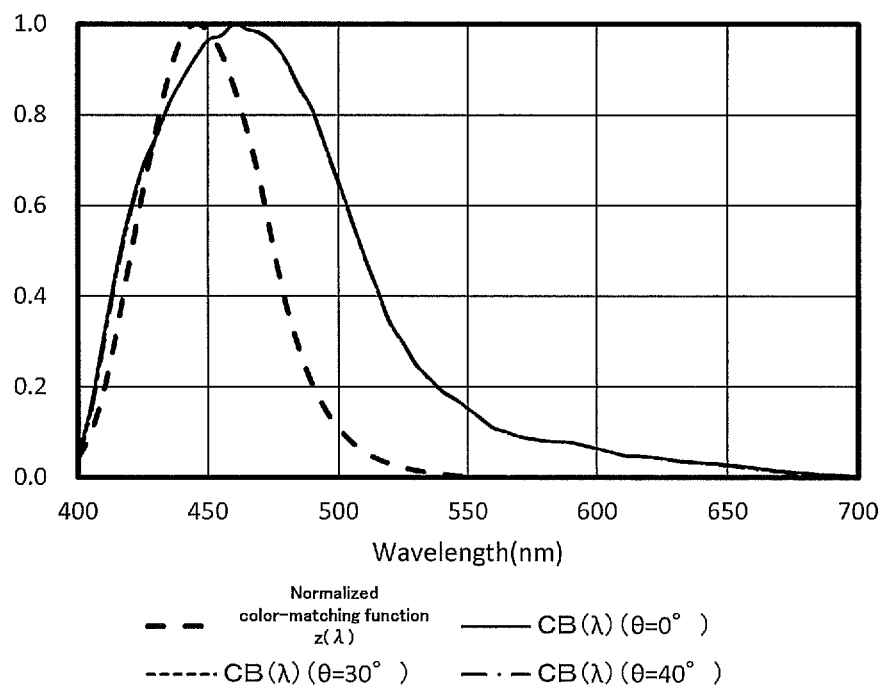
FIG. 5C is a graph showing a relationship between a normalized color-matching function $z(\lambda)$ and a normalized spectral sensitivity function $CB_\theta(\lambda)$ determined based on the transmittance spectra of the optical filter according to Example 1 and $B(\lambda)$.

Transmittance spectra of the optical filter according to Example 1 are shown in FIG. 4E and Table 11. The optical filter according to Example 1 has the characteristics shown in Table 12. The normalized spectral sensitivity function $CR_\theta(\lambda)$ was determined for incident angles θ of 0°, 30°, and 40° by normalization of a function determined as a product of the spectral transmittance $T_\theta(\lambda)$ of the optical filter according to Example 1 and the function $R(\lambda)$ shown in Table (I), the normalization being such that a maximum value of the determined function was 1. A graph showing the normalized color-matching function $x(\lambda)$ and $CR_\theta(\lambda)$ is shown in FIG. 5A. The normalized spectral sensitivity function $CG_\theta(\lambda)$ was determined by normalization of a function determined as a product of the spectral transmittance $T_\theta(\lambda)$ of the optical filter according to Example 1 and the function $G(\lambda)$ shown in Table (I), the normalization being such that a maximum value of the determined function was 1. A graph showing the normalized color-matching function $y(\lambda)$ and $CG_\theta(\lambda)$ is shown in FIG. 5B. The normalized spectral sensitivity function $CB_\theta(\lambda)$ was determined by normalization of a function determined as a product of the spectral transmittance $T_\theta(\lambda)$ of the optical filter according to Example 1 and the function $B(\lambda)$ shown in Table (I), the normalization being such that a maximum value of the determined function was 1. A graph showing the normalized color-matching function $z(\lambda)$ and $CB_\theta(\lambda)$ is shown in FIG. 5C. $IE_\theta^{xR}$, $IE_\theta^{yG}$, and $IE_\theta^{zB}$, $IAE_\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 13 to 15.

Example 2

Coating liquids IRA1 and IRA2 were prepared in the same manner as in Example 1. The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. The total thickness of the infrared-absorbing layer ira11 and infrared-absorbing layer ira12 is 0.2 mm.

A 500-nm-thick $SiO_2$-deposited film (protective layer p1) was formed on the infrared-absorbing layer ira11 using a vacuum deposition apparatus. In the same manner, a 500-nm-thick $SiO_2$-deposited film (protective layer p2) was formed on the infrared-absorbing layer ira12. The coating liquid IRA2 was applied to the surface of the protective layer p1 with a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira21. The coating liquid IRA2 was applied also to the surface of the protective layer p2 with a die coater. The resultant film was cured under the same heating conditions to form an infrared-absorbing layer ira22. The total thickness of the infrared-absorbing layer ira21 and infrared-absorbing layer ira22 is 50 μm.

Figure 6A:
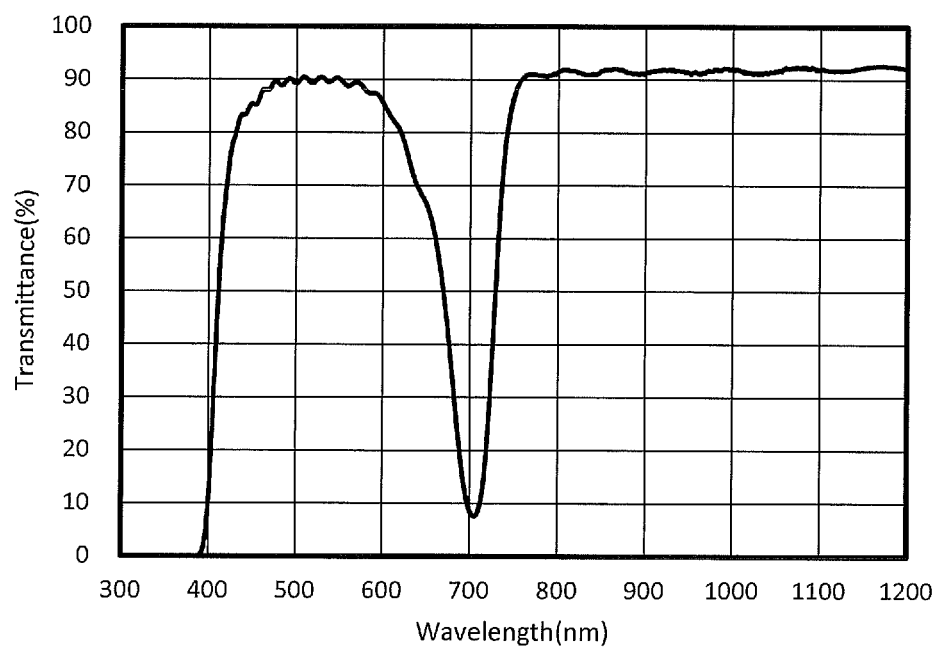
FIG. 6A shows a transmittance spectrum of a laminate according to Reference Example 3.

A 500-nm-thick $SiO_2$-deposited film (protective layer p3) was formed on the infrared-absorbing layer ira22 using a vacuum deposition apparatus. A coating liquid UVIRA1 containing an infrared-absorbing dye and ultraviolet-absorbing dye was prepared in the following manner. The infrared-absorbing dye is a combination of a cyanine-based organic dye and squarylium-based organic dye, has an absorption peak in the wavelength range of 680 to 780 nm, and is less likely to absorb light in the visible region. The ultraviolet-absorbing dye is a dye composed of a benzophenone-based ultraviolet-absorbing substance which is less likely to absorb light in the visible region. The infrared-absorbing dye and ultraviolet-absorbing dye are soluble in MEK. The infrared-absorbing dye and ultraviolet-absorbing dye were added to MEK serving as a solvent, and PVB serving as a matrix was also added thereto, followed by stirring for 2 hours to obtain a coating liquid UVIRA1. The content of the infrared-absorbing dye and the content of the ultraviolet-absorbing dye in the coating liquid UVIRA1 were determined so that a laminate according to Reference Example 3 would show a transmittance spectrum as shown in FIG. 6A. The laminate according to Reference Example 3 was produced by applying the coating liquid UVIRA1 onto a transparent glass substrate (manufactured by SCHOTT AG, product name: D 263 T eco) by spin coating, and curing the resultant film by heating at 140° C. for 30 minutes. In the coating liquid UVIRA1, the mass ratio (mass of infrared-absorbing dye: mass of solids of PVB) between the infrared-absorbing dye and the solids of PVB is about 1:199. The mass ratio (mass of ultraviolet-absorbing dye:mass of solids of PVB) between the ultraviolet-absorbing dye and the solids of PVB is about 40:60. The laminate according to Reference Example 3 has the following characteristics (t1) to (t5).

(t1): The transmittance at a wavelength of 700 nm is 8.7%, the transmittance at a wavelength of 715 nm is 13.6%, and the average transmittance in the wavelength range of 700 to 800 nm is 66.2%.

(t2): The transmittance at a wavelength of 1100 nm is 92.1%.

(t3): The transmittance at a wavelength of 400 nm is 11.8%, the transmittance at a wavelength of 450 nm is 85.3%, and the average transmittance in the wavelength range of 500 to 600 nm is 89.1%.

(t4): The IR cut-off wavelength in the wavelength range of 600 nm to 700 nm is 669 nm, the IR cut-off wavelength in the wavelength range of 700 nm to 800 nm is 729 nm, and the difference therebetween is 60 nm. The wavelength (wavelength of maximum absorption) at which the transmittance is the lowest in the wavelength range of 600 nm to 800 nm is 705 nm.

(t5): The UV cut-off wavelength in the wavelength range of 350 nm to 450 nm is 411 nm.

The coating liquid UVIRA1 was applied onto the protective layer p3 by spin coating, and the resultant film was cured by heating at 140° C. for 30 minutes to form an infrared- and ultraviolet-absorbing layer uvira1. The thickness of the infrared- and ultraviolet-absorbing layer uvira1 is 7 μm.

An anti-reflection film ar1 was formed on the infrared-absorbing layer ira21 using a vacuum deposition apparatus. An anti-reflection film ar2 was formed on the infrared- and ultraviolet-absorbing layer uvira1 using a vacuum deposition apparatus. The specifications of the anti-reflection film ar1 and anti-reflection film ar2 are the same. Each of the anti-reflection film ar1 and anti-reflection film ar2 is a film composed of $SiO_2$ and $TiO_2$ that are alternately laminated, includes 7 layers, and has a total thickness of about 0.4 μm. An optical filter according to Example 2 was thus obtained.

Figure 6B:
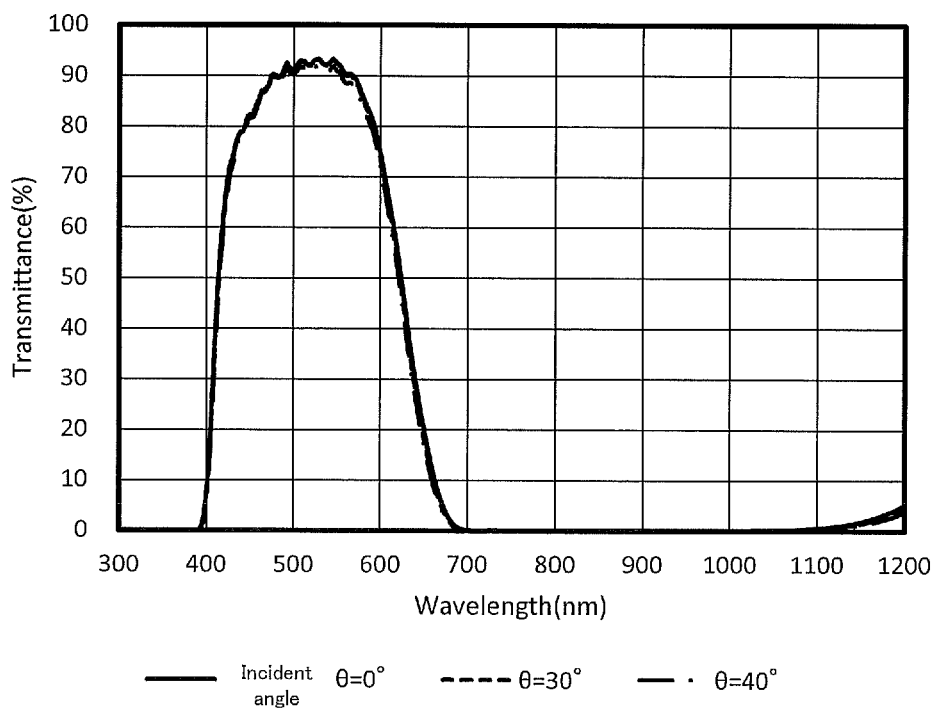
FIG. 6B shows transmittance spectra of an optical filter according to Example 2.
Figure 7A:
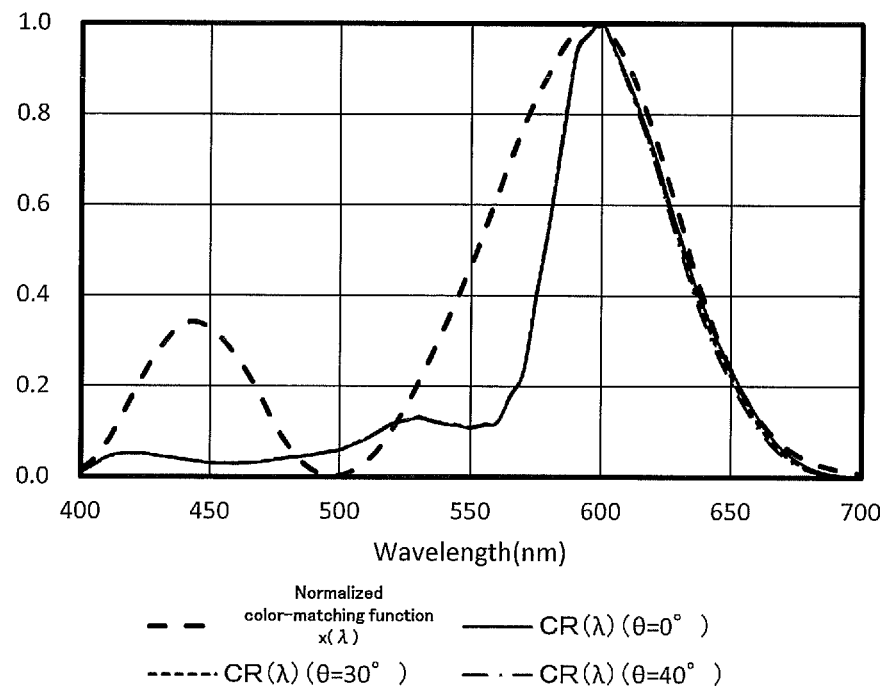
FIG. 7A is a graph showing a relationship between the normalized color-matching function $x(\lambda)$ and the normalized spectral sensitivity function $CR_\theta(\lambda)$ determined based on the transmittance spectra of the optical filter according to Example 2 and $R(\lambda)$.
Figure 7B:
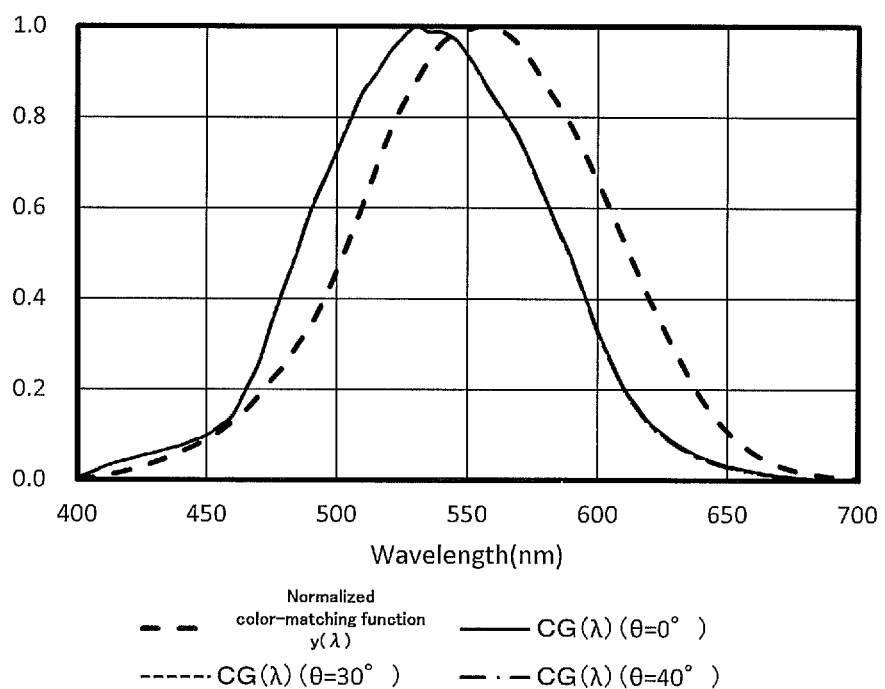
FIG. 7B is a graph showing a relationship between the normalized color-matching function $y(\lambda)$ and the normalized spectral sensitivity function $CG_\theta(\lambda)$ determined based on the transmittance spectra of the optical filter according to Example 2 and $G(\lambda)$.
Figure 7C:
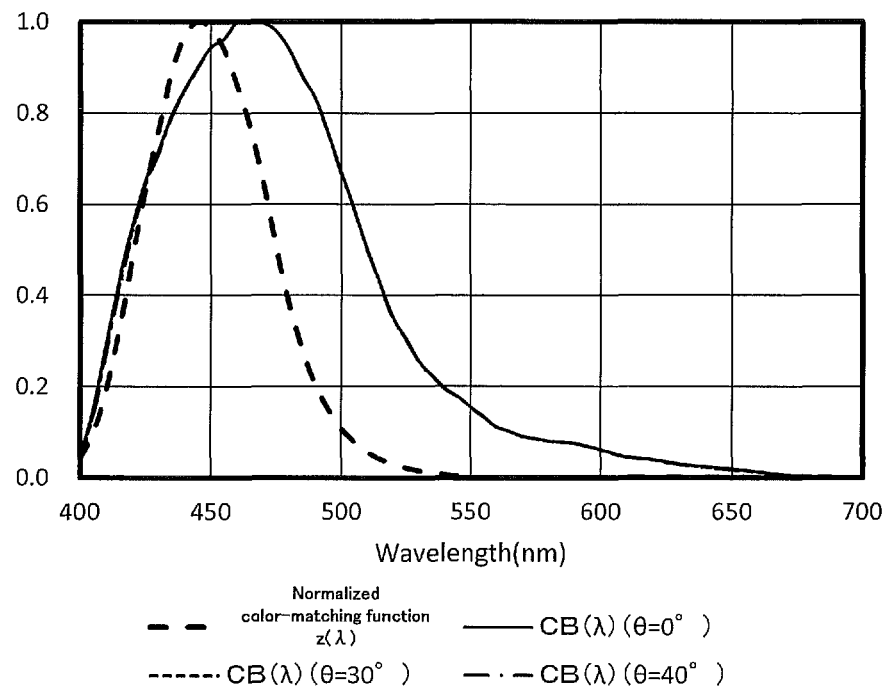
FIG. 7C is a graph showing a relationship between the normalized color-matching function $z(\lambda)$ and the normalized spectral sensitivity function $CB_\theta(\lambda)$ determined based on the transmittance spectra of the optical filter according to Example 2 and $B(\lambda)$.

Transmittance spectra of the optical filter according to Example 2 are shown in FIG. 6B and Table 16. The optical filter according to Example 2 has the characteristics shown in Table 17. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Example 2 and the functions $R(\lambda)$, $G(\lambda)$, and $B(\lambda)$. A graph showing the normalized color-matching function $x(\lambda)$ and $CR_\theta(\lambda)$ is shown in FIG. 7A. A graph showing the normalized color-matching function $y(\lambda)$ and $CG_\theta(\lambda)$ is shown in FIG. 7B. A graph showing the normalized color-matching function $z(\lambda)$ and $CB_\theta(\lambda)$ is shown in FIG. 7C. $IE_\theta^{xR}$, $IE_\theta^{yG}$, $IE_\theta^{zB}$, $IAE_\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ° of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 18 to 20.

Example 3

Figure 8A:
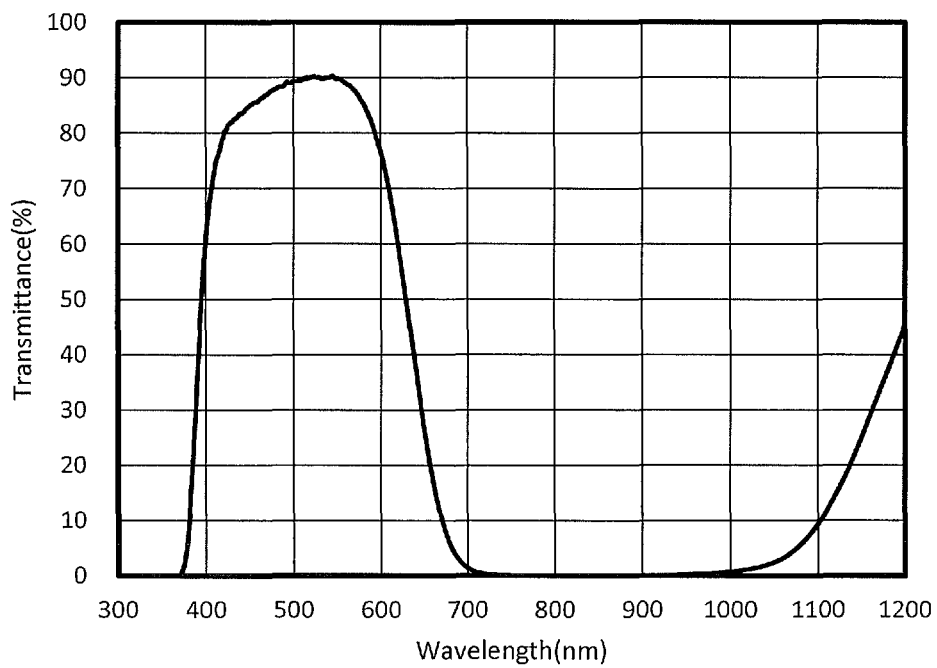
FIG. 8A shows a transmittance spectrum of an intermediate product of an optical filter according to Example 3.

Coating liquids IRA1 and IRA2 were prepared in the same manner as in Example 1. The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. An intermediate product γ of an optical filter according to Example 3 was thus obtained. The total thickness of the infrared-absorbing layer ira11 and infrared-absorbing layer ira12 is 0.2 mm. A transmittance spectrum shown by the intermediate product γ at an incident angle of 0° is shown in FIG. 8A. The intermediate product γ has the following characteristics (γ1) to (γ6).

(γ1): The average transmittance in the wavelength range of 700 to 1000 nm is 0.5% or less.

(γ2): The average transmittance in the wavelength range of 1100 to 1200 nm is 25.9%.

(γ3): The average transmittance in the wavelength range of 450 to 600 nm is 87.5%.

(γ4): The transmittance at a wavelength of 400 nm is 60.9%.

(γ5): The IR cut-off wavelength is 629 nm, the UV cut-off wavelength is 395 nm, and the full width at half maximum in the transmission region is 234 nm.

(γ6): The wavelength which lies in the wavelength range of 600 to 800 nm and at which the spectral transmittance is 20% is 657 nm.

A 500-nm-thick $SiO_2$-deposited film (protective layer p2) was formed on the infrared-absorbing layer ira12 of the intermediate product γ. A coating liquid UVA1 as used in Example 1 was applied onto the protective layer p2 by spin coating and the resultant film was cured by heating at 140° C. for 30 minutes to form an ultraviolet-absorbing layer uva1. The thickness of the ultraviolet-absorbing layer uva1 is 6 μm.

An anti-reflection film ar1 was formed on the infrared-absorbing layer ira11 using a vacuum deposition apparatus. An anti-reflection film ar2 was formed on the ultraviolet-absorbing layer uva1 using a vacuum deposition apparatus. The specifications of the anti-reflection film ar1 and anti-reflection film ar2 are the same. Each of the anti-reflection film ar1 and anti-reflection film ar2 is a film composed of $SiO_2$ and $TiO_2$ that are alternately laminated, includes 7 layers, and has a total thickness of about 0.4 μm. An optical filter according to Example 3 was thus obtained.

Figure 8B:
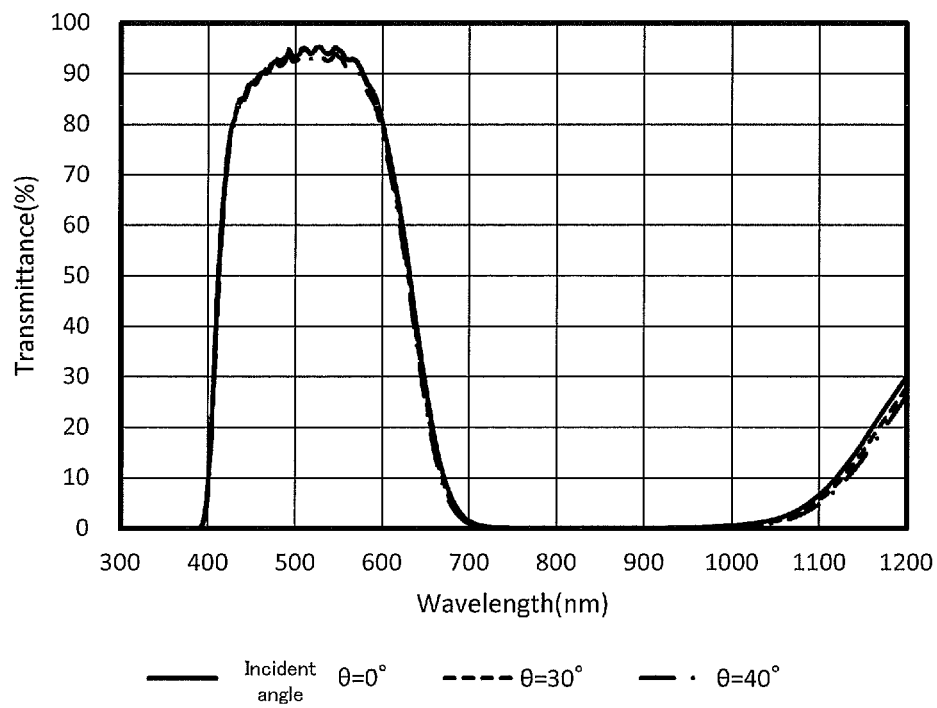
FIG. 8B shows transmittance spectra of the optical filter according to Example 3.
Figure 9A:
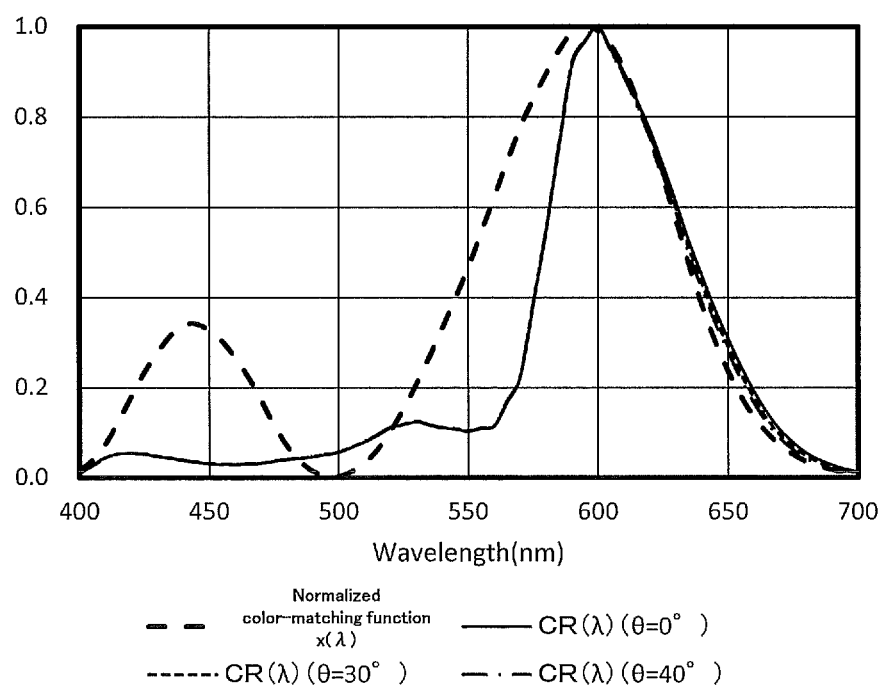
FIG. 9A is a graph showing a relationship between the normalized color-matching function $x(\lambda)$ and the normalized spectral sensitivity function $CR_\theta(\lambda)$ determined based on the transmittance spectra of the optical filter according to Example 3 and $R(\lambda)$.
Figure 9B:
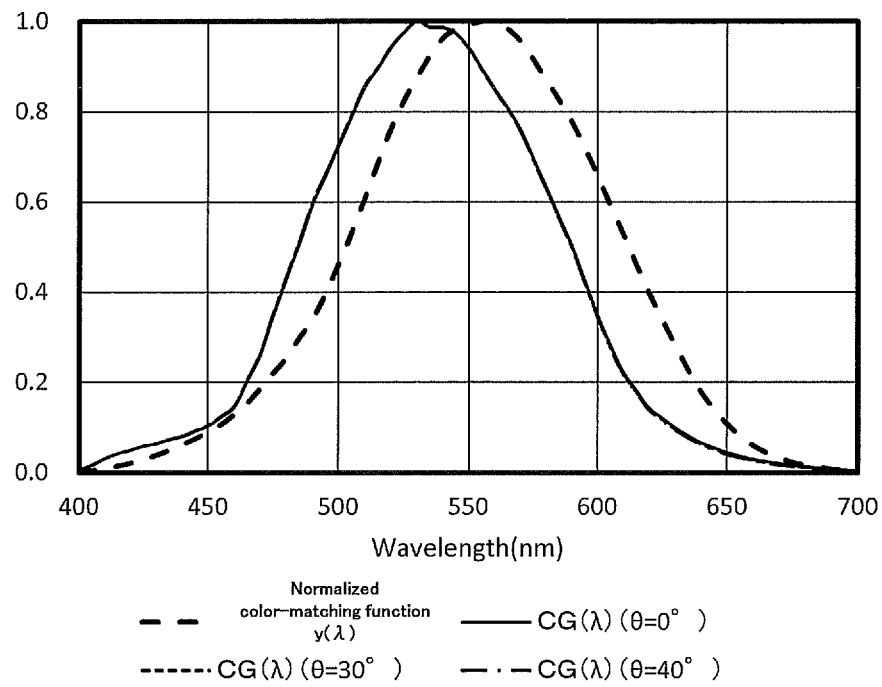
FIG. 9B is a graph showing a relationship between the normalized color-matching function $y(\lambda)$ and the normalized spectral sensitivity function $CG_\theta(\lambda)$ determined based on the transmittance spectra of the optical filter according to Example 3 and $G(\lambda)$.
Figure 9C:
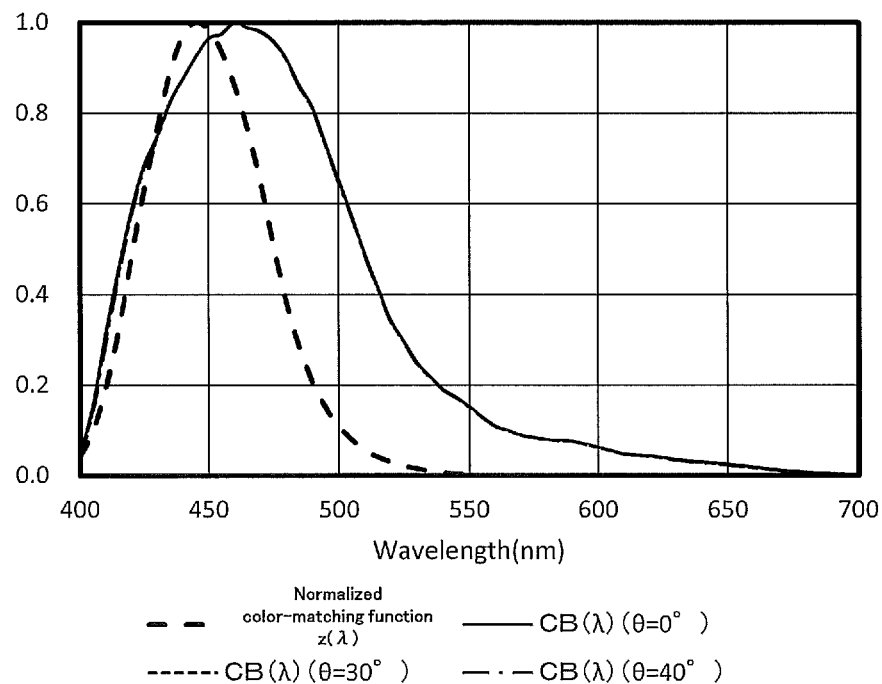
FIG. 9C is a graph showing a relationship between the normalized color-matching function $z(\lambda)$ and the normalized spectral sensitivity function $CB_\theta(\lambda)$ determined based on the transmittance spectra of the optical filter according to Example 3 and $B(\lambda)$.

Transmittance spectra of the optical filter according to Example 3 are shown in FIG. 8B and Table 21. The optical filter according to Example 3 has the characteristics shown in Table 22. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Example 3 and the functions $R(\lambda)$, $G(\lambda)$, and $B(\lambda)$. A graph showing the normalized color-matching function $x(\lambda)$ and $CR_\theta(\lambda)$ is shown in FIG. 9A. A graph showing the normalized color-matching function y(λ) and CG$_\theta$(λ) is shown in FIG. 9B. A graph showing the normalized color-matching function z(λ) and CB$_\theta$(λ) is shown in FIG. 9C. IE$_\theta^{xR}$, IE$_\theta^{yG}$, and IE$_\theta^{zB}$, IAE$_\theta^{xR}$, IAE$_\theta^{yG}$, and IAE$_\theta^{zB}$, and ISE$_\theta^{xR}$, ISE$_\theta^{yG}$, and ISE$_\theta^{zB}$ were determined by the equations (1) to (9) for incident angles θ of 0°, 30°, and 40° based on the normalized spectral sensitivity functions CR$_\theta$(λ), CG$_\theta$(λ), and CB$_\theta$(λ) and the normalized color-matching functions x(λ), y(λ), and z(λ). The results are shown in Tables 23 to 25.

Example 4

A coating liquid IRA1 was prepared in the same manner as in Example 1. The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. The total thickness of the infrared-absorbing layer ira11 and infrared-absorbing layer ira12 is 0.2 mm.

Figure 10A:
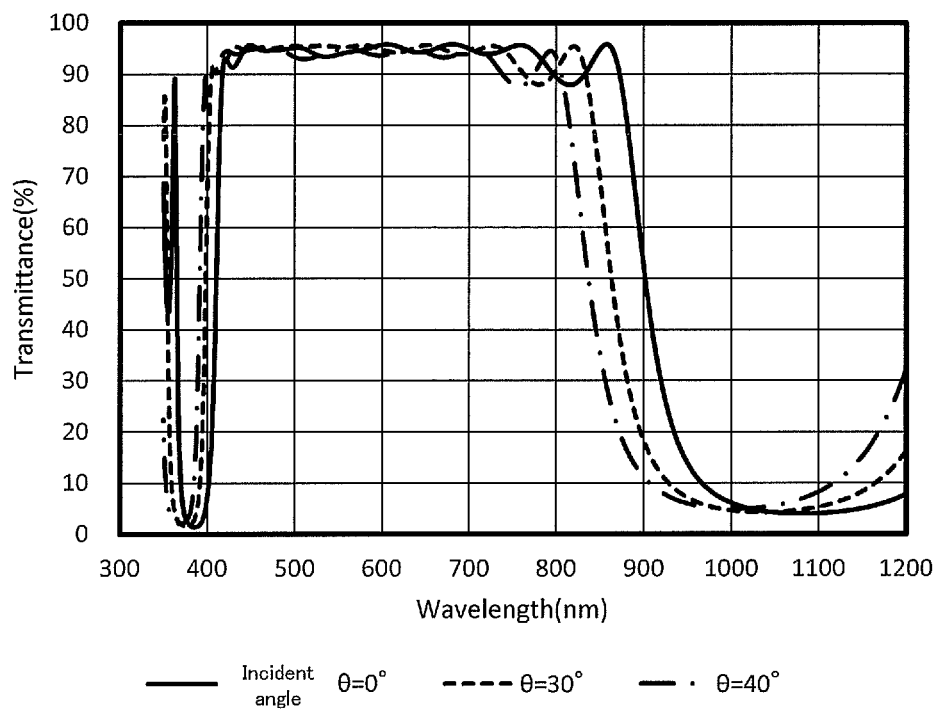
FIG. 10A shows transmittance spectra of a laminate according to Reference Example 4.

Next, an infrared-reflecting film irr1 was formed on the infrared-absorbing layer ira11 using a vacuum deposition apparatus. The infrared-reflecting film irr1 is composed of SiO$_2$ and TiO$_2$ that are alternately laminated in 16 layers. An infrared-reflecting film was formed on one principal surface of a transparent glass substrate (manufactured by SCHOTT AG, product name: D 263 T eco) under the same conditions as for the formation of the infrared-reflecting film irr1 to produce a laminate according to Reference Example 4. Transmittance spectra of the laminate according to Reference Example 4 are shown in FIG. 10A. The laminate according to Reference Example 4 has the following characteristics (u1) to (u3).

(u1): When the incident angle of light is 0°, the transmittance at a wavelength of 380 nm is 1.8%, the transmittance at a wavelength of 400 nm is 7.3%, the average transmittance in the wavelength range of 450 to 700 nm is 94.8%, the lowest transmittance in the wavelength range of 450 to 700 nm is 93.4%, the average transmittance in the wavelength range of 700 to 800 nm is 94.0%, the transmittance at a wavelength of 1100 nm is 4.1%, the IR cut-off wavelength is 902 nm, and the UV cut-off wavelength is 410 nm.

(u2): When the incident angle of light is 30°, the transmittance at a wavelength of 380 nm is 1.8%, the transmittance at a wavelength of 400 nm is 67.8%, the average transmittance in the wavelength range of 450 to 700 nm is 95.0%, the lowest transmittance in the wavelength range of 450 to 700 nm is 93.8%, the average transmittance in the wavelength range of 700 to 800 nm is 92.1%, the transmittance at a wavelength of 1100 nm is 5.3%, the IR cut-off wavelength is 863 nm, and the UV cut-off wavelength is 398 nm.

(u3): When the incident angle of light is 40°, the transmittance at a wavelength of 380 nm is 4.0%, the transmittance at a wavelength of 400 nm is 90.2%, the average transmittance in the wavelength range of 450 to 700 nm is 94.1%, the lowest transmittance in the wavelength range of 450 to 700 nm is 92.9%, the average transmittance in the wavelength range of 700 to 800 nm is 91.5%, the transmittance at a wavelength of 1100 nm is 8.3%, the IR cut-off wavelength is 837 nm, and the UV cut-off wavelength is 391 nm.

A 500-nm-thick SiO$_2$-deposited film (protective layer p2) was formed on the infrared-absorbing layer ira12. A coating liquid UVA1 as used in Example 1 was applied onto the protective layer p2 by spin coating and the resultant film was cured by heating at 140° C. for 30 minutes to form an ultraviolet-absorbing layer uva1. The thickness of the ultraviolet-absorbing layer uva1 is 6 μm. An anti-reflection film ar2 was formed on the ultraviolet-absorbing layer uva1 using a vacuum deposition apparatus. The anti-reflection film ar2 is a film composed of SiO$_2$ and TiO$_2$ that are alternately laminated, includes 7 layers, and has a total thickness of about 0.4 μm. An optical filter according to Example 4 was thus obtained.

Figure 10B:
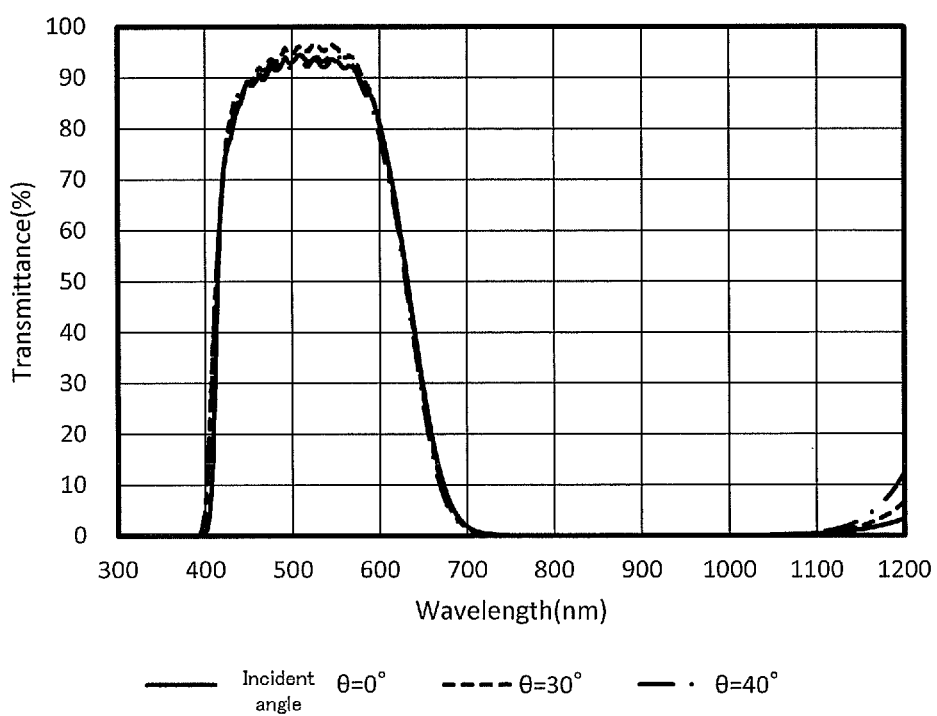
FIG. 10B shows transmittance spectra of the optical filter according to Example 4.
Figure 11A:
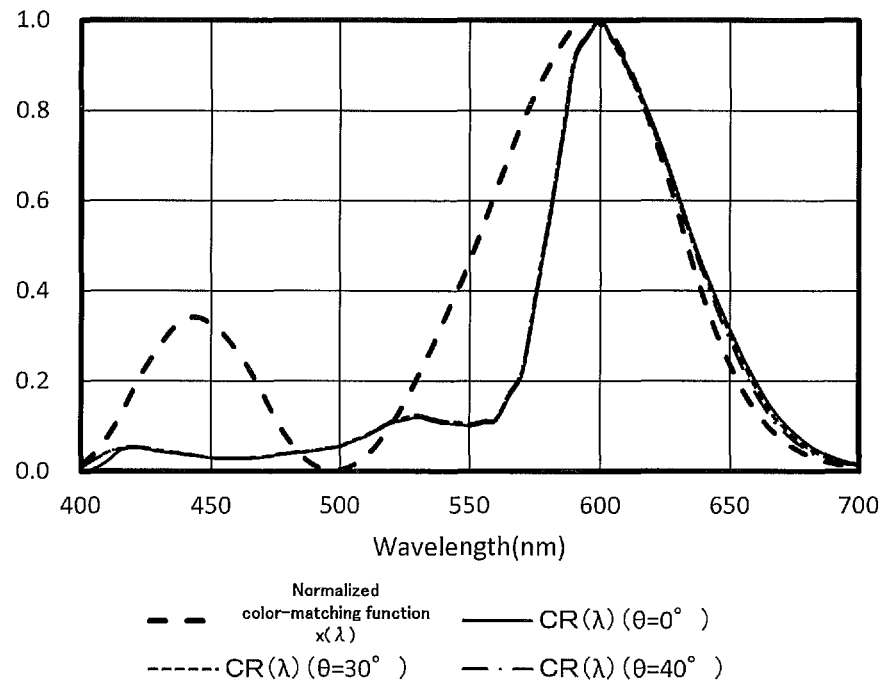
FIG. 11A is a graph showing a relationship between the normalized color-matching function $x(\lambda)$ and the normalized spectral sensitivity function $CR_\theta(\lambda)$ determined based on the transmittance spectra of the optical filter according to Example 4 and $R(\lambda)$.
Figure 11B:
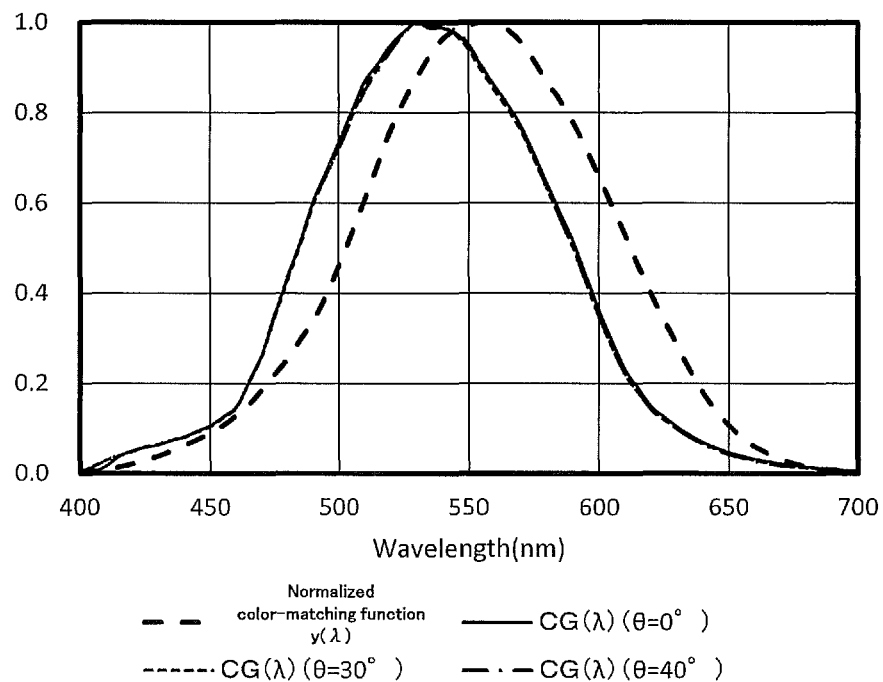
FIG. 11B is a graph showing a relationship between the normalized color-matching function $y(\lambda)$ and the normalized spectral sensitivity function $CG_\theta(\lambda)$ determined based on the transmittance spectra of the optical filter according to Example 4 and $G(\lambda)$.
Figure 11C:
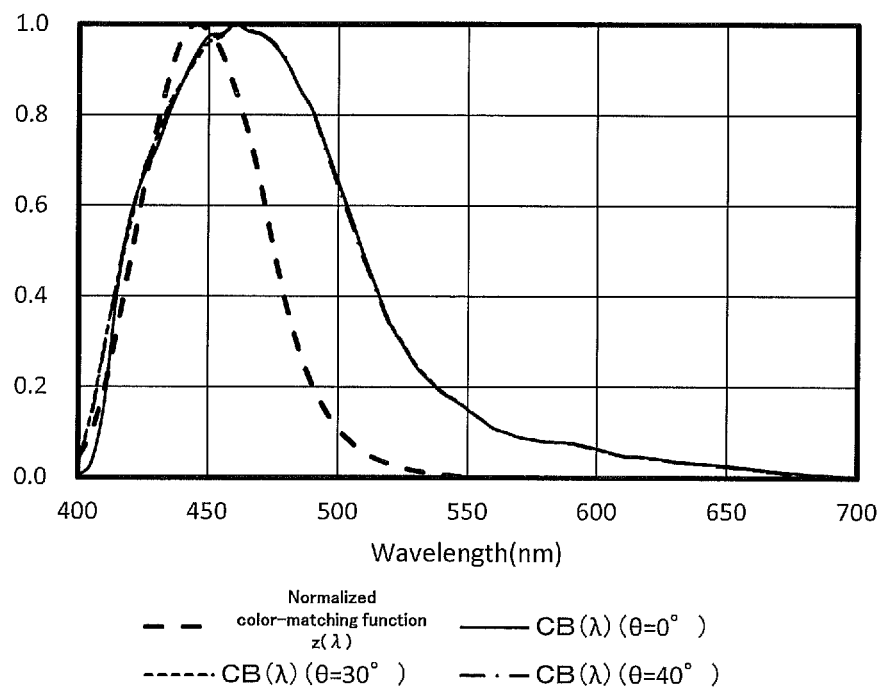
FIG. 11C is a graph showing a relationship between the normalized color-matching function $z(\lambda)$ and the normalized spectral sensitivity function $CB_\theta(\lambda)$ of the optical filter according to Example 4.

Transmittance spectra of the optical filter according to Example 4 are shown in FIG. 10B and Table 26. The optical filter according to Example 4 has the characteristics shown in Table 27. The normalized spectral sensitivity functions CR$_\theta$(λ), CG$_\theta$(λ), and CB$_\theta$(λ) were determined in the same manner as in Example 1 for incident angles θ of 0°, 30°, and 40° based on the spectral transmittance T$_\theta$(λ) of the optical filter according to Example 4 and the functions R(λ), G(λ), and B(λ). A graph showing the normalized color-matching function x(λ) and CR$_\theta$(λ) is shown in FIG. 11A. A graph showing the normalized color-matching function y(λ) and CG$_\theta$(λ) is shown in FIG. 11B. A graph showing the normalized color-matching function z(λ) and CB$_\theta$(λ) is shown in FIG. 11C. IE$_\theta^{xR}$, IE$_\theta^{yG}$, and IE$_\theta^{zB}$, IAE$_\theta^{xR}$, IAE$_\theta^{yG}$, and IAE$_\theta^{zB}$, and ISE$_\theta^{xR}$, ISE$_\theta^{yG}$, and ISE$_\theta^{zB}$ were determined by the equations (1) to (9) for incident angles θ of 0°, 30°, and 40° based on the normalized spectral sensitivity functions CR$_\theta$(λ), CG$_\theta$(λ), and CB$_\theta$(λ) and the normalized color-matching functions x(λ), y(λ), and z(λ). The results are shown in Tables 28 to 30.

Example 5

A coating liquid IRA1 was prepared in the same manner as in Example 1. The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. The total thickness of the infrared-absorbing layer ira11 and infrared-absorbing layer ira12 is 0.2 mm.

Next, an infrared-reflecting film irr1 was formed on the infrared-absorbing layer ira11 using a vacuum deposition apparatus in the same manner as in Example 4. The infrared-reflecting film irr1 is composed of SiO$_2$ and TiO$_2$ that are alternately laminated in 16 layers.

A 500-nm-thick SiO$_2$-deposited film (protective layer p2) was formed on the infrared-absorbing layer ira12. A coating liquid UVRA1 as used in Example 2 was applied onto the protective layer p2 under the same conditions as in Example 2 and the resultant film was cured by heating at 140° C. for 30 minutes to form an infrared- and ultraviolet-absorbing layer uviral. The thickness of the infrared- and ultraviolet-absorbing layer uviral is 7 μm. An anti-reflection film ar2 was formed on the infrared- and ultraviolet-absorbing layer uviral using a vacuum deposition apparatus. The anti-reflection film ar2 is a film composed of $SiO_2$ and $TiO_2$ that are alternately laminated, includes 7 layers, and has a total thickness of about 0.4 μm. An optical filter according to Example 5 was thus obtained.

Figure 12:
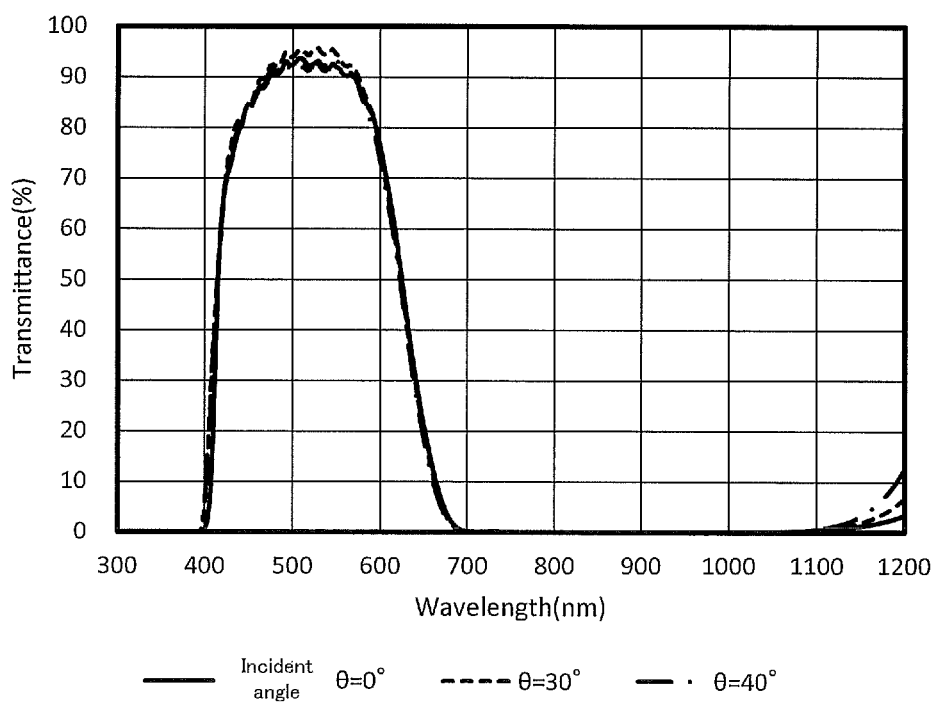
FIG. 12 shows transmittance spectra of an optical filter according to Example 5.
Figure 13A:
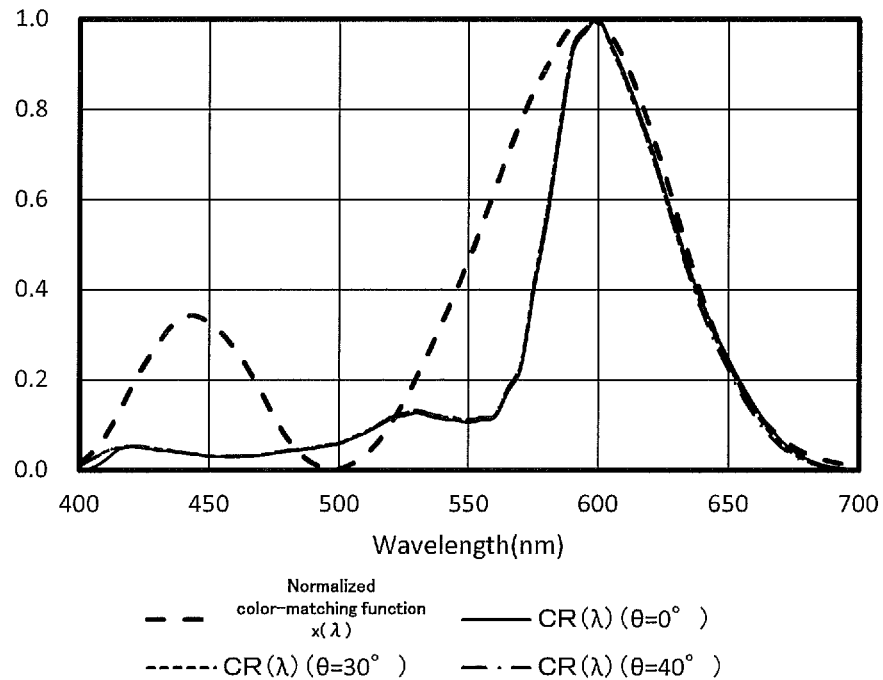
FIG. 13A is a graph showing a relationship between the normalized color-matching function $x(\lambda)$ and the normalized spectral sensitivity function $CR_\theta(\lambda)$ determined based on the transmittance spectra of the optical filter according to Example 5 and $R(\lambda)$.
Figure 13B:
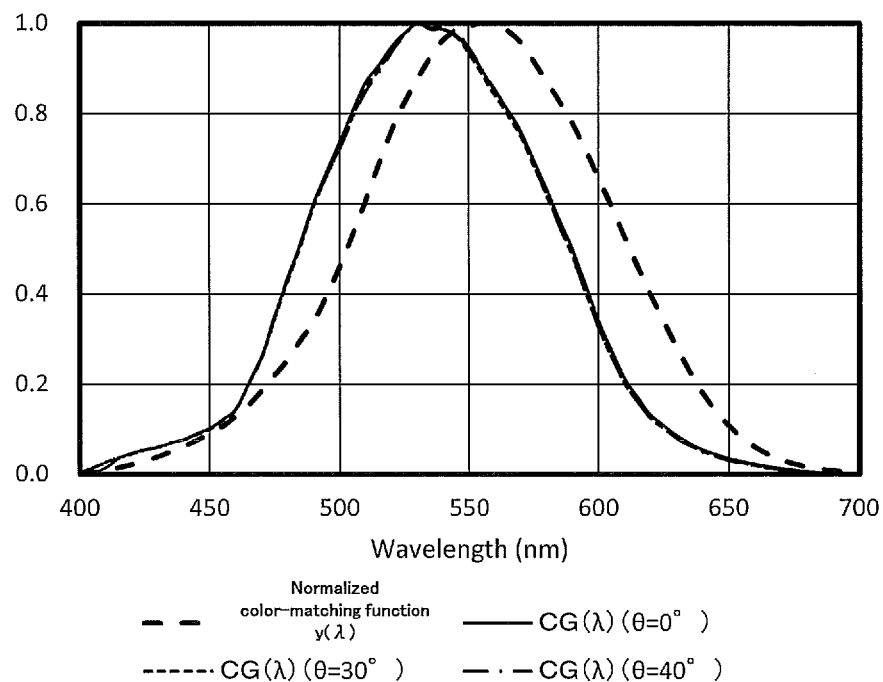
FIG. 13B is a graph showing a relationship between the normalized color-matching function $y(\lambda)$ and the normalized spectral sensitivity function $CG_\theta(\lambda)$ determined based on the transmittance spectra of the optical filter according to Example 5 and $G(\lambda)$.
Figure 13C:
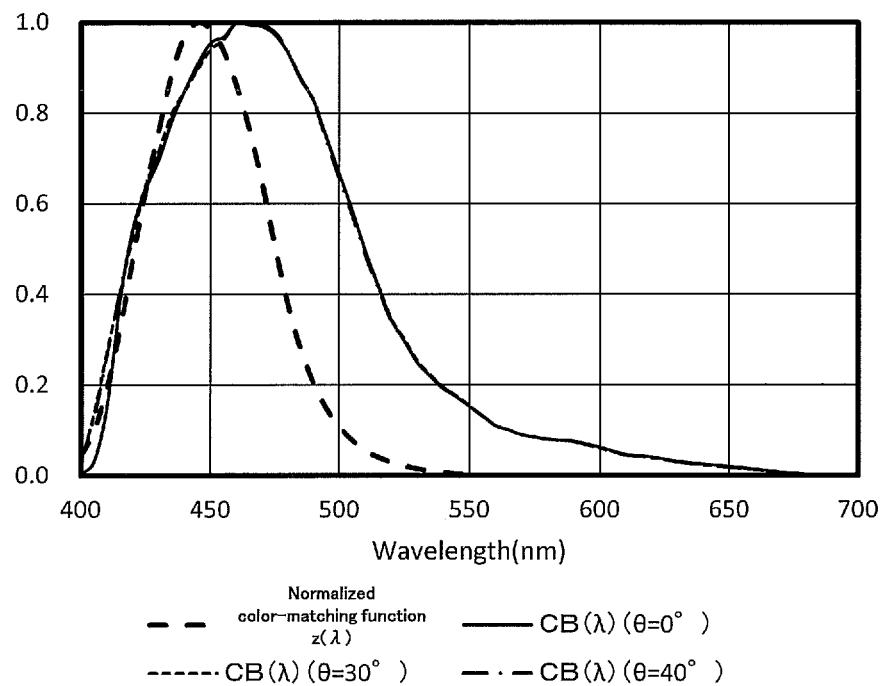
FIG. 13C is a graph showing a relationship between the normalized color-matching function $z(\lambda)$ and the normalized spectral sensitivity function $CB_\theta(\lambda)$ determined based on the transmittance spectra of the optical filter according to Example 5 and $B(\lambda)$.

Transmittance spectra of the optical filter according to Example 5 are shown in FIG. 12 and Table 31. The optical filter according to Example 5 has the characteristics shown in Table 32. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Example 5 and the functions $R(\lambda)$, $G(\lambda)$, and $B(\lambda)$. A graph showing the normalized color-matching function $x(\lambda)$ and $CR_\theta(\lambda)$ is shown in FIG. 13A. A graph showing the normalized color-matching function $y(\lambda)$ and $CG_\theta(\lambda)$ is shown in FIG. 13B. A graph showing the normalized color-matching function $z(\lambda)$ and $CB_\theta(\lambda)$ is shown in FIG. 13C. $IE_\theta^{xR}$, $IE_\theta^{yG}$, and $IE_\theta^{zB}$, $IAE\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ° of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 33 to 35.

Example 6

Coating liquids IRA1 and IRA2 were prepared in the same manner as in Example 1. The coating liquid IRA1 was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira11. In the same manner, the coating liquid IRA1 was applied to the other principal surface of the transparent glass substrate. The resultant film was cured by heat treatment under the same conditions as above to form an infrared-absorbing layer ira12. The total thickness of the infrared-absorbing layer ira11 and infrared-absorbing layer ira12 is 0.4 mm.

Figure 14A:
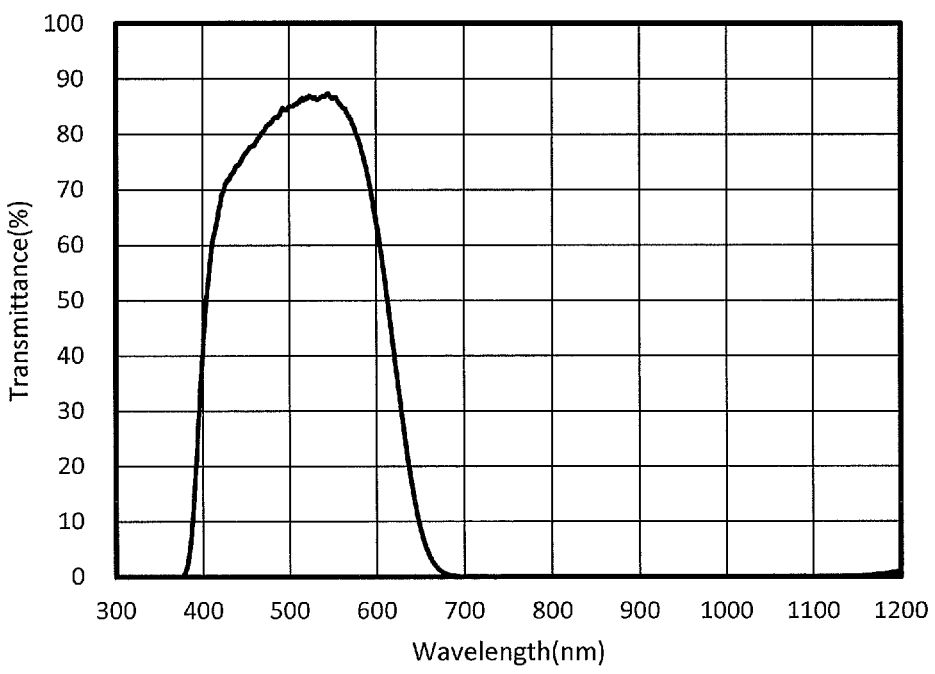
FIG. 14A shows a transmittance spectrum of an intermediate product of an optical filter according to Example 6.

A 500-nm-thick $SiO_2$-deposited film (protective layer p1) was formed on the infrared-absorbing layer ira11 using a vacuum deposition apparatus. In the same manner, a 500-nm-thick $SiO_2$-deposited film (protective layer p2) was formed on the infrared-absorbing layer ira12. The coating liquid IRA2 was applied to the surface of the protective layer p1 with a die coater. The resultant film was cured by heat treatment in an oven at 85° C. for 3 hours, at 125° C. for 3 hours, at 150° C. for 1 hour, and then at 170° C. for 3 hours to form an infrared-absorbing layer ira21. The coating liquid IRA2 was applied also to the surface of the protective layer p2 with a die coater. The resultant film was cured under the same heating conditions to form an infrared-absorbing layer ira22. An intermediate product δ was thus obtained. A transmittance spectrum shown by the intermediate product δ at an incident angle of 0° is shown in FIG. 14A. The intermediate product δ has the following characteristics (δ1) to (δ8).

(δ1): The average transmittance in the wavelength range of 700 to 1100 nm is 0.5% or less.

(δ2): The average transmittance in the wavelength range of 700 to 1000 nm is 0.5% or less.

(δ3): The average transmittance in the wavelength range of 1100 to 1200 nm is 0.5% or less.

(δ4): The average transmittance in the wavelength range of 450 to 600 nm is 82.2%.

(δ5): The average transmittance in the wavelength range of 500 to 600 nm is 82.7%.

(δ6): The transmittance at a wavelength of 400 nm is 42.0% and the transmittance at a wavelength of 450 nm is 76.7%.

(δ7): The IR cut-off wavelength is 613 nm, the UV cut-off wavelength is 404 nm, and the full width at half maximum of the transmission region is 209 nm.

(δ8): The wavelength which lies in the wavelength range of 600 to 800 nm and at which the spectral transmittance is 20% is 637 nm.

An anti-reflection film ar1 was formed on the infrared-absorbing layer ira21 using a vacuum deposition apparatus. An anti-reflection film ar2 was formed on the infrared-absorbing layer ira22 using a vacuum deposition apparatus. The specifications of the anti-reflection film ar1 and anti-reflection film ar2 are the same. Each of the anti-reflection film ar1 and anti-reflection film ar2 is a film composed of $SiO_2$ and $TiO_2$ that are alternately laminated, includes 7 layers, and has a total thickness of about 0.4 μm. An optical filter according to Example 6 was thus obtained.

Figure 14B:
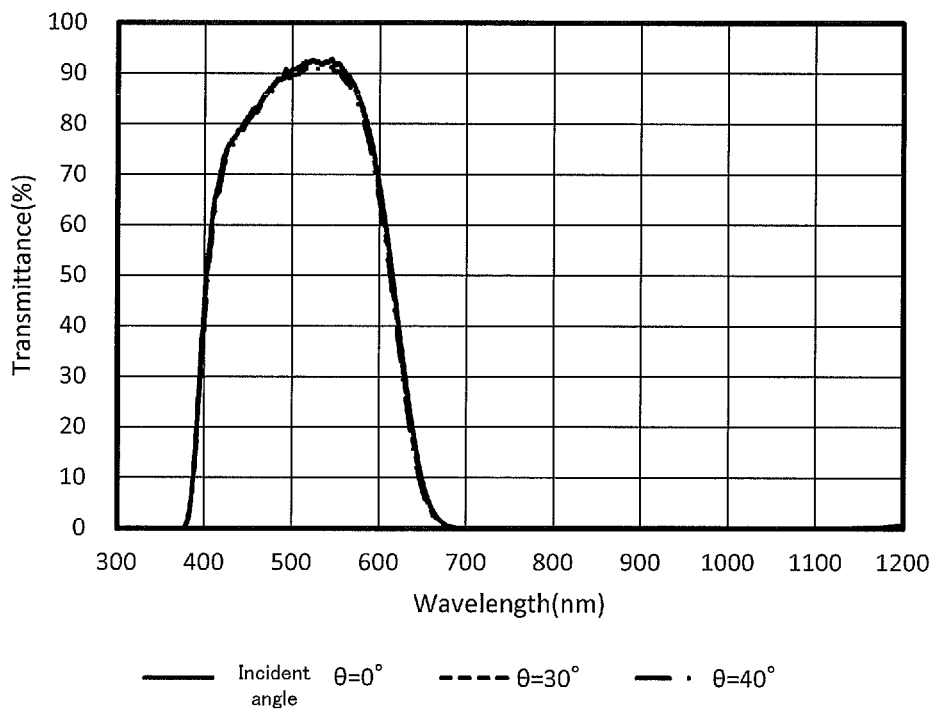
FIG. 14B shows transmittance spectra of the optical filter according to Example 6.
Figure 15A:
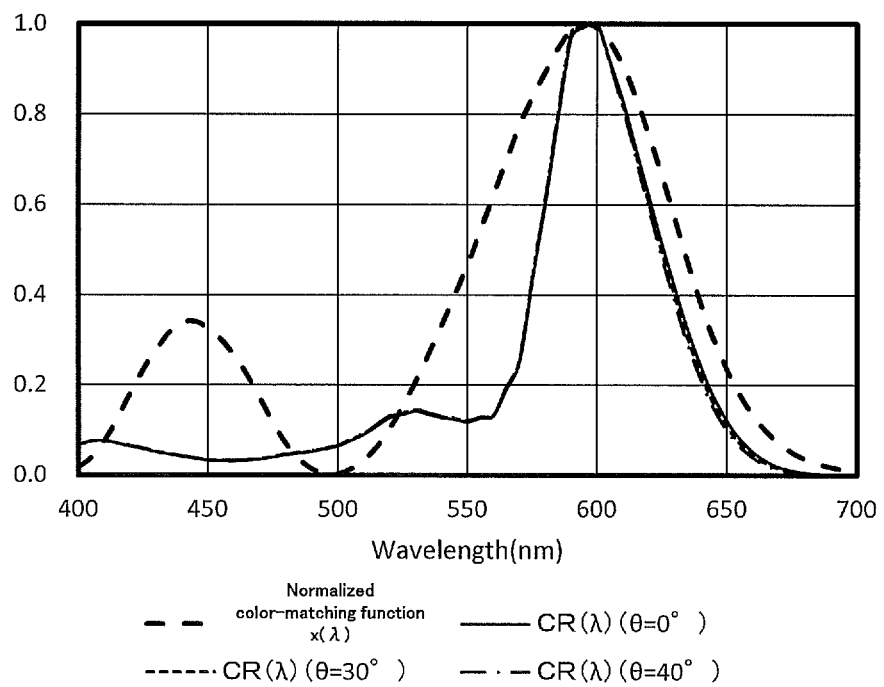
FIG. 15A is a graph showing a relationship between the normalized color-matching function $x(\lambda)$ and the normalized spectral sensitivity function $CR_\theta(\lambda)$ determined based on the transmittance spectra of the optical filter according to Example 6 and $R(\lambda)$.
Figure 15B:
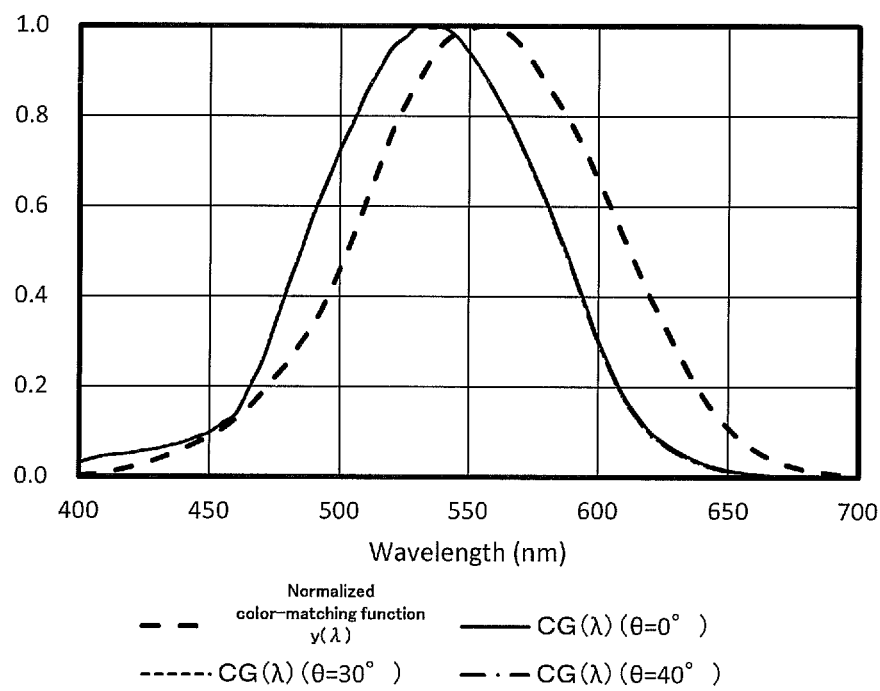
FIG. 15B is a graph showing a relationship between the normalized color-matching function $y(\lambda)$ and the normalized spectral sensitivity function $CG_\theta(\lambda)$ determined based on the transmittance spectra of the optical filter according to Example 6 and $G(\lambda)$.
Figure 15C:
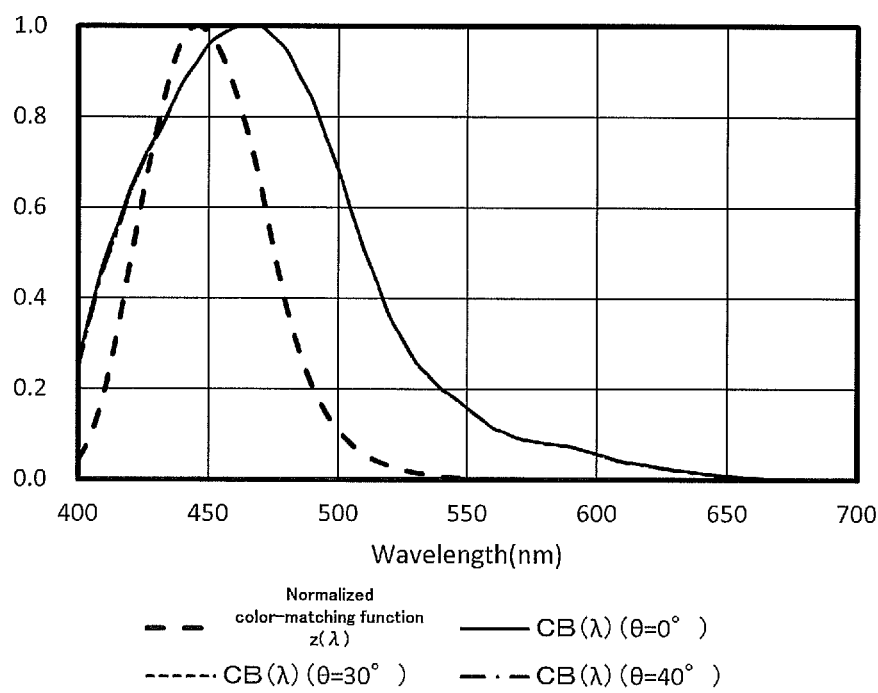
FIG. 15C is a graph showing a relationship between the normalized color-matching function $z(\lambda)$ and the normalized spectral sensitivity function $CB_\theta(\lambda)$ determined based on the transmittance spectra of the optical filter according to Example 6 and $B(\lambda)$.

Transmittance spectra of the optical filter according to Example 6 are shown in FIG. 14B and Table 36. The optical filter according to Example 6 has the characteristics shown in Table 37. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Example 6 and the functions $R(\lambda)$, $G(\lambda)$, and $B(\lambda)$. A graph showing the normalized color-matching function $x(\lambda)$ and $CR_\theta(\lambda)$ is shown in FIG. 15A. A graph showing the normalized color-matching function $y(\lambda)$ and $CG_\theta(\lambda)$ is shown in FIG. 15B. A graph showing the normalized color-matching function $z(\lambda)$ and $CB_\theta(\lambda)$ is shown in FIG. 15C. $IE_\theta^{xR}$, $IE_\theta^{yG}$, and $IE_\theta^{zB}$, $IAE_\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ° of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 38 to 40.

Comparative Example 1

Figure 16A:
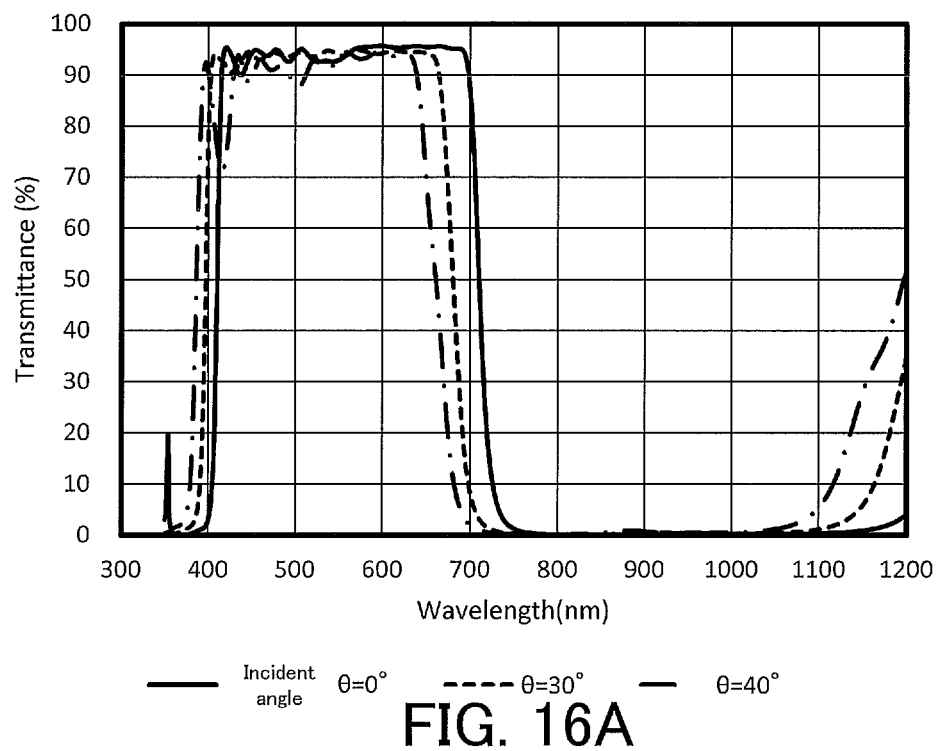
FIG. 16A shows transmittance spectra of an intermediate product of an optical filter according to Comparative Example 1.

An infrared-reflecting film irr2 was formed on one principal surface of a transparent glass substrate (manufactured by SCHOTT AG, product name: D 263 T eco) by alternately laminating $SiO_2$ and $TiO_2$ in 24 layers using a vacuum deposition apparatus. An intermediate product ε was thus obtained. Transmittance spectra of the intermediate product ε are shown in FIG. 16A. The intermediate product ε has the following characteristics (ε1) to (ε3).

(ε1): When the incident angle of light is 0°, the transmittance at a wavelength of 380 nm is 0.5% or less, the transmittance at a wavelength of 400 nm is 3.1%, the average transmittance in the wavelength range of 450 to 600 nm is 94.1%, the lowest transmittance in the wavelength range of 450 to 600 nm is 92.6%, the transmittance at a wavelength of 700 nm is 86.2%, the transmittance at a wavelength of 715 nm is 30.8%, the average transmittance in the wavelength range of 700 to 800 nm is 12.4%, the transmittance at a wavelength of 1100 nm is 0.5% or less, the IR cut-off wavelength is 710 nm, and the UV cut-off wavelength is 410 nm.

(ε2): When the incident angle of light is 30°, the transmittance at a wavelength of 380 nm is 1.7%, the transmittance at a wavelength of 400 nm is 77.7%, the average transmittance in the wavelength range of 450 to 600 nm is 94.1%, the lowest transmittance in the wavelength range of 450 to 600 nm is 93.0%, the transmittance at a wavelength of 700 nm is 8.2%, the transmittance at a wavelength of 715 nm is 2.2%, the average transmittance in the wavelength range of 700 to 800 nm is 1.1%, the transmittance at a wavelength of 1100 nm is 1.2%, the IR cut-off wavelength is 680 nm, and the UV cut-off wavelength is 397 nm.

(ε3): When the incident angle of light is 40°, the transmittance at a wavelength of 380 nm is 13.1%, the transmittance at a wavelength of 400 nm is 90.5%, the average transmittance in the wavelength range of 450 to 600 nm is 92.1%, the lowest transmittance in the wavelength range of 450 to 600 nm is 87.6%, the transmittance at a wavelength of 700 nm is 2.0%, the transmittance at a wavelength of 715 nm is 0.8%, the average transmittance in the wavelength range of 700 to 800 nm is 0.5% or less, the transmittance at a wavelength of 1100 nm is 5.4%, the IR cut-off wavelength is 661 nm, and the UV cut-off wavelength is 386 nm.

Figure 16B:
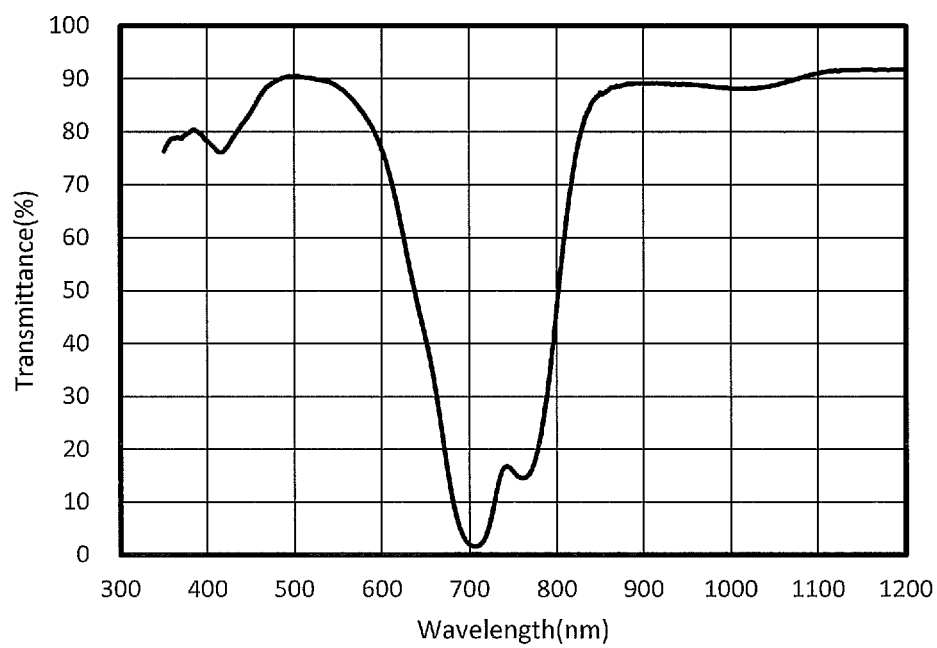
FIG. 16B shows a transmittance spectrum of a laminate according to Reference Example 5.

A coating liquid IRA3 containing an infrared-absorbing dye was prepared in the following manner. The infrared-absorbing dye is a combination of a cyanine-based organic dye and squarylium-based organic dye and is soluble in MEK. The infrared-absorbing dye was added to MEK serving as a solvent, and PVB serving as a matrix was also added thereto, followed by stirring for 2 hours to obtain a coating liquid IRA3. The content of the matrix in the solids of the coating liquid IRA3 was 99 mass %. The coating liquid IRA3 was applied onto the other principal surface of the transparent glass substrate of the intermediate product ε by spin coating, and the resultant film was cured by heating at 140° C. for 30 minutes to form an infrared-absorbing layer ira3. Separately, an infrared-absorbing layer was formed on one principal surface of a transparent glass substrate (manufactured by SCHOTT AG, product name: D 263 T eco) under the same conditions as those for the formation of the infrared-absorbing layer ira3 to produce a laminate according to Reference Example 5. A transmittance spectrum shown by the laminate according to Reference Example 5 at an incident angle of 0° is shown in FIG. 16B. The laminate according to Reference Example 5 has the following characteristics (v1) to (v4).

(v1): The transmittance at a wavelength of 700 nm is 2.0%, the transmittance at a wavelength of 715 nm is 2.6%, and the average transmittance in the wavelength range of 700 to 800 nm is 15.9%.

(v2): The transmittance at a wavelength of 1100 nm is 91.1%.

(v3): The transmittance at a wavelength of 400 nm is 78.2%, the transmittance at a wavelength of 450 nm is 83.8%, and the average transmittance in the wavelength range of 500 to 600 nm is 86.9%.

(v4): The IR cut-off wavelength in the wavelength range of 600 nm to 700 nm is 637 nm, the IR cut-off wavelength in the wavelength range of 700 nm to 800 nm is 800 nm, the difference between these IR cut-off wavelengths is 163 nm, and the wavelength of maximum absorption in the wavelength range of 600 nm to 800 nm is 706 nm.

An anti-reflection film ar1 was formed on the infrared-absorbing layer ira3 using a vacuum deposition apparatus in the same manner as in Example 1 to obtain an optical filter according to Comparative Example 1.

Figure 16C:
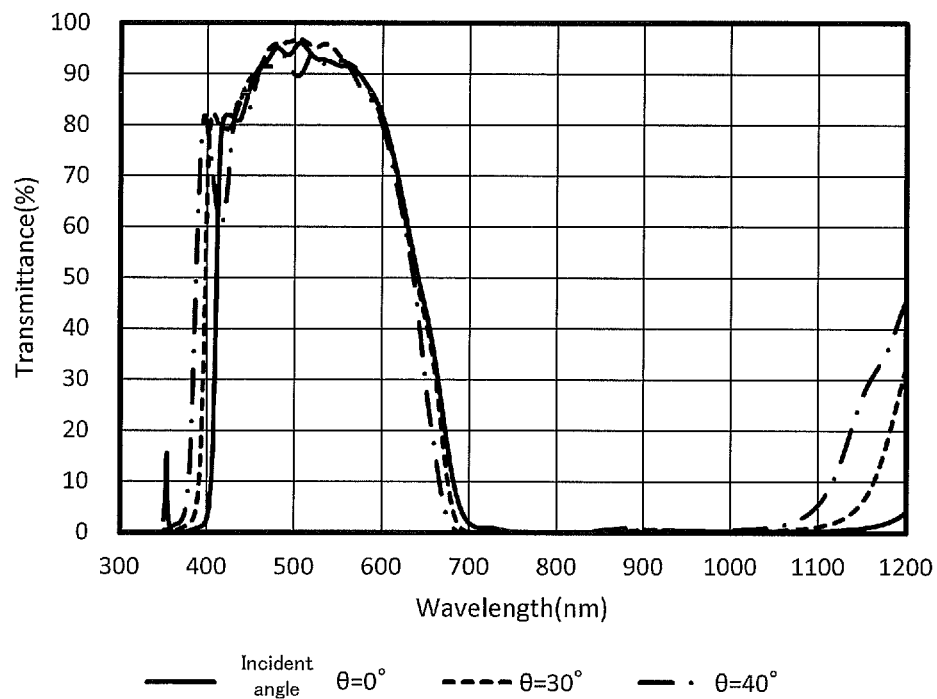
FIG. 16C shows transmittance spectra of the optical filter according to Comparative Example 1.
Figure 17A:
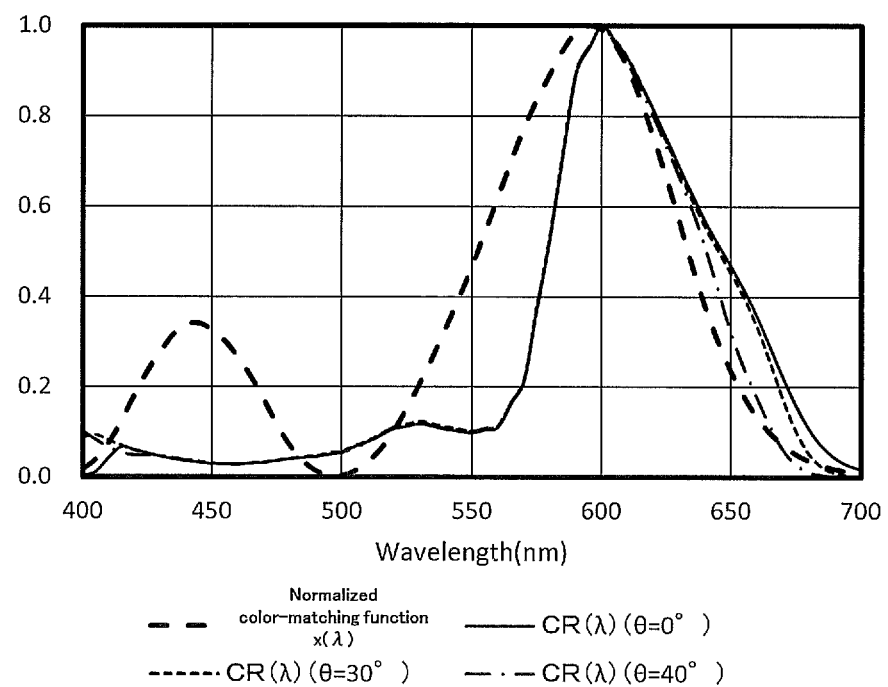
FIG. 17A is a graph showing a relationship between the normalized color-matching function $x(\lambda)$ and the normalized spectral sensitivity function $CR_\theta(\lambda)$ determined based on the transmittance spectra of the optical filter according to Comparative Example 1 and $R(\lambda)$.
Figure 17B:
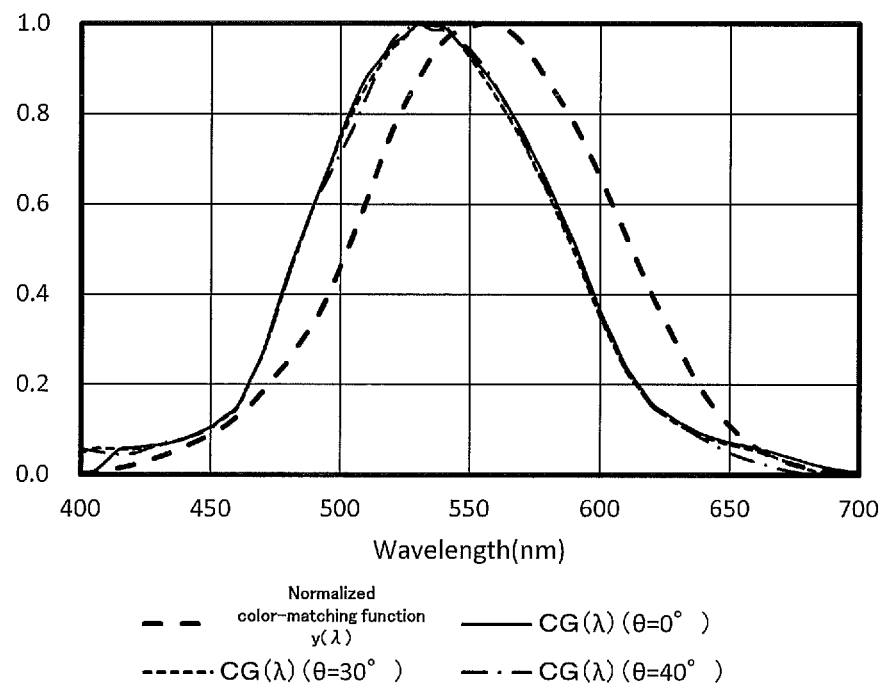
FIG. 17B is a graph showing a relationship between the normalized color-matching function $y(\lambda)$ and the normalized spectral sensitivity function $CG_\theta(\lambda)$ determined based on the transmittance spectra of the optical filter according to Comparative Example 1 and $G(\lambda)$.
Figure 17C:
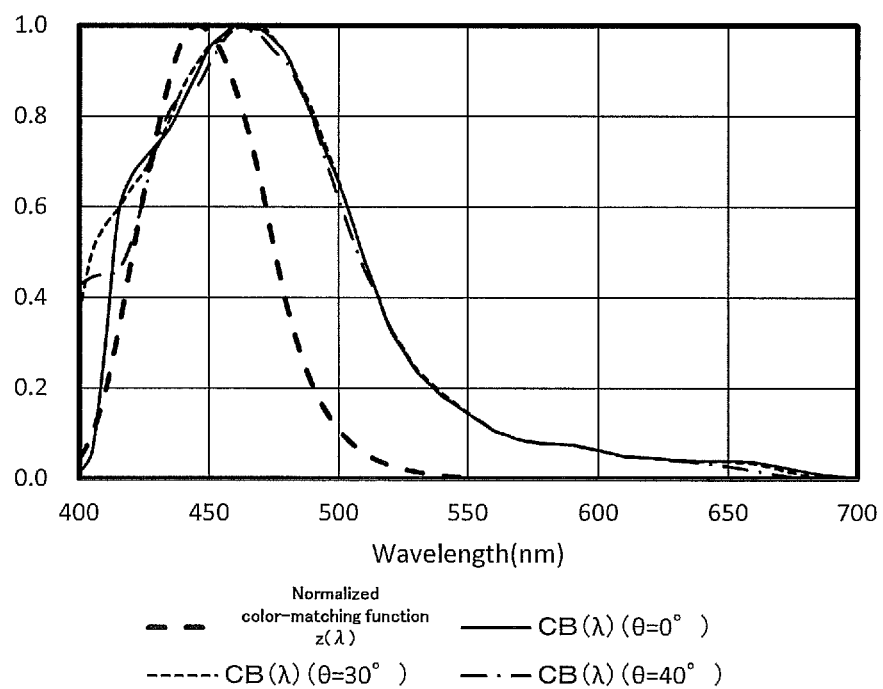
FIG. 17C is a graph showing a relationship between the normalized color-matching function $z(\lambda)$ and the normalized spectral sensitivity function $CB_\theta(\lambda)$ determined based on the transmittance spectra of the optical filter according to Comparative Example 1 and $B(\lambda)$.

Transmittance spectra of the optical filter according to Comparative Example 1 are shown in FIG. 16C and Table 41. The optical filter according to Comparative Example 1 has the characteristics shown in Table 42. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Comparative Example 1 and the functions $R(\lambda)$, $G(\lambda)$, and $B(\lambda)$. A graph showing the normalized color-matching function $x(\lambda)$ and $CR_{74}(\lambda)$ is shown in FIG. 17A. A graph showing the normalized color-matching function $y(\lambda)$ and $CG_\theta(\lambda)$ is shown in FIG. 17B. A graph showing the normalized color-matching function $z(\lambda)$ and $CB_\theta(\lambda)$ is shown in FIG. 17C. $IE_\theta^{xR}$, $IE_\theta^{yG}$, and $IE_\theta^{zB}$, $IAE_\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ° of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 43 to 45.

Comparative Example 2

Figure 18A:
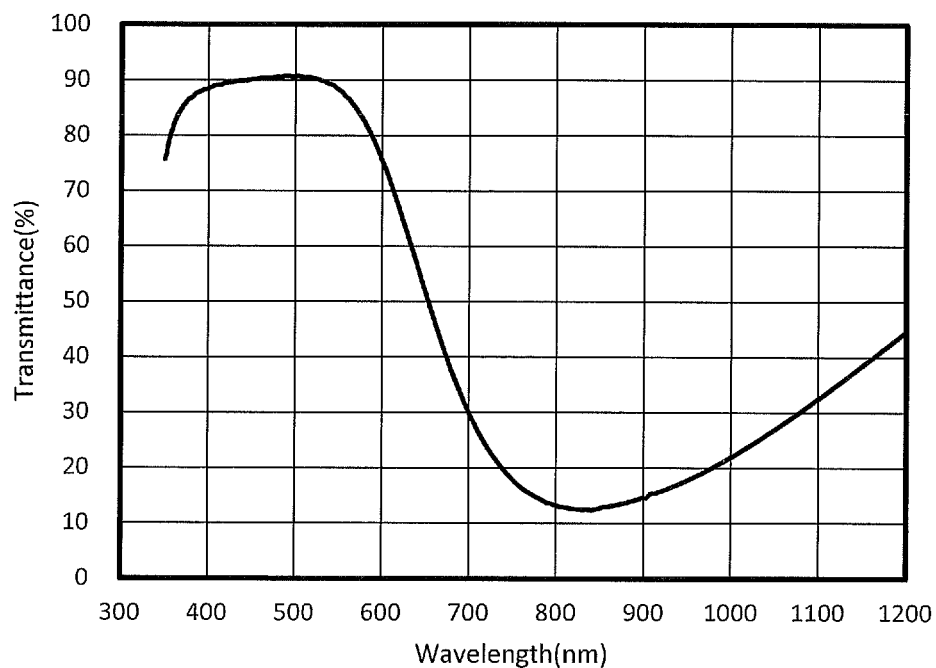
FIG. 18A shows transmittance spectrum of an infrared-absorbing glass substrate of an optical filter according to Comparative Example 2.

An infrared-absorbing glass substrate showing the transmittance spectrum shown in FIG. 18A at an incident angle of 0° was prepared. The infrared-absorbing glass substrate has the following characteristics (g1) to (g5).

(g1): The average transmittance in the wavelength range of 700 to 1000 nm is 16.8%.

(g2): The average transmittance in the wavelength range of 1100 to 1200 nm is 38.5%.

(g3): The average transmittance in the wavelength range of 450 to 600 nm is 87.8%.

(g4): The transmittance at a wavelength of 400 nm is 88.5%.

(g5): The IR cut-off wavelength is 653 nm. The wavelength which lies in the wavelength range of 600 to 800 nm and at which the transmittance is 20% is 738 nm.

Figure 18B:
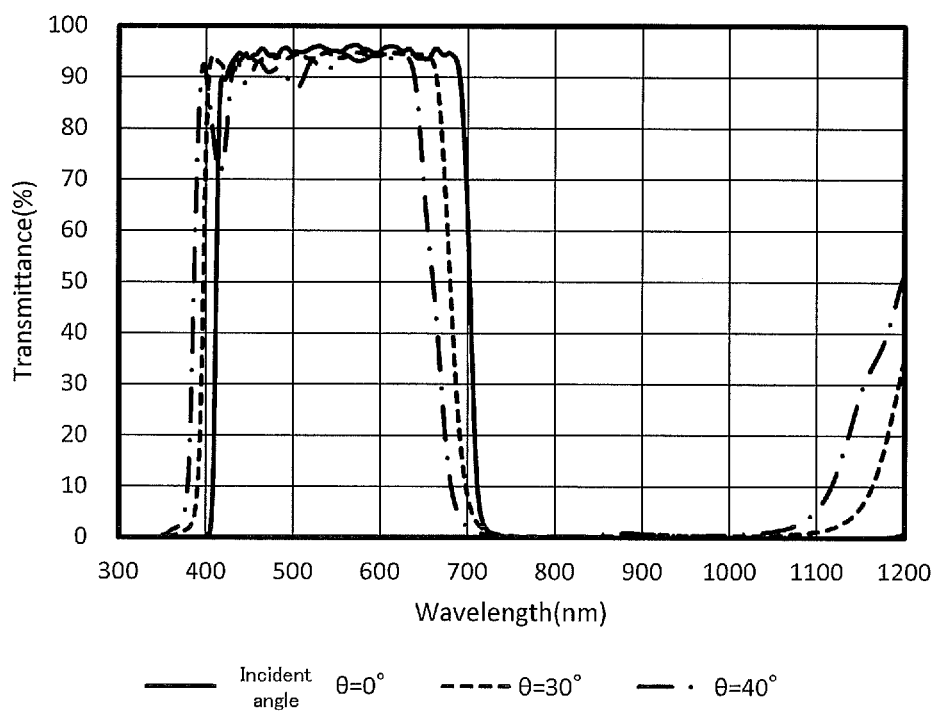
FIG. 18B shows transmittance spectra of a laminate according to Reference Example 6.

An infrared-reflecting film irr3 was formed on one principal surface of the infrared-absorbing glass substrate, which has a thickness of 210 μm, by alternately laminating $SiO_2$ and $TiO_2$ in 20 layers using a vacuum deposition apparatus. An intermediate product ζ was thus obtained. An infrared-reflecting film was formed on one principal surface of a transparent glass substrate (manufactured by SCHOTT AG, product name: D 263 T eco) under the same conditions as for the formation of the infrared-reflecting film irr3 to obtain a laminate according to Reference Example 6. Transmittance spectra of the laminate according to Reference Example 6 are shown in FIG. 18B. The laminate according to Reference Example 6 has the following characteristics (w1) to (w3).

(w1): When the incident angle of light is 0°, the transmittance at a wavelength of 380 nm is 0.5% or less, the transmittance at a wavelength of 400 nm is 0.5% or less, the average transmittance in the wavelength range of 450 to 600 nm is 95.2%, the lowest transmittance in the wavelength range of 450 to 600 nm is 93.7%, the average transmittance in the wavelength range of 700 to 800 nm is 4.7%, the transmittance at a wavelength of 1100 nm is 0.5% or less, the IR cut-off wavelength is 702 nm, and the UV cut-off wavelength is 411 nm.

(w2): When the incident angle of light is 30°, the transmittance at a wavelength of 380 nm is 1.7%, the transmittance at a wavelength of 400 nm is 77.7%, the average transmittance in the wavelength range of 450 to 600 nm is 94.1%, the lowest transmittance in the wavelength range of 450 to 600 nm is 93.0%, the average transmittance in the wavelength range of 700 to 800 nm is 1.1%, the transmittance at a wavelength of 1100 nm is 1.2%, the IR cut-off wavelength is 680 nm, and the UV cut-off wavelength is 397 nm.

(w3): When the incident angle of light is 40°, the transmittance at a wavelength of 380 nm is 13.1%, the transmittance at a wavelength of 400 nm is 90.5%, the average transmittance in the wavelength range of 450 to 600 nm is 92.1%, the lowest transmittance in the wavelength range of 450 to 600 nm is 87.6%, the average transmittance in the wavelength range of 700 to 800 nm is 0.5% or less, the transmittance at a wavelength of 1100 nm is 5.4%, the IR cut-off wavelength is 661 nm, and the UV cut-off wavelength is 386 nm.

Figure 18C:
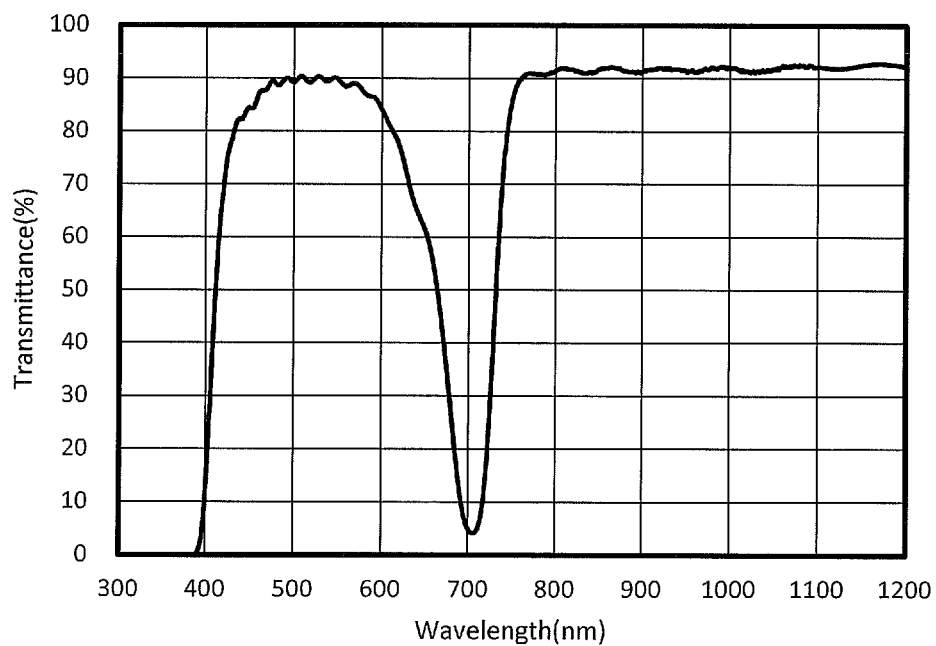
FIG. 18C shows a transmittance spectrum of a laminate according to Reference Example 7.

A coating liquid UVIRA2 containing an infrared-absorbing dye and ultraviolet-absorbing dye was prepared in the following manner. The ultraviolet-absorbing dye is a dye composed of a benzophenone-based ultraviolet-absorbing substance which is less likely to absorb light in the visible region. The infrared-absorbing dye is a combination of a cyanine-based organic dye and squarylium-based organic dye. The infrared-absorbing dye and ultraviolet-absorbing dye are soluble in MEK. The infrared-absorbing dye and ultraviolet-absorbing dye were added to MEK serving as a solvent, and PVB serving as a matrix was also added thereto, followed by stirring for 2 hours to obtain a coating liquid UVIRA2. The content of PVB in the solids of the coating liquid UVIRA2 was 60 mass %. The coating liquid UVIRA2 was applied onto the other principal surface of the intermediate product ζ, and the resultant film was cured by heating to form an infrared- and ultraviolet-absorbing layer uvira2. The thickness of the infrared- and ultraviolet-absorbing layer uvira2 is 7 μm. An infrared- and ultraviolet-absorbing layer was formed on one principal surface of a transparent glass substrate (manufactured by SCHOTT AG, product name: D 263 T eco) using the coating liquid UVIRA2 under the same conditions as those for the formation of the infrared- and ultraviolet-absorbing layer uvira2 to produce a laminate according to Reference Example 7. A transmittance spectrum shown by the laminate according to Reference Example 7 at an incident angle of 0° is shown in FIG. 18C. The laminate according to Reference Example 7 has the following characteristics (p1) to (p5).

(p1): The transmittance at a wavelength of 700 nm is 4.9%, the transmittance at a wavelength of 715 nm is 8.4%, and the average transmittance in the wavelength range of 700 to 800 nm is 63.9%.

(p2): The transmittance at a wavelength of 1100 nm is 92.3%.

(p3): The transmittance at a wavelength of 400 nm is 12.6%, the transmittance at a wavelength of 450 nm is 84.4%, and the average transmittance in the wavelength range of 500 to 600 nm is 88.7%.

(p4): The IR cut-off wavelength in the wavelength range of 600 nm to 700 nm is 664 nm, the IR cut-off wavelength in the wavelength range of 700 nm to 800 nm is 731 nm, and the difference therebetween is 67 nm. The wavelength (wavelength of maximum absorption) at which the transmittance is the lowest in the wavelength range of 600 nm to 800 nm is 705 nm.

(p5): The UV cut-off wavelength in the wavelength range of 350 nm to 450 nm is 411 nm.

In the same manner as in Example 1, an anti-reflection film ar1 was formed on the infrared- and ultraviolet-absorbing layer uvira2 using a vacuum deposition apparatus. The anti-reflection film ar1 is a film composed of $SiO_2$ and $TiO_2$ that are alternately laminated, includes 7 layers, and has a total thickness of about 0.4 μm. An optical filter according to Comparative Example 2 was thus obtained.

Figure 18D:
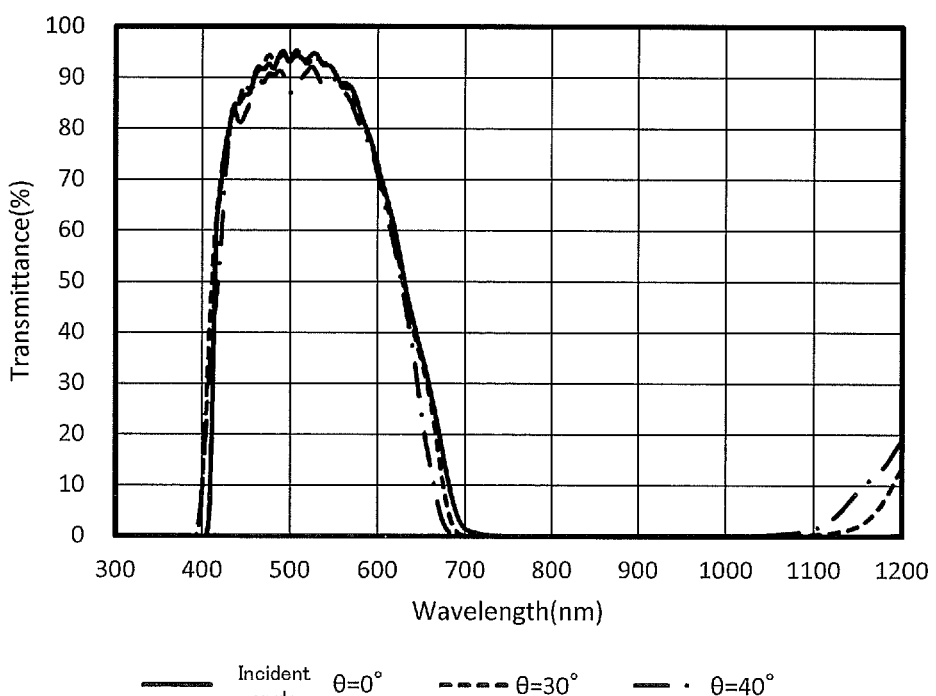
FIG. 18D shows transmittance spectra of the optical filter according to Comparative Example 2.
Figure 19A:
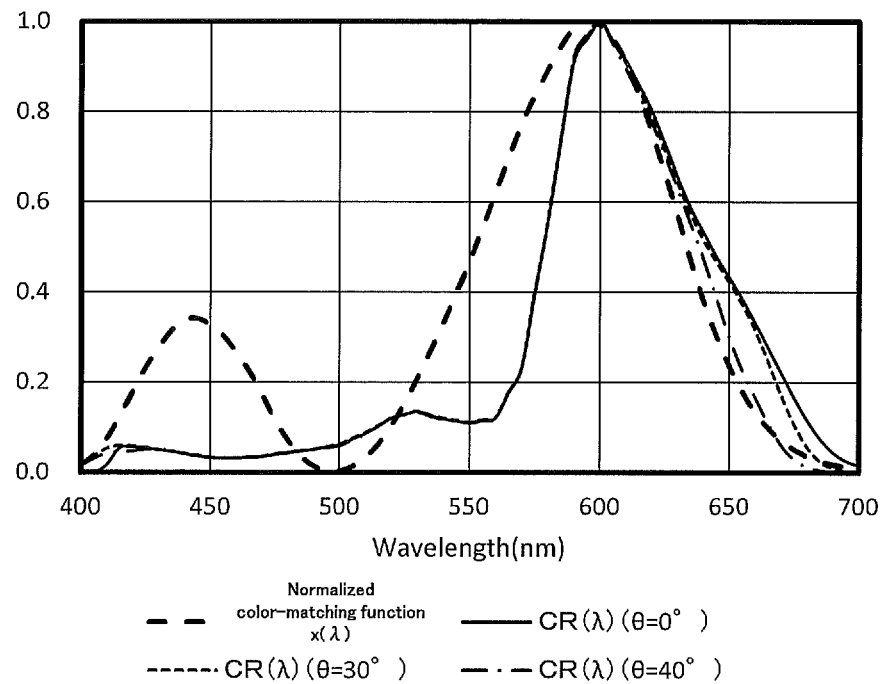
FIG. 19A is a graph showing a relationship between the normalized color-matching function $x(\lambda)$ and the normalized spectral sensitivity function $CR_\theta(\lambda)$ determined based on the transmittance spectra of the optical filter according to Comparative Example 2 and $R(\lambda)$.
Figure 19B:
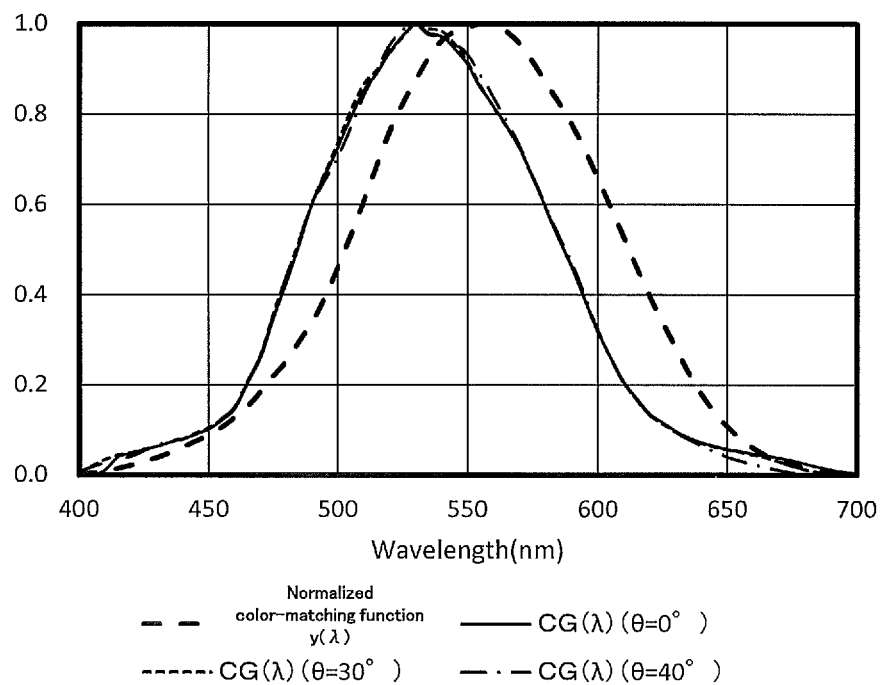
FIG. 19B is a graph showing a relationship between the normalized color-matching function $y(\lambda)$ and the normalized spectral sensitivity function $CG_\theta(\lambda)$ determined based on the transmittance spectra of the optical filter according to Comparative Example 2 and $G(\lambda)$.
Figure 19C:
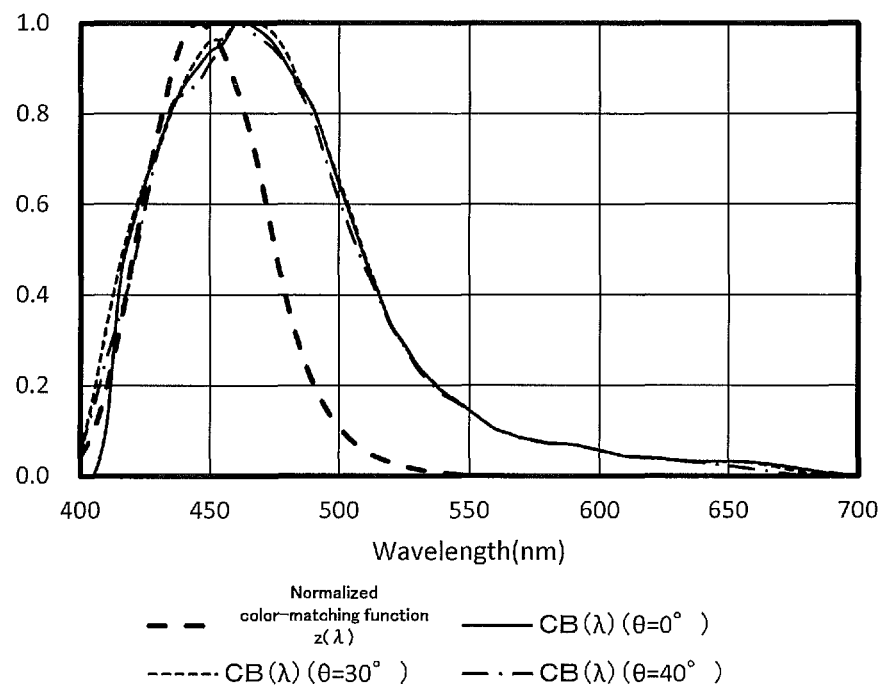
FIG. 19C is a graph showing a relationship between the normalized color-matching function $z(\lambda)$ and the normalized spectral sensitivity function $CB_\theta(\lambda)$ determined based on the transmittance spectra of the optical filter according to Comparative Example 2 and $B(\lambda)$.

Transmittance spectra of the optical filter according to Comparative Example 2 are shown in FIG. 18D and Table 46. The optical filter according to Comparative Example 2 has the characteristics shown in Table 47. The normalized spectral sensitivity functions $CR_\theta(\lambda)$, $CG_\theta(\lambda)$, and $CB_\theta(\lambda)$ were determined in the same manner as in Example 1 for incident angles θ of 0°, 30°, and 40° based on the spectral transmittance $T_\theta(\lambda)$ of the optical filter according to Comparative Example 2 and the functions $R(\lambda)$, $G(\lambda)$, and $B(\lambda)$. A graph showing the normalized color-matching function $x(\lambda)$ and $CR_\theta(\lambda)$ is shown in FIG. 19A. A graph showing the normalized color-matching function $y(\lambda)$ and $CG_\theta(\lambda)$ is shown in FIG. 19B. A graph showing the normalized color-matching function $z(\lambda)$ and $CB_\theta(\lambda)$ is shown in FIG. 19C. $IE_\theta^{xR}$, $IE_\theta^{yG}$, and $IE_\theta^{zB}$, $IAE_\theta^{xR}$, $IAE_\theta^{yG}$, and $IAE_\theta^{zB}$, and $ISE_\theta^{xR}$, $ISE_\theta^{yG}$, and $ISE_\theta^{zB}$ were determined by the equations (1) to (9) for incident angles θ° of 0°, 30°, and 40° based on the normalized spectral sensitivity functions $CR_\theta(\lambda)$, $CG_\theta(\lambda)$, and $CB_\theta(\lambda)$ and the normalized color-matching functions $x(\lambda)$, $y(\lambda)$, and $z(\lambda)$. The results are shown in Tables 48 to 50.

The requirements (i) to (vii) are satisfied by the optical filters according to Examples 1 to 6. The optical filters according to Examples 1 to 6 have sufficiently low transmittances in the wavelength range of 700 nm or more, which indicates that the optical filters according to Examples 1 to 6 can shield against near-infrared light well. In the wavelength range of 700 nm or more, the optical filter according to Example 2 exhibits lower transmittances than those of the optical filter according to Example 1. Since the optical filter according to Example 2 includes the organic infrared-absorbing dye, the transmittances of the optical filter according to Example 2 are lower in the visible region than those of the optical filter according to Example 1 by about 2 points. This is, however, not considered problematic in practical use. The optical filter according to Example 3, which includes only the infrared-absorbing layer ira11 and infrared-absorbing layer ira12 as infrared-absorbing layers, exhibits higher transmittances in the wavelength range of 1100 nm or more than in the wavelength range of 700 to 1100 nm and than the transmittances of the optical filters according to Examples 1 and 2 in the wavelength range of 1100 nm or more. Nevertheless, the optical filter according to Example 3 is considered to have appropriate characteristics for imaging apparatuses because imaging devices such as CMOS sensors have a low sensitivity to light with a wavelength of 1100 nm or more. Although higher than the transmittances of the optical filters of other Examples at around a wavelength of 400 nm, the transmittance of the optical filter according to Example 6 at around a wavelength of 400 nm is 45% or less.

The requirements shown in Tables (II) to (VIII) are satisfied by the optical filters according to Examples 1 to 6. The spectral transmittances shown by each of the optical filters according to Examples 1 to 6 at incident angles of 0°, 30°, and 40° are almost the same. This indicates that when each of the optical filters according to Examples 1 to 6 is incorporated in an imaging apparatus such as a camera, a variation in incident angle of light incident on the optical filter causes only a small change in a sensitivity curve drawn based on output from the imaging apparatus. The infrared-reflecting films of the optical filters according to Examples 4 and 5 are configured so that the boundary between a wavelength band of light that is incident at an incident angle of 40° and is transmitted and a wavelength band of light that is incident at an incident angle of 40° and is reflected is around 850 nm. Thus, the spectral transmittances shown by each of the optical filters according to Examples 4 and 5 at incident angles of 0°, 30°, and 40° are almost the same. The larger the incident angle of light incident on the optical filters according to Examples 4 and 5 is, the higher transmittances the optical filters according to Examples 4 and 5 exhibit around a wavelength of 400 nm. This slightly increases some of the differences between IE at an incident angle of 0° and IE at an incident angle of 30° and the ranges of the differences. The increases are, however, not considered to be problematic in practical use. The optical filters according to Examples 1 to 6 show no local variation (ripple) in transmittance in a portion which is in the wavelength range of 450 to 600 nm and in which the curves of the normalized spectral sensitivity functions relatively greatly depart from those of the normalized color-matching functions. Consequently, there is no great variation between the differences obtained by subtracting IE, IAE, and ISE at an incident angle of 30° from IE, IAE, and ISE at an incident angle of 0° respectively, the differences obtained by subtracting IE, IAE, and ISE at an incident angle of 40° from IE, IAE, and ISE at an incident angle of 0° respectively, and the differences obtained by subtracting IE, IAE, and ISE at an incident angle of 40° from IE, IAE, and ISE at an incident angle of 30° respectively. Therefore, it is thought that when each of the optical filters according to Examples 1 to 6 is incorporated in an imaging apparatus, incidence of light on the optical filter at an incident angle in the range of 0° to 40° does not cause uneven coloring of a taken image.

In a part of the visible region adjacent to the near-infrared region and the near-infrared region, the infrared-absorbing layer ira3 of the optical filter according to Comparative Example 1 determines the boundary between a light transmission wavelength band and a light shielding wavelength band. However, because of a narrow absorption band of the infrared-absorbing layer ira3, the transmittance spectrum of the optical filter according to Comparative Example 1 is affected more greatly by the effect of a shift of a reflection band of the infrared-reflecting film to the short wavelength side as the incident angle of light increases. Moreover, the optical filter according to Comparative Example 1, which has an insufficient ability to absorb light in the ultraviolet region, substantially uses the infrared-reflecting film irr2 alone to shield against light in the ultraviolet region. Thus, in the ultraviolet region, the optical filter according to Comparative Example 1 is strongly affected by the effect of the incident angle-dependent shift of the reflection band to the short wavelength side. For the optical filter according to Comparative Example 1, while $CR_\theta(\lambda)$ decreases around a wavelength of 650 nm to approach the normalized color-matching function $x(\lambda)$ with increased incident angle of light, $IE_\theta^{xR}$ representing an integral of differences between the normalized color-matching function $x(\lambda)$ and the normalized spectral sensitivity $CR_\theta(\lambda)$ of a camera module increases with increased incident angle of light. Meanwhile, $CB_\theta(\lambda)$ fluctuates wildly around a wavelength of 410 nm with increased incident angle of light, rather than monotonically increases or decreases. This is presumably not only because a transmission band of the infrared-reflecting film irr2 shifts depending on the incident angle of light but also because in the wavelength range of 400 nm to 430 nm, the transmittance of the optical filter according to Comparative Example 1 at an incident angle of 40° shows a ripple and sharply declines from the transmittance at an adjacent wavelength, 440 nm, by 15 points or more. Therefore, there are great variations between the differences obtained by subtracting IE, IAE, and ISE at an incident angle of 30° from IE, IAE, and ISE at an incident angle of 0° respectively, the differences obtained by subtracting IE, IAE, and ISE at an incident angle of 40° from IE, IAE, and ISE at an incident angle of 0° respectively, and the differences obtained by subtracting IE, IAE, and ISE at an incident angle of 40° from IE, IAE, and ISE at an incident angle of 30° respectively. Additionally, a manner in which $CR_{74}(\lambda)$ varies depending on the variation in incident angle with respect to the normalized color-matching function $x(\lambda)$ and a manner in which $CB_\theta(\lambda)$ varies depending on the variation in incident angle with respect to the normalized color-matching function $z(\lambda)$ differ from each other. $CR_\theta(\lambda)$ and $CB_\theta(\lambda)$ greatly vary within the narrow range between an incident angle of 30° and an incident angle of 40°. Therefore, there is concern that when the optical filter according to Comparative Example 1 is incorporated in an imaging apparatus, an image obtained using the imaging apparatus may be colored quite unevenly.

In a part of the visible region adjacent to the near-infrared region, the near-infrared region, and the ultraviolet region, the infrared- and ultraviolet-absorbing layer uvira2 of the optical filter according to Comparative Example 2 determines the boundary between a light transmission wavelength band and a light shielding wavelength band. However, because of a narrow absorption band of the infrared- and ultraviolet-absorbing layer uvira2 in the near-infrared region, a reflection band determined by the infrared-reflecting film irr3 of the optical filter according to Comparative Example 2 cannot be set on a sufficiently long wavelength side. Therefore, the optical filter according to Comparative Example 2 is more inevitably affected by the effect of a shift of the reflection band to the short wavelength side as the incident angle of light increases. Additionally, a local variation in the transmittance of the optical filter according to Comparative Example 2 at an incident angle of 40° is observed in the visible region. Therefore, for the optical filter according to Comparative Example 2, IE and IAE greatly vary depending on the variation in incident angle of light, and there is concern that when the optical filter according to Comparative Example 2 is incorporated in an imaging apparatus, an image obtained using the imaging apparatus may be colored quite unevenly.

TABLE 11

| Wavelength [nm] | Transmittance [%] | | |
|---|---|---|---|
| | Incident angle $\theta = 0°$ | Incident angle $\theta = 30°$ | Incident angle $\theta = 40°$ |
| 350 | 0.0 | 0.0 | 0.0 |
| 380 | 0.0 | 0.0 | 0.0 |
| 390 | 0.1 | 0.1 | 0.1 |
| 400 | 9.3 | 8.2 | 7.3 |
| 410 | 44.6 | 42.8 | 41.1 |
| 420 | 70.4 | 69.6 | 68.3 |
| 430 | 80.4 | 80.4 | 79.5 |

TABLE 11-continued

| Wavelength [nm] | Transmittance [%] | | |
|---|---|---|---|
| | Incident angle $\theta = 0°$ | Incident angle $\theta = 30°$ | Incident angle $\theta = 40°$ |
| 440 | 84.3 | 84.7 | 83.9 |
| 450 | 87.1 | 87.7 | 87.0 |
| 460 | 88.9 | 89.5 | 88.7 |
| 470 | 89.7 | 90.2 | 89.3 |
| 480 | 91.1 | 91.5 | 90.6 |
| 490 | 92.9 | 93.3 | 92.2 |
| 500 | 92.4 | 92.6 | 91.4 |
| 510 | 93.9 | 94.1 | 92.8 |
| 520 | 93.6 | 93.6 | 92.3 |
| 530 | 94.1 | 94.2 | 92.8 |
| 540 | 93.5 | 93.4 | 92.0 |
| 550 | 94.0 | 93.9 | 92.6 |
| 560 | 92.3 | 92.1 | 90.7 |
| 570 | 92.1 | 91.9 | 90.5 |
| 580 | 88.8 | 88.4 | 87.0 |
| 590 | 86.1 | 85.6 | 84.2 |
| 600 | 80.6 | 79.8 | 78.4 |
| 610 | 73.0 | 71.9 | 70.4 |
| 620 | 64.5 | 63.2 | 61.6 |
| 630 | 53.4 | 51.8 | 50.0 |
| 640 | 41.5 | 39.7 | 38.0 |
| 650 | 30.2 | 28.4 | 26.8 |
| 660 | 20.0 | 18.4 | 17.0 |
| 670 | 12.3 | 11.0 | 9.9 |
| 680 | 7.0 | 6.0 | 5.3 |
| 690 | 3.8 | 3.2 | 2.7 |
| 700 | 1.9 | 1.5 | 1.3 |
| 710 | 1.0 | 0.7 | 0.6 |
| 715 | 0.7 | 0.5 | 0.4 |
| 730 | 0.3 | 0.2 | 0.1 |
| 740 | 0.1 | 0.1 | 0.1 |
| 750 | 0.1 | 0.1 | 0.0 |
| 760 | 0.0 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.0 | 0.0 | 0.0 |
| 940 | 0.0 | 0.0 | 0.0 |
| 960 | 0.0 | 0.0 | 0.0 |
| 980 | 0.1 | 0.0 | 0.0 |
| 1000 | 0.1 | 0.1 | 0.0 |
| 1020 | 0.1 | 0.1 | 0.1 |
| 1040 | 0.2 | 0.1 | 0.1 |
| 1060 | 0.3 | 0.2 | 0.2 |
| 1080 | 0.5 | 0.4 | 0.3 |
| 1100 | 0.9 | 0.6 | 0.5 |
| 1120 | 1.4 | 1.0 | 0.8 |
| 1140 | 2.1 | 1.6 | 1.3 |
| 1160 | 3.2 | 2.6 | 2.2 |
| 1180 | 4.7 | 3.9 | 3.3 |
| 1200 | 6.6 | 5.6 | 4.9 |

TABLE 12

| Incident angle $\theta$ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 3.0 | 91.5 | 633 | 412 | 221 |
| 30° | 0.5 or less | 0.5 or less | 2.4 | 91.4 | 631 | 412 | 219 |
| 40° | 0.5 or less | 0.5 or less | 2.1 | 90.0 | 630 | 413 | 217 |

TABLE 13

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 29.77 | 30.70 | 31.36 | −0.93 | −1.59 | −0.66 |
| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
| 6.51 | 6.82 | 6.96 | −0.31 | −0.45 | −0.14 |
| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
| −42.69 | −41.97 | −41.51 | −0.72 | −1.18 | −0.46 |
| Range | Range | Range | Range | Range | Range |
| 72.46 | 72.67 | 72.87 | 0.61 | 1.14 | 0.52 |

TABLE 14

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 41.47 | 40.40 | 39.70 | 1.07 | 1.77 | 0.70 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 35.97 | 36.39 | 36.65 | −0.42 | −0.68 | −0.26 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 45.28 | 44.66 | 44.24 | 0.62 | 1.04 | 0.41 |
| Range | Range | Range | Range | Range | Range |
| 9.31 | 8.27 | 7.59 | 1.49 | 2.45 | 0.96 |

TABLE 15

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 12.24 | 12.07 | 11.97 | 0.18 | 0.28 | 0.10 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 7.58 | 7.74 | 7.83 | −0.16 | −0.25 | −0.09 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 15.60 | 15.39 | 15.25 | 0.20 | 0.35 | 0.15 |

TABLE 15-continued

| Range | Range | Range | Range | Range | Range |
|---|---|---|---|---|---|
| 8.02 | 7.65 | 7.42 | 0.37 | 0.60 | 0.24 |

TABLE 16

| | Transmittance [%] | | |
|---|---|---|---|
| Wavelength [nm] | Incident angle $\theta = 0°$ | Incident angle $\theta = 30°$ | Incident angle $\theta = 40°$ |
| 350 | 0.0 | 0.0 | 0.0 |
| 380 | 0.0 | 0.0 | 0.0 |
| 390 | 0.1 | 0.1 | 0.1 |
| 400 | 8.3 | 7.3 | 6.5 |
| 410 | 40.0 | 38.2 | 36.5 |
| 420 | 63.5 | 62.5 | 61.0 |
| 430 | 74.2 | 73.9 | 72.8 |
| 440 | 78.9 | 78.9 | 78.0 |
| 450 | 82.2 | 82.5 | 81.5 |
| 460 | 85.6 | 86.0 | 85.1 |
| 470 | 87.8 | 88.2 | 87.2 |
| 480 | 89.7 | 90.0 | 89.0 |
| 490 | 91.7 | 92.0 | 90.9 |
| 500 | 91.4 | 91.5 | 90.3 |
| 510 | 92.9 | 93.0 | 91.7 |
| 520 | 92.4 | 92.4 | 91.1 |
| 530 | 93.1 | 93.1 | 91.7 |
| 540 | 92.4 | 92.2 | 90.8 |
| 550 | 92.5 | 92.3 | 90.9 |
| 560 | 90.3 | 90.0 | 88.6 |
| 570 | 89.7 | 89.3 | 87.9 |
| 580 | 85.6 | 85.0 | 83.6 |
| 590 | 81.6 | 80.9 | 79.4 |
| 600 | 74.5 | 73.5 | 72.0 |
| 610 | 65.3 | 63.9 | 62.2 |
| 620 | 54.7 | 53.1 | 51.3 |
| 630 | 41.9 | 40.1 | 38.3 |
| 640 | 30.0 | 28.1 | 26.5 |
| 650 | 20.2 | 18.5 | 17.1 |
| 660 | 11.8 | 10.5 | 9.5 |
| 670 | 5.8 | 4.9 | 4.3 |
| 680 | 2.1 | 1.7 | 1.4 |
| 690 | 0.6 | 0.4 | 0.3 |
| 700 | 0.1 | 0.1 | 0.1 |
| 710 | 0.1 | 0.0 | 0.0 |
| 715 | 0.1 | 0.1 | 0.0 |
| 730 | 0.1 | 0.1 | 0.0 |
| 740 | 0.1 | 0.0 | 0.0 |
| 750 | 0.0 | 0.0 | 0.0 |
| 760 | 0.0 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.0 | 0.0 | 0.0 |
| 940 | 0.0 | 0.0 | 0.0 |
| 960 | 0.0 | 0.0 | 0.0 |
| 980 | 0.0 | 0.0 | 0.0 |
| 1000 | 0.1 | 0.0 | 0.0 |
| 1020 | 0.1 | 0.1 | 0.0 |
| 1040 | 0.1 | 0.1 | 0.1 |
| 1060 | 0.2 | 0.1 | 0.1 |
| 1080 | 0.3 | 0.2 | 0.2 |
| 1100 | 0.6 | 0.4 | 0.3 |
| 1120 | 0.9 | 0.7 | 0.6 |
| 1140 | 1.5 | 1.1 | 0.9 |
| 1160 | 2.3 | 1.8 | 1.5 |
| 1180 | 3.5 | 2.9 | 2.5 |
| 1200 | 5.2 | 4.3 | 3.7 |

TABLE 17

| Incident angle $\theta$ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 2.2 | 89.4 | 624 | 413 | 210 |
| 30° | 0.5 or less | 0.5 or less | 1.8 | 89.0 | 622 | 414 | 208 |
| 40° | 0.5 or less | 0.5 or less | 1.5 | 87.7 | 621 | 415 | 206 |

TABLE 18

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 34.74 | 35.50 | 36.05 | −0.76 | −1.31 | −0.54 |

| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
|---|---|---|---|---|---|
| 9.21 | 9.56 | 9.73 | −0.35 | −0.52 | −0.17 |

| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
|---|---|---|---|---|---|
| −41.81 | −41.12 | −40.68 | −0.68 | −1.12 | −0.44 |

| Range | Range | Range | Range | Range | Range |
|---|---|---|---|---|---|
| 76.55 | 76.63 | 76.73 | 0.42 | 0.79 | 0.37 |

TABLE 19

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 37.94 | 38.73 | 39.32 | −0.79 | −1.38 | −0.59 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 37.90 | 38.38 | 38.67 | −0.48 | −0.77 | −0.29 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 45.67 | 45.16 | 44.84 | 0.51 | 0.83 | 0.32 |
| Range | Range | Range | Range | Range | Range |
| 7.77 | 6.78 | 6.17 | 1.30 | 2.21 | 0.91 |

TABLE 20

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 11.51 | 11.46 | 11.45 | 0.05 | 0.05 | 0.01 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 8.38 | 8.58 | 8.70 | −0.20 | −0.32 | −0.12 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 16.55 | 16.42 | 16.33 | 0.13 | 0.22 | 0.09 |
| Range | Range | Range | Range | Range | Range |
| 8.17 | 7.84 | 7.63 | 0.33 | 0.55 | 0.21 |

TABLE 21

| | Transmittance [%] | | |
|---|---|---|---|
| Wavelength [nm] | Incident angle $\theta = 0°$ | Incident angle $\theta = 30°$ | Incident angle $\theta = 40°$ |
| 350 | 0.0 | 0.0 | 0.0 |
| 380 | 0.0 | 0.0 | 0.0 |
| 390 | 0.1 | 0.1 | 0.1 |
| 400 | 9.1 | 8.0 | 7.2 |
| 410 | 44.6 | 42.8 | 41.1 |
| 420 | 70.8 | 70.0 | 68.7 |
| 430 | 81.1 | 81.2 | 80.3 |
| 440 | 85.1 | 85.6 | 84.8 |
| 450 | 88.1 | 88.7 | 88.0 |
| 460 | 89.9 | 90.6 | 89.8 |
| 470 | 90.8 | 91.3 | 90.5 |
| 480 | 92.2 | 92.7 | 91.7 |
| 490 | 93.9 | 94.3 | 93.3 |
| 500 | 93.3 | 93.6 | 92.4 |
| 510 | 94.8 | 95.0 | 93.8 |
| 520 | 94.4 | 94.5 | 93.3 |
| 530 | 94.9 | 95.0 | 93.7 |
| 540 | 94.1 | 94.1 | 92.7 |
| 550 | 94.6 | 94.5 | 93.2 |
| 560 | 92.8 | 92.6 | 91.2 |
| 570 | 92.4 | 92.2 | 90.9 |
| 580 | 89.0 | 88.6 | 87.3 |
| 590 | 86.0 | 85.5 | 84.1 |
| 600 | 80.1 | 79.4 | 77.9 |
| 610 | 72.0 | 71.0 | 69.4 |
| 620 | 63.1 | 61.7 | 60.0 |
| 630 | 51.4 | 49.8 | 48.0 |
| 640 | 39.3 | 37.4 | 35.7 |
| 650 | 27.9 | 26.1 | 24.5 |
| 660 | 18.0 | 16.4 | 15.1 |
| 670 | 10.7 | 9.4 | 8.5 |
| 680 | 5.9 | 5.0 | 4.4 |
| 690 | 3.1 | 2.5 | 2.2 |
| 700 | 1.5 | 1.2 | 1.0 |
| 710 | 0.8 | 0.6 | 0.5 |
| 715 | 0.5 | 0.4 | 0.3 |
| 730 | 0.2 | 0.1 | 0.1 |
| 740 | 0.1 | 0.1 | 0.1 |
| 750 | 0.1 | 0.0 | 0.0 |
| 760 | 0.1 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.1 | 0.0 | 0.0 |
| 940 | 0.1 | 0.1 | 0.1 |
| 960 | 0.2 | 0.2 | 0.1 |
| 980 | 0.4 | 0.3 | 0.2 |
| 1000 | 0.6 | 0.4 | 0.3 |
| 1020 | 0.9 | 0.7 | 0.5 |
| 1040 | 1.4 | 1.1 | 0.9 |
| 1060 | 2.4 | 1.9 | 1.5 |
| 1080 | 4.1 | 3.3 | 2.8 |
| 1100 | 6.7 | 5.6 | 4.8 |
| 1120 | 10.2 | 8.8 | 7.8 |
| 1140 | 14.6 | 12.8 | 11.6 |
| 1160 | 19.8 | 17.8 | 16.3 |
| 1180 | 24.9 | 22.8 | 21.2 |
| 1200 | 30.0 | 27.9 | 26.2 |

TABLE 22

| Incident angle $\theta$ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 17.5 | 92.0 | 631 | 412 | 219 |
| 30° | 0.5 or less | 0.5 or less | 15.8 | 91.9 | 630 | 412 | 218 |
| 40° | 0.5 or less | 0.5 or less | 14.4 | 90.5 | 629 | 413 | 216 |

TABLE 23

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 30.95 | 31.85 | 32.49 | −0.90 | −1.54 | −0.64 |
| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
| 7.03 | 7.35 | 7.49 | −0.32 | −0.46 | −0.14 |
| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
| −42.29 | −41.56 | −41.10 | −0.72 | −1.18 | −0.46 |
| Range | Range | Range | Range | Range | Range |
| 73.24 | 73.41 | 73.60 | 0.58 | 1.08 | 0.50 |

TABLE 24

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 40.01 | 39.02 | 38.35 | 0.99 | 1.65 | 0.66 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 36.53 | 37.00 | 37.30 | −0.47 | −0.76 | −0.29 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 44.95 | 44.32 | 43.92 | 0.62 | 1.03 | 0.40 |
| Range | Range | Range | Range | Range | Range |
| 8.41 | 7.32 | 6.63 | 1.46 | 2.42 | 0.96 |

TABLE 25

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 12.00 | 11.85 | 11.78 | 0.15 | 0.22 | 0.08 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 7.79 | 7.97 | 8.06 | −0.17 | −0.27 | −0.10 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 15.52 | 15.32 | 15.17 | 0.20 | 0.35 | 0.15 |
| Range | Range | Range | Range | Range | Range |
| 7.73 | 7.35 | 7.11 | 0.38 | 0.62 | 0.24 |

TABLE 26

| Wavelength [nm] | Transmittance [%] | | |
|---|---|---|---|
| | Incident angle $\theta = 0°$ | Incident angle $\theta = 30°$ | Incident angle $\theta = 40°$ |
| 350 | 0.0 | 0.0 | 0.0 |
| 380 | 0.0 | 0.0 | 0.0 |
| 390 | 0.0 | 0.0 | 0.0 |
| 400 | 0.7 | 5.8 | 7.0 |
| 410 | 23.0 | 41.7 | 40.0 |
| 420 | 69.6 | 68.7 | 69.4 |
| 430 | 78.5 | 82.4 | 80.6 |
| 440 | 84.8 | 86.4 | 85.2 |
| 450 | 88.9 | 89.2 | 88.8 |
| 460 | 89.7 | 91.4 | 90.3 |
| 470 | 90.2 | 92.0 | 91.0 |
| 480 | 91.6 | 93.3 | 92.5 |
| 490 | 93.5 | 95.3 | 93.6 |
| 500 | 93.1 | 94.7 | 91.8 |
| 510 | 94.4 | 96.0 | 92.9 |
| 520 | 93.3 | 95.7 | 92.8 |
| 530 | 93.1 | 96.3 | 93.9 |
| 540 | 92.4 | 95.5 | 93.6 |
| 550 | 93.3 | 95.8 | 94.6 |
| 560 | 92.0 | 94.0 | 92.8 |
| 570 | 91.9 | 93.8 | 92.3 |
| 580 | 89.0 | 90.4 | 88.3 |
| 590 | 86.5 | 87.0 | 84.7 |
| 600 | 81.1 | 80.6 | 78.6 |
| 610 | 73.2 | 71.9 | 70.5 |
| 620 | 64.1 | 62.8 | 61.6 |
| 630 | 52.3 | 51.3 | 49.9 |
| 640 | 40.2 | 39.2 | 37.4 |
| 650 | 29.0 | 27.8 | 25.9 |
| 660 | 19.0 | 17.7 | 16.1 |
| 670 | 11.6 | 10.4 | 9.2 |
| 680 | 6.6 | 5.6 | 4.9 |
| 690 | 3.5 | 2.9 | 2.5 |
| 700 | 1.8 | 1.4 | 1.2 |
| 710 | 0.9 | 0.7 | 0.6 |
| 715 | 0.6 | 0.5 | 0.4 |
| 730 | 0.3 | 0.2 | 0.1 |
| 740 | 0.2 | 0.1 | 0.1 |
| 750 | 0.1 | 0.1 | 0.0 |
| 760 | 0.1 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.0 | 0.0 | 0.0 |
| 940 | 0.0 | 0.0 | 0.0 |
| 960 | 0.0 | 0.0 | 0.0 |
| 980 | 0.0 | 0.0 | 0.0 |
| 1000 | 0.1 | 0.0 | 0.0 |
| 1020 | 0.1 | 0.0 | 0.0 |
| 1040 | 0.1 | 0.1 | 0.1 |
| 1060 | 0.1 | 0.1 | 0.1 |
| 1080 | 0.2 | 0.2 | 0.3 |
| 1100 | 0.4 | 0.4 | 0.6 |
| 1120 | 0.6 | 0.8 | 1.2 |
| 1140 | 1.0 | 1.4 | 2.3 |
| 1160 | 1.5 | 2.4 | 4.2 |
| 1180 | 2.3 | 4.0 | 7.4 |
| 1200 | 3.3 | 6.6 | 12.4 |

TABLE 27

| Incident angle θ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 1.4 | 91.3 | 632 | 414 | 218 |
| 30° | 0.5 or less | 0.5 or less | 2.4 | 93.3 | 631 | 413 | 218 |
| 40° | 0.5 or less | 0.5 or less | 4.2 | 91.1 | 630 | 413 | 217 |

TABLE 28

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 31.19 | 31.23 | 31.59 | −0.04 | −0.40 | −0.36 |
| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
| 5.74 | 7.34 | 6.93 | −1.6 | −1.19 | 0.41 |
| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
| −40.05 | −41.37 | −41.01 | 1.32 | 0.97 | −0.35 |
| Range | Range | Range | Range | Range | Range |
| 71.24 | 72.60 | 72.61 | 2.92 | 2.16 | 0.77 |

TABLE 29

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 41.06 | 39.69 | 39.02 | 1.37 | 2.03 | 0.67 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 36.05 | 36.62 | 36.48 | −0.57 | −0.43 | 0.15 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 44.25 | 44.24 | 43.84 | 0.01 | 0.42 | 0.40 |
| Range | Range | Range | Range | Range | Range |
| 8.20 | 7.61 | 7.36 | 1.94 | 2.46 | 0.52 |

TABLE 30

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 12.25 | 11.89 | 11.77 | 0.36 | 0.48 | 0.12 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 7.65 | 7.85 | 7.77 | −0.20 | −0.12 | 0.08 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 15.24 | 15.30 | 15.03 | −0.06 | 0.21 | 0.27 |
| Range | Range | Range | Range | Range | Range |
| 7.59 | 7.45 | 7.26 | 0.56 | 0.59 | 0.19 |

TABLE 31

| Wavelength [nm] | Transmittance [%] | | |
|---|---|---|---|
| | Incident angle θ = 0° | Incident angle θ = 30° | Incident angle θ = 40° |
| 350 | 0.0 | 0.0 | 0.0 |
| 380 | 0.0 | 0.0 | 0.0 |
| 390 | 0.0 | 0.0 | 0.0 |
| 400 | 0.7 | 5.4 | 6.4 |
| 410 | 21.0 | 37.9 | 36.3 |
| 420 | 63.7 | 62.6 | 62.9 |
| 430 | 73.3 | 76.6 | 74.6 |
| 440 | 80.1 | 81.2 | 79.9 |
| 450 | 84.5 | 84.6 | 84.0 |
| 460 | 87.1 | 88.5 | 87.3 |
| 470 | 88.9 | 90.5 | 89.4 |
| 480 | 90.7 | 92.3 | 91.4 |
| 490 | 92.6 | 94.4 | 92.7 |
| 500 | 92.5 | 94.0 | 91.2 |
| 510 | 93.7 | 95.2 | 92.1 |
| 520 | 92.4 | 94.8 | 91.8 |
| 530 | 92.4 | 95.5 | 93.0 |
| 540 | 91.5 | 94.6 | 92.7 |
| 550 | 92.0 | 94.4 | 93.1 |
| 560 | 90.3 | 92.2 | 91.0 |
| 570 | 89.9 | 91.7 | 90.1 |
| 580 | 86.3 | 87.5 | 85.3 |
| 590 | 82.8 | 83.2 | 80.8 |
| 600 | 76.2 | 75.4 | 73.3 |
| 610 | 67.0 | 65.5 | 63.9 |
| 620 | 56.2 | 54.7 | 53.3 |
| 630 | 43.1 | 41.7 | 40.3 |
| 640 | 31.0 | 29.8 | 28.1 |
| 650 | 21.2 | 20.0 | 18.4 |
| 660 | 12.8 | 11.6 | 10.4 |
| 670 | 6.4 | 5.5 | 4.8 |
| 680 | 2.5 | 2.0 | 1.7 |
| 690 | 0.7 | 0.5 | 0.4 |
| 700 | 0.2 | 0.1 | 0.1 |
| 710 | 0.1 | 0.1 | 0.0 |
| 715 | 0.1 | 0.1 | 0.1 |
| 730 | 0.2 | 0.1 | 0.1 |
| 740 | 0.1 | 0.1 | 0.1 |
| 750 | 0.1 | 0.1 | 0.0 |
| 760 | 0.1 | 0.0 | 0.0 |
| 770 | 0.1 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.0 | 0.0 | 0.0 |
| 940 | 0.0 | 0.0 | 0.0 |
| 960 | 0.0 | 0.0 | 0.0 |
| 980 | 0.0 | 0.0 | 0.0 |
| 1000 | 0.1 | 0.0 | 0.0 |
| 1020 | 0.1 | 0.0 | 0.0 |
| 1040 | 0.1 | 0.1 | 0.1 |
| 1060 | 0.1 | 0.1 | 0.1 |
| 1080 | 0.2 | 0.2 | 0.3 |
| 1100 | 0.4 | 0.4 | 0.6 |

TABLE 31-continued

| Wavelength [nm] | Transmittance [%] | | |
|---|---|---|---|
| | Incident angle $\theta = 0°$ | Incident angle $\theta = 30°$ | Incident angle $\theta = 40°$ |
| 1120 | 0.6 | 0.8 | 1.2 |
| 1140 | 1.0 | 1.4 | 2.3 |
| 1160 | 1.5 | 2.5 | 4.3 |
| 1180 | 2.3 | 4.1 | 7.5 |
| 1200 | 3.4 | 6.7 | 12.6 |

TABLE 32

| Incident angle $\theta$ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 1.5 | 89.6 | 625 | 415 | 210 |
| 30° | 0.5 or less | 0.5 or less | 2.4 | 91.4 | 624 | 414 | 210 |
| 40° | 0.5 or less | 0.5 or less | 4.3 | 89.2 | 623 | 414 | 209 |

TABLE 33

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 35.06 | 34.99 | 35.28 | 0.07 | −0.22 | −0.29 |

| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
|---|---|---|---|---|---|
| 7.99 | 9.57 | 9.21 | −1.58 | −1.23 | 0.36 |

| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
|---|---|---|---|---|---|
| −39.38 | −40.64 | −40.28 | 1.26 | 0.90 | −0.36 |
| Range | Range | Range | Range | Range | Range |
| 74.45 | 75.63 | 75.56 | 2.84 | 2.13 | 0.72 |

TABLE 34

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 38.43 | 38.22 | 38.50 | 0.21 | −0.08 | −0.28 |

| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
|---|---|---|---|---|---|
| 37.71 | 38.29 | 38.17 | −0.58 | −0.46 | 0.12 |

| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
|---|---|---|---|---|---|
| 44.88 | 44.78 | 44.43 | 0.10 | 0.45 | 0.35 |
| Range | Range | Range | Range | Range | Range |
| 7.17 | 6.56 | 6.26 | 0.78 | 0.91 | 0.64 |

TABLE 35

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 11.71 | 11.42 | 11.35 | 0.29 | 0.37 | 0.08 |

| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
|---|---|---|---|---|---|
| 8.32 | 8.56 | 8.50 | −0.24 | −0.18 | 0.06 |

TABLE 35-continued

| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
|---|---|---|---|---|---|
| 16.13 | 16.23 | 15.98 | −0.09 | 0.15 | 0.25 |
| Range | Range | Range | Range | Range | Range |
| 7.82 | 7.67 | 7.48 | 0.52 | 0.54 | 0.19 |

TABLE 36

| Wavelength [nm] | Transmittance [%] | | |
|---|---|---|---|
| | Incident angle $\theta = 0°$ | Incident angle $\theta = 30°$ | Incident angle $\theta = 40°$ |
| 350 | 0.0 | 0.0 | 0.0 |
| 380 | 1.1 | 1.0 | 0.8 |
| 390 | 16.4 | 15.3 | 14.2 |
| 400 | 44.9 | 43.4 | 41.6 |
| 410 | 63.7 | 62.5 | 60.9 |
| 420 | 71.9 | 71.2 | 69.9 |
| 430 | 76.2 | 76.0 | 74.9 |
| 440 | 79.0 | 79.0 | 78.1 |
| 450 | 81.5 | 81.7 | 80.8 |
| 460 | 83.2 | 83.5 | 82.5 |
| 470 | 85.9 | 86.1 | 85.1 |
| 480 | 88.0 | 88.3 | 87.2 |
| 490 | 89.9 | 90.1 | 88.9 |
| 500 | 90.8 | 90.9 | 89.7 |
| 510 | 91.5 | 91.5 | 90.2 |
| 520 | 92.5 | 92.5 | 91.2 |
| 530 | 92.2 | 92.1 | 90.7 |
| 540 | 92.3 | 92.1 | 90.7 |
| 550 | 91.9 | 91.7 | 90.2 |
| 560 | 90.3 | 90.0 | 88.5 |
| 570 | 87.8 | 87.3 | 85.8 |
| 580 | 83.6 | 82.9 | 81.4 |
| 590 | 77.1 | 76.1 | 74.5 |
| 600 | 67.8 | 66.5 | 64.8 |
| 610 | 56.3 | 54.7 | 52.9 |
| 620 | 43.0 | 41.1 | 39.3 |
| 630 | 29.8 | 27.9 | 26.3 |
| 640 | 18.1 | 16.4 | 15.2 |
| 650 | 9.4 | 8.2 | 7.4 |
| 660 | 4.2 | 3.5 | 3.0 |

TABLE 36-continued

| Wavelength [nm] | Transmittance [%] | | |
|---|---|---|---|
| | Incident angle $\theta = 0°$ | Incident angle $\theta = 30°$ | Incident angle $\theta = 40°$ |
| 670 | 1.6 | 1.3 | 1.0 |
| 680 | 0.5 | 0.4 | 0.3 |
| 690 | 0.1 | 0.1 | 0.1 |
| 700 | 0.0 | 0.0 | 0.0 |
| 710 | 0.0 | 0.0 | 0.0 |
| 715 | 0.0 | 0.0 | 0.0 |
| 730 | 0.0 | 0.0 | 0.0 |
| 740 | 0.0 | 0.0 | 0.0 |
| 750 | 0.0 | 0.0 | 0.0 |
| 760 | 0.0 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.0 |
| 880 | 0.0 | 0.0 | 0.0 |
| 900 | 0.0 | 0.0 | 0.0 |
| 920 | 0.0 | 0.0 | 0.0 |
| 940 | 0.0 | 0.0 | 0.0 |
| 960 | 0.0 | 0.0 | 0.0 |
| 980 | 0.0 | 0.0 | 0.0 |
| 1000 | 0.0 | 0.0 | 0.0 |
| 1020 | 0.0 | 0.0 | 0.0 |
| 1040 | 0.0 | 0.0 | 0.0 |
| 1060 | 0.0 | 0.0 | 0.0 |
| 1080 | 0.0 | 0.0 | 0.0 |
| 1100 | 0.0 | 0.0 | 0.0 |
| 1120 | 0.0 | 0.0 | 0.0 |
| 1140 | 0.1 | 0.0 | 0.0 |
| 1160 | 0.2 | 0.1 | 0.1 |
| 1180 | 0.4 | 0.3 | 0.2 |
| 1200 | 0.7 | 0.5 | 0.4 |

TABLE 37

| Incident angle $\theta$ | Average transmittance in 700 to 800 nm [%] | Average transmittance in 700 to 1000 nm [%] | Average transmittance in 1100 to 1200 nm [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 0.5 or less | 87.8 | 615 | 402 | 213 |
| 30° | 0.5 or less | 0.5 or less | 0.5 or less | 87.5 | 614 | 403 | 211 |
| 40° | 0.5 or less | 0.5 or less | 0.5 or less | 86.1 | 612 | 404 | 208 |

TABLE 38

| $IE_0{}^{xR}$ | $IE_{30}{}^{xR}$ | $IE_{40}{}^{xR}$ | $IE_0{}^{xR} - IE_{30}{}^{xR}$ | $IE_0{}^{xR} - IE_{40}{}^{xR}$ | $IAE_{30}{}^{xR} - IE_{40}{}^{xR}$ |
|---|---|---|---|---|---|
| 38.46 | 38.95 | 39.31 | −0.50 | −0.85 | −0.35 |
| $IE_0{}^{yG}$ | $IE_{30}{}^{yG}$ | $IE_{40}{}^{yG}$ | $IE_0{}^{yG} - IE_{30}{}^{yG}$ | $IE_0{}^{yG} - IE_{40}{}^{yG}$ | $IE_{30}{}^{yG} - IE_{40}{}^{yG}$ |
| 10.72 | 11.06 | 11.23 | −0.34 | −0.51 | −0.17 |
| $IE_0{}^{zB}$ | $IE_{30}{}^{zB}$ | $IE_{40}{}^{zB}$ | $IE_0{}^{zB} - IE_{30}{}^{zB}$ | $IE_0{}^{zB} - IE_{40}{}^{zB}$ | $IE_{30}{}^{zB} - IE_{40}{}^{zB}$ |
| −46.81 | −46.25 | −45.93 | −0.56 | −0.88 | −0.32 |
| Range | Range | Range | Range | Range | Range |
| 85.27 | 85.21 | 85.24 | 0.22 | 0.37 | 0.18 |

TABLE 39

| $IAE_0{}^{xR}$ | $IAE_{30}{}^{xR}$ | $IAE_{40}{}^{xR}$ | $IAE_0{}^{xR} - IAE_{30}{}^{xR}$ | $IAE_0{}^{xR} - IAE_{40}{}^{xR}$ | $IE_{30}{}^{xR} - IAE_{40}{}^{xR}$ |
|---|---|---|---|---|---|
| 43.02 | 43.63 | 44.04 | −0.61 | −1.02 | −0.42 |
| $IAE_0{}^{yG}$ | $IAE_{30}{}^{yG}$ | $IAE_{40}{}^{yG}$ | $IAE_0{}^{yG} - IAE_{30}{}^{yG}$ | $IAE_0{}^{yG} - IAE_{40}{}^{yG}$ | $IAE_{30}{}^{yG} - IAE_{40}{}^{yG}$ |
| 40.31 | 40.80 | 41.10 | −0.48 | −0.78 | −0.30 |
| $IAE_0{}^{zB}$ | $IAE_{30}{}^{zB}$ | $IAE_{40}{}^{zB}$ | $IAE_0{}^{zB} - IAE_{30}{}^{zB}$ | $IAE_0{}^{zB} - IAE_{40}{}^{zB}$ | $IAE_{30}{}^{zB} - IAE_{40}{}^{zB}$ |
| 49.56 | 49.11 | 48.82 | 0.45 | 0.74 | 0.29 |
| Range | Range | Range | Range | Range | Range |
| 9.25 | 8.32 | 7.73 | 1.05 | 1.76 | 0.71 |

TABLE 40

| $ISE_0{}^{xR}$ | $ISE_{30}{}^{xR}$ | $ISE_{40}{}^{xR}$ | $ISE_0{}^{xR} - ISE_{30}{}^{xR}$ | $ISE_0{}^{xR} - ISE_{40}{}^{xR}$ | $ISE_{30}{}^{xR} - ISE_{40}{}^{xR}$ |
|---|---|---|---|---|---|
| 11.55 | 11.63 | 11.71 | −0.08 | −0.16 | −0.08 |
| $ISE_0{}^{yG}$ | $ISE_{30}{}^{yG}$ | $ISE_{40}{}^{yG}$ | $ISE_0{}^{yG} - ISE_{30}{}^{yG}$ | $ISE_0{}^{yG} - ISE_{40}{}^{yG}$ | $ISE_{30}{}^{yG} - ISE_{40}{}^{yG}$ |
| 9.29 | 9.53 | 9.68 | −0.24 | −0.39 | −0.15 |
| $ISE_0{}^{zB}$ | $ISE_{30}{}^{zB}$ | $ISE_{40}{}^{zB}$ | $ISE_0{}^{zB} - ISE_{30}{}^{zB}$ | $ISE_0{}^{zB} - ISE_{40}{}^{zB}$ | $ISE_{30}{}^{zB} - ISE_{40}{}^{zB}$ |
| 18.21 | 18.01 | 17.88 | 0.20 | 0.33 | 0.13 |
| Range | Range | Range | Range | Range | Range |
| 8.92 | 8.48 | 8.21 | 0.44 | 0.71 | 0.27 |

TABLE 41

| Wavelength [nm] | Transmittance [%] | | |
|---|---|---|---|
| | Incident angle $\theta = 0°$ | Incident angle $\theta = 30°$ | Incident angle $\theta = 40°$ |
| 350 | 2.4 | 0.3 | 0.3 |
| 380 | 0.3 | 1.6 | 11.8 |
| 390 | 0.9 | 8.0 | 67.3 |
| 400 | 2.7 | 68.8 | 79.4 |
| 410 | 43.3 | 81.2 | 64.9 |
| 420 | 81.8 | 79.2 | 63.5 |
| 430 | 81.4 | 81.1 | 81.1 |

TABLE 41-continued

| Wavelength [nm] | Transmittance [%] | | |
|---|---|---|---|
| | Incident angle θ = 0° | Incident angle θ = 30° | Incident angle θ = 40° |
| 440 | 82.4 | 86.1 | 83.2 |
| 450 | 88.4 | 89.4 | 84.5 |
| 460 | 91.5 | 91.5 | 91.1 |
| 470 | 93.2 | 95.0 | 91.4 |
| 480 | 95.2 | 96.1 | 93.1 |
| 490 | 93.8 | 96.2 | 93.0 |
| 500 | 95.3 | 96.8 | 89.8 |
| 510 | 95.7 | 96.5 | 90.9 |
| 520 | 93.5 | 95.4 | 94.1 |
| 530 | 92.9 | 95.7 | 92.7 |
| 540 | 92.5 | 95.7 | 91.7 |
| 550 | 91.7 | 93.7 | 92.5 |
| 560 | 91.5 | 92.2 | 91.7 |
| 570 | 90.6 | 90.9 | 88.8 |
| 580 | 88.4 | 88.4 | 86.2 |
| 590 | 85.7 | 84.9 | 84.0 |
| 600 | 81.7 | 80.8 | 79.8 |
| 610 | 75.8 | 75.1 | 73.3 |
| 620 | 68.0 | 67.1 | 65.3 |
| 630 | 59.3 | 57.9 | 56.1 |
| 640 | 51.1 | 49.4 | 44.9 |
| 650 | 43.4 | 41.5 | 29.2 |
| 660 | 34.4 | 32.0 | 16.7 |
| 670 | 23.0 | 17.9 | 6.3 |
| 680 | 11.7 | 5.6 | 1.2 |
| 690 | 4.8 | 1.0 | 0.2 |
| 700 | 1.9 | 0.1 | 0.0 |
| 710 | 1.0 | 0.1 | 0.0 |
| 715 | 0.9 | 0.1 | 0.0 |
| 730 | 0.8 | 0.1 | 0.0 |
| 740 | 0.5 | 0.1 | 0.0 |
| 750 | 0.2 | 0.1 | 0.0 |
| 760 | 0.1 | 0.0 | 0.0 |
| 770 | 0.1 | 0.0 | 0.0 |
| 780 | 0.1 | 0.0 | 0.0 |
| 790 | 0.1 | 0.0 | 0.1 |
| 800 | 0.1 | 0.1 | 0.1 |
| 820 | 0.1 | 0.1 | 0.2 |
| 840 | 0.1 | 0.1 | 0.3 |
| 860 | 0.1 | 0.2 | 0.6 |
| 880 | 0.1 | 0.3 | 0.9 |
| 900 | 0.2 | 0.5 | 0.7 |
| 920 | 0.3 | 0.5 | 0.5 |
| 940 | 0.4 | 0.4 | 0.4 |
| 960 | 0.4 | 0.3 | 0.4 |
| 980 | 0.4 | 0.3 | 0.4 |
| 1000 | 0.3 | 0.3 | 0.5 |
| 1020 | 0.2 | 0.3 | 0.6 |
| 1040 | 0.2 | 0.4 | 0.9 |
| 1060 | 0.2 | 0.5 | 1.5 |
| 1080 | 0.3 | 0.7 | 2.7 |
| 1100 | 0.4 | 1.2 | 5.4 |
| 1120 | 0.5 | 2.1 | 11.4 |
| 1140 | 0.7 | 4.1 | 21.5 |
| 1160 | 1.2 | 8.8 | 30.3 |
| 1180 | 2.1 | 18.9 | 36.3 |
| 1200 | 4.1 | 32.6 | 45.5 |

TABLE 42

| Incident angle θ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 1.3 | 91.1 | 641 | 411 | 230 |
| 30° | 0.5 or less | 0.5 or less | 10.0 | 92.2 | 639 | 398 | 241 |
| 40° | 0.5 or less | 0.5 or less | 24.9 | 89.7 | 636 | 387 | 249 |

TABLE 43

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 23.72 | 24.38 | 30.14 | −0.66 | −6.42 | −5.76 |
| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
| 3.62 | 5.38 | 6.19 | −1.76 | −2.56 | −0.81 |
| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
| −42.31 | −47.65 | −43.42 | 5.34 | 1.11 | −4.23 |
| Range | Range | Range | Range | Range | Range |
| 66.03 | 72.04 | 73.56 | 7.10 | 7.53 | 4.95 |

TABLE 44

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 48.43 | 46.69 | 42.46 | 1.74 | 5.97 | 4.23 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 36.52 | 37.68 | 37.17 | −1.16 | −0.65 | 0.51 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 47.07 | 51.13 | 47.77 | −4.06 | −0.70 | 3.36 |
| Range | Range | Range | Range | Range | Range |
| 11.91 | 13.45 | 10.60 | 5.80 | 6.67 | 3.72 |

TABLE 45

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 14.05 | 13.5 | 12.56 | 0.55 | 1.49 | 0.94 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 7.83 | 8.17 | 7.72 | −0.34 | 0.11 | 0.45 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 15.9 | 18.04 | 16.20 | −2.14 | −0.30 | 1.84 |

TABLE 45-continued

| Range | Range | Range | Range | Range | Range |
|---|---|---|---|---|---|
| 8.07 | 9.88 | 8.48 | 2.69 | 1.79 | 1.39 |

TABLE 46

| | Transmittance [%] | | |
|---|---|---|---|
| Wavelength [nm] | Incident angle $\theta = 0°$ | Incident angle $\theta = 30°$ | Incident angle $\theta = 40°$ |
| 350 | 0.0 | 0.0 | 0.0 |
| 380 | 0.0 | 0.0 | 0.0 |
| 390 | 0.0 | 0.0 | 0.2 |
| 400 | 0.0 | 9.6 | 10.1 |
| 410 | 16.1 | 47.0 | 36.7 |
| 420 | 67.6 | 69.3 | 55.2 |
| 430 | 79.9 | 78.7 | 78.6 |
| 440 | 84.8 | 84.9 | 82.0 |
| 450 | 86.6 | 88.2 | 83.3 |
| 460 | 90.9 | 90.4 | 89.9 |
| 470 | 91.7 | 92.7 | 89.2 |
| 480 | 91.9 | 93.7 | 90.7 |
| 490 | 95.0 | 94.3 | 91.2 |
| 500 | 93.3 | 94.0 | 87.1 |
| 510 | 94.2 | 94.8 | 89.2 |
| 520 | 93.7 | 92.7 | 91.4 |
| 530 | 94.6 | 93.8 | 90.9 |
| 540 | 92.4 | 92.8 | 88.8 |
| 550 | 91.2 | 91.0 | 89.7 |
| 560 | 88.9 | 88.1 | 87.5 |
| 570 | 88.0 | 87.2 | 85.0 |
| 580 | 83.0 | 82.5 | 80.3 |
| 590 | 78.6 | 78.0 | 77.0 |
| 600 | 73.0 | 72.1 | 70.9 |
| 610 | 66.6 | 65.4 | 63.4 |

TABLE 46-continued

| | Transmittance [%] | | |
|---|---|---|---|
| Wavelength [nm] | Incident angle $\theta = 0°$ | Incident angle $\theta = 30°$ | Incident angle $\theta = 40°$ |
| 620 | 59.9 | 58.2 | 56.2 |
| 630 | 50.4 | 48.8 | 47.0 |
| 640 | 42.7 | 40.8 | 36.8 |
| 650 | 35.8 | 34.6 | 24.1 |
| 660 | 28.6 | 26.9 | 13.9 |
| 670 | 20.4 | 15.8 | 5.5 |
| 680 | 11.2 | 5.5 | 1.1 |
| 690 | 4.5 | 0.9 | 0.2 |
| 700 | 1.5 | 0.1 | 0.0 |
| 710 | 0.8 | 0.0 | 0.0 |
| 715 | 0.5 | 0.0 | 0.0 |
| 730 | 0.2 | 0.1 | 0.0 |
| 740 | 0.1 | 0.1 | 0.0 |
| 750 | 0.0 | 0.1 | 0.0 |
| 760 | 0.0 | 0.0 | 0.0 |
| 770 | 0.0 | 0.0 | 0.0 |
| 780 | 0.0 | 0.0 | 0.0 |
| 790 | 0.0 | 0.0 | 0.0 |
| 800 | 0.0 | 0.0 | 0.0 |
| 820 | 0.0 | 0.0 | 0.0 |
| 840 | 0.0 | 0.0 | 0.0 |
| 860 | 0.0 | 0.0 | 0.1 |
| 880 | 0.0 | 0.0 | 0.1 |
| 900 | 0.0 | 0.1 | 0.1 |
| 920 | 0.0 | 0.1 | 0.1 |
| 940 | 0.0 | 0.1 | 0.1 |
| 960 | 0.0 | 0.1 | 0.1 |
| 980 | 0.0 | 0.1 | 0.1 |
| 1000 | 0.0 | 0.1 | 0.1 |
| 1020 | 0.0 | 0.1 | 0.1 |
| 1040 | 0.0 | 0.1 | 0.2 |
| 1060 | 0.0 | 0.1 | 0.4 |
| 1080 | 0.0 | 0.2 | 0.7 |
| 1100 | 0.0 | 0.3 | 1.4 |
| 1120 | 0.0 | 0.6 | 3.2 |
| 1140 | 0.0 | 1.3 | 6.7 |
| 1160 | 0.0 | 3.0 | 10.5 |
| 1180 | 0.0 | 7.1 | 13.7 |
| 1200 | 0.4 | 13.4 | 18.7 |

TABLE 47

| Incident angle $\theta$ | Average transmittance in 700 to 800 nm [%] | Average transmittance in 700 to 1000 nm [%] | Average transmittance in 1100 to 1200 [%] | Average transmittance in 500 to 600 nm [%] | IR cut-off wavelength [nm] | UV cut-off wavelength [nm] | Full width at half maximum in transmission region [nm] |
|---|---|---|---|---|---|---|---|
| 0° | 0.5 or less | 0.5 or less | 0.5 or less | 88.8 | 630 | 414 | 216 |
| 30° | 0.5 or less | 0.5 or less | 3.7 | 88.4 | 629 | 411 | 218 |
| 40° | 0.5 or less | 0.5 or less | 8.8 | 85.9 | 627 | 417 | 210 |

TABLE 48

| $IE_0^{xR}$ | $IE_{30}^{xR}$ | $IE_{40}^{xR}$ | $IE_0^{xR} - IE_{30}^{xR}$ | $IE_0^{xR} - IE_{40}^{xR}$ | $IE_{30}^{xR} - IE_{40}^{xR}$ |
|---|---|---|---|---|---|
| 23.85 | 25.43 | 31.01 | −1.58 | −7.16 | −5.58 |

| $IE_0^{yG}$ | $IE_{30}^{yG}$ | $IE_{40}^{yG}$ | $IE_0^{yG} - IE_{30}^{yG}$ | $IE_0^{yG} - IE_{40}^{yG}$ | $IE_{30}^{yG} - IE_{40}^{yG}$ |
|---|---|---|---|---|---|
| 8.99 | 8.61 | 9.44 | 0.38 | −0.46 | −0.83 |

| $IE_0^{zB}$ | $IE_{30}^{zB}$ | $IE_{40}^{zB}$ | $IE_0^{zB} - IE_{30}^{zB}$ | $IE_0^{zB} - IE_{40}^{zB}$ | $IE_{30}^{zB} - IE_{40}^{zB}$ |
|---|---|---|---|---|---|
| −38.72 | −41.69 | −36.96 | 2.96 | −1.76 | −4.73 |

| Range | Range | Range | Range | Range | Range |
|---|---|---|---|---|---|
| 62.57 | 67.12 | 67.97 | 4.55 | 6.70 | 4.75 |

TABLE 49

| $IAE_0^{xR}$ | $IAE_{30}^{xR}$ | $IAE_{40}^{xR}$ | $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|---|---|---|
| 46.03 | 43.42 | 39.55 | 2.61 | 6.48 | 3.87 |
| $IAE_0^{yG}$ | $IAE_{30}^{yG}$ | $IAE_{40}^{yG}$ | $IAE_0^{yG} - IAE_{30}^{yG}$ | $IAE_0^{yG} - IAE_{40}^{yG}$ | $IAE_{30}^{yG} - IAE_{40}^{yG}$ |
| 38.44 | 39.16 | 38.68 | −0.71 | −0.24 | 0.47 |
| $IAE_0^{zB}$ | $IAE_{30}^{zB}$ | $IAE_{40}^{zB}$ | $IAE_0^{zB} - IAE_{30}^{zB}$ | $IAE_0^{zB} - IAE_{40}^{zB}$ | $IAE_{30}^{zB} - IAE_{40}^{zB}$ |
| 44.49 | 44.91 | 41.88 | −0.42 | 2.61 | 3.03 |
| Range | Range | Range | Range | Range | Range |
| 7.59 | 5.76 | 3.20 | 3.32 | 6.72 | 3.40 |

TABLE 50

| $ISE_0^{xR}$ | $ISE_{30}^{xR}$ | $ISE_{40}^{xR}$ | $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|---|---|---|
| 12.82 | 12.37 | 11.61 | 0.46 | 1.21 | 0.75 |
| $ISE_0^{yG}$ | $ISE_{30}^{yG}$ | $ISE_{40}^{yG}$ | $ISE_0^{yG} - ISE_{30}^{yG}$ | $ISE_0^{yG} - ISE_{40}^{yG}$ | $ISE_{30}^{yG} - ISE_{40}^{yG}$ |
| 8.89 | 9.10 | 8.69 | −0.21 | 0.20 | 0.41 |
| $ISE_0^{zB}$ | $ISE_{30}^{zB}$ | $ISE_{40}^{zB}$ | $ISE_0^{zB} - ISE_{30}^{zB}$ | $ISE_0^{zB} - ISE_{40}^{zB}$ | $ISE_{30}^{zB} - ISE_{40}^{zB}$ |
| 15.10 | 15.61 | 13.96 | −0.52 | 1.13 | 1.65 |
| Range | Range | Range | Range | Range | Range |
| 6.21 | 6.51 | 5.27 | 0.97 | 1.01 | 1.24 |

The invention claimed is:

1. An optical filter comprising:
   a first light-absorbing layer that includes a first light absorber comprising a copper ion and a first phosphonic acid with an aryl group and being capable of absorbing light in at least a portion of the near-infrared region, and
   at least one selected from the group consisting of a second light-absorbing layer, an ultraviolet-absorbing layer, and a reflecting film, wherein
   the second light-absorbing layer comprises a copper ion and a second phosphonic acid with an alkyl group,
   the ultraviolet-absorbing layer comprises an ultraviolet-absorber capable of absorbing light in at least a portion of the ultraviolet region,
   the reflecting film comprises a dielectric multilayer film and is capable of reflecting light in at least a portion of the near-infrared region,
   when light with a wavelength of 300 nm to 1200 nm is incident on the optical filter at incident angles of 0°, 30°, and 40°, the optical filter satisfies the following requirements:
   (i) the spectral transmittance at a wavelength of 700 nm is 3% or less;
   (ii) the spectral transmittance at a wavelength of 715 nm is 1% or less;
   (iii) the spectral transmittance at a wavelength of 1100 nm is 7.5% or less;
   (iv) the average transmittance in the wavelength range of 700 nm to 800 nm is 1% or less;
   (v) the average transmittance in the wavelength range of 500 nm to 600 nm is 85% or more;
   (vi) the spectral transmittance at a wavelength of 400 nm is 45% or less; and
   (vii) the spectral transmittance at a wavelength of 450 nm is 80% or more, and
   in the case where the spectral transmittance of the optical filter at a wavelength $\lambda$ and an incident angle $\theta°$ is expressed by $T_\theta(\lambda)$,
   where $R(\lambda)$, $G(\lambda)$, and $B(\lambda)$ are functions of the wavelength $\mu$ and defined by Table (I) in a domain ranging between wavelengths of 400 nm and 700 nm,
   where functions obtained by normalization of three functions being products of $T_\theta(\lambda)$ and $R(\lambda)$, $G(\lambda)$, and $B(\lambda)$ and defined for the incident angle $\theta°$ are expressed by $CR_\theta(\lambda)$, $CG_\theta(\lambda)$, and $CB_\theta(\lambda)$, the normalization being such that a maximum value of each of the three functions is 1,
   where functions of the wavelength $\theta$ obtained by normalization of the CIE 1964 supplementary standard colorimetric observer color-matching functions specified in Table 2 of Japanese Industrial Standards (JIS) Z 8781-1:2012 are expressed by $x(\lambda)$, $y(\lambda)$, and $z(\lambda)$, the normalization being such that a maximum value of each of the color-matching functions is 1, and
   where the wavelength $\lambda$ being a variable of $CR_\theta(\lambda)$, $CG_\theta(\lambda)$, and $CB_\theta(\lambda)$ is expressed by $\lambda(n)=(\Delta\lambda \times n + 400)$ nm$(\Delta\lambda=5)$ as a function of an integer n of 0 or more,
   nine differences each obtained as a difference between one and another of $IE_\theta^{xR}$, $IE_\theta^{yG}$, and $IE_\theta^{zB}$ defined by the following equations (1) to (3) for incident angles $\theta°$ of 0°, 30°, and 40° satisfy requirements shown in Table (II), and
   ranges satisfy requirements shown in Table (II), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$

TABLE (I)

| Wavelength $\lambda$ [nm] | $R(\lambda)$ | $G(\lambda)$ | $B(\lambda)$ |
|---|---|---|---|
| 400 | 0.103 | 0.066 | 0.490 |
| 405 | 0.092 | 0.067 | 0.562 |
| 410 | 0.081 | 0.068 | 0.635 |
| 415 | 0.071 | 0.068 | 0.690 |
| 420 | 0.061 | 0.068 | 0.746 |
| 425 | 0.053 | 0.072 | 0.789 |
| 430 | 0.046 | 0.076 | 0.832 |
| 435 | 0.041 | 0.082 | 0.879 |
| 440 | 0.036 | 0.089 | 0.926 |
| 445 | 0.032 | 0.100 | 0.955 |
| 450 | 0.028 | 0.112 | 0.984 |
| 455 | 0.026 | 0.133 | 0.992 |
| 460 | 0.025 | 0.153 | 1.000 |
| 465 | 0.027 | 0.213 | 0.986 |
| 470 | 0.028 | 0.272 | 0.972 |
| 475 | 0.031 | 0.358 | 0.934 |
| 480 | 0.035 | 0.444 | 0.897 |
| 485 | 0.037 | 0.523 | 0.837 |
| 490 | 0.040 | 0.602 | 0.777 |
| 495 | 0.044 | 0.669 | 0.702 |
| 500 | 0.048 | 0.737 | 0.628 |
| 505 | 0.057 | 0.797 | 0.546 |
| 510 | 0.067 | 0.857 | 0.463 |
| 515 | 0.080 | 0.903 | 0.394 |

TABLE (I)-continued

| Wavelength λ [nm] | R(λ) | G(λ) | B(λ) |
|---|---|---|---|
| 520 | 0.094 | 0.948 | 0.325 |
| 525 | 0.099 | 0.974 | 0.280 |
| 530 | 0.104 | 1.000 | 0.236 |
| 535 | 0.099 | 0.998 | 0.209 |
| 540 | 0.094 | 0.995 | 0.182 |
| 545 | 0.091 | 0.970 | 0.163 |
| 550 | 0.087 | 0.944 | 0.144 |
| 555 | 0.093 | 0.907 | 0.125 |
| 560 | 0.099 | 0.870 | 0.106 |
| 565 | 0.146 | 0.825 | 0.097 |
| 570 | 0.192 | 0.780 | 0.087 |
| 575 | 0.342 | 0.728 | 0.084 |
| 580 | 0.492 | 0.675 | 0.081 |
| 585 | 0.672 | 0.616 | 0.080 |
| 590 | 0.853 | 0.556 | 0.080 |
| 595 | 0.927 | 0.485 | 0.076 |
| 600 | 1.000 | 0.414 | 0.071 |
| 605 | 1.000 | 0.354 | 0.066 |
| 610 | 1.000 | 0.294 | 0.061 |
| 615 | 0.989 | 0.255 | 0.062 |
| 620 | 0.978 | 0.216 | 0.063 |
| 625 | 0.964 | 0.200 | 0.063 |
| 630 | 0.949 | 0.184 | 0.063 |
| 635 | 0.929 | 0.173 | 0.066 |
| 640 | 0.910 | 0.161 | 0.070 |
| 645 | 0.896 | 0.157 | 0.076 |
| 650 | 0.881 | 0.152 | 0.083 |
| 655 | 0.865 | 0.155 | 0.089 |
| 660 | 0.849 | 0.157 | 0.096 |
| 665 | 0.821 | 0.168 | 0.100 |
| 670 | 0.793 | 0.178 | 0.104 |
| 675 | 0.774 | 0.196 | 0.112 |
| 680 | 0.756 | 0.215 | 0.120 |
| 685 | 0.742 | 0.237 | 0.123 |
| 690 | 0.729 | 0.259 | 0.127 |
| 695 | 0.727 | 0.277 | 0.132 |
| 700 | 0.725 | 0.296 | 0.136 |

$$IE_\theta^{xR} = \sum_{n=0}^{300/\Delta\lambda} \{x(\lambda(n)) - CR_\theta(\lambda(n))\} \times \Delta\lambda \quad (1)$$

$$IE_\theta^{yG} = \sum_{n=0}^{300/\Delta\lambda} \{y(\lambda(n)) - CG_\theta(\lambda(n))\} \times \Delta\lambda \quad (2)$$

$$IE_\theta^{zB} = \sum_{n=0}^{300/\Delta\lambda} \{z(\lambda(n)) - CB_\theta(\lambda(n))\} \times \Delta\lambda \quad (3)$$

TABLE (II)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −4 to 4 | −4 to 4 | −2 to 2 |
| $IE_0^{yG} - IE_{30}^{yG}$ | $IE_0^{yG} - IE_{40}^{yG}$ | $IE_{30}^{yG} - IE_{40}^{yG}$ |
| −4 to 4 | −4 to 4 | −2 to 2 |
| $IE_0^{zB} - IE_{30}^{zB}$ | $IE_0^{zB} - IE_{40}^{zB}$ | $IE_{30}^{zB} - IE_{40}^{zB}$ |
| −4 to 4 | −4 to 4 | −2 to 2 |
| Range | Range | Range |
| 0 to 6 | 0 to 6 | 0 to 3. |

2. The optical filter according to claim 1, wherein nine differences each obtained as a difference between one and another of $IE_\theta^{xR}$, $IE_\theta^{yG}$, and $IE_\theta^{zB}$ defined for incident angles θ° of 0°, 30°, and 40° satisfy requirements shown in Table (III), and ranges satisfy requirements shown in Table (III), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°

TABLE (III)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −3 to 3 | −3 to 3 | −2 to 2 |
| $IE_0^{yG} - IE_{30}^{yG}$ | $IE_0^{yG} - IE_{40}^{yG}$ | $IE_{30}^{yG} - IE_{40}^{yG}$ |
| −3 to 3 | −3 to 3 | −2 to 2 |
| $IE_0^{zB} - IE_{30}^{zB}$ | $IE_0^{zB} - IE_{40}^{zB}$ | $IE_{30}^{zB} - IE_{40}^{zB}$ |
| −3 to 3 | −3 to 3 | −2 to 2 |
| Range | Range | Range |
| 0 to 4 | 0 to 4 | 0 to 2. |

3. The optical filter according to claim 1, wherein nine differences each obtained as a difference between one and another of $IE_\theta^{xR}$, $IE_\theta^{yG}$, and $IE_\theta^{zB}$ defined for incident angles θ° of 0°, 30°, and 40° satisfy requirements shown in Table (IV), and ranges satisfy requirements shown in Table (IV), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°

TABLE (IV)

| $IE_0^{xR} - IE_{30}^{xR}$ | $IE_0^{xR} - IE_{40}^{xR}$ | $IE_{30}^{xR} - IE_{40}^{xR}$ |
|---|---|---|
| −2 to 2 | −2 to 2 | −1 to 1 |
| $IE_0^{yG} - IE_{30}^{yG}$ | $IE_0^{yG} - IE_{40}^{yG}$ | $IE_{30}^{yG} - IE_{40}^{yG}$ |
| −2 to 2 | −2 to 2 | −1 to 1 |
| $IE_0^{zB} - IE_{30}^{zB}$ | $IE_0^{zB} - IE_{40}^{zB}$ | $IE_{30}^{zB} - IE_{40}^{zB}$ |
| −2 to 2 | −2 to 2 | −1 to 1 |
| Range | Range | Range |
| 0 to 3 | 0 to 3 | 0 to 1.5. |

4. The optical filter according to claim 1, wherein nine differences each obtained as a difference between one and another of $IAE_\theta^{xR}$, $IAE_\theta^{yG}$, and $IAE_\theta^{zB}$ defined by the following equations (4) to (6) for incident angles θ° of 0°, 30°, and 40° satisfy requirements shown in Table (V), and ranges satisfy requirements shown in Table (V), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles θ°

$$IAE_\theta^{xR} = \sum_{n=0}^{300/\Delta\lambda} |x(\lambda(n)) - CR_\theta(\lambda(n))| \times \Delta\lambda \quad (4)$$

$$IAE_\theta^{yG} = \sum_{n=0}^{300/\Delta\lambda} |y(\lambda(n)) - CG_\theta(\lambda(n))| \times \Delta\lambda \quad (5)$$

$$IAE_\theta^{zB} = \sum_{n=0}^{300/\Delta\lambda} |z(\lambda(n)) - CB_\theta(\lambda(n))| \times \Delta\lambda \quad (6)$$

TABLE (V)

| $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|
| −3 to 3 | −3 to 3 | −2 to 2 |
| $IAE_0^{yG} - IAE_{30}^{yG}$ | $IAE_0^{yG} - IAE_{40}^{yG}$ | $IAE_{30}^{yG} - IAE_{40}^{yG}$ |
| −3 to 3 | −3 to 3 | −2 to 2 |
| $IAE_0^{zB} - IAE_{30}^{zB}$ | $IAE_0^{zB} - IAE_{40}^{zB}$ | $IAE_{30}^{zB} - IAE_{40}^{zB}$ |
| −3 to 3 | −3 to 3 | −2 to 2 |
| Range | Range | Range |
| 0 to 4 | 0 to 4 | 0 to 2. |

5. The optical filter according to claim 4, wherein
nine differences each obtained as a difference between one and another of $IAE_\theta^{xR}$, $IAE_\theta^{yG}$, and $IAE_\theta^{zB}$ defined for incident angles $\theta°$ of 0°, 30°, and 40° satisfy requirements shown in Table (VI), and
ranges satisfy requirements shown in Table (VI), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$

TABLE (VI)

| $IAE_0^{xR} - IAE_{30}^{xR}$ | $IAE_0^{xR} - IAE_{40}^{xR}$ | $IAE_{30}^{xR} - IAE_{40}^{xR}$ |
|---|---|---|
| −2 to 2 | −2 to 2 | −1 to 1 |
| $IAE_0^{yG} - IAE_{30}^{yG}$ | $IAE_0^{yG} - IAE_{40}^{yG}$ | $IAE_{30}^{yG} - IAE_{40}^{yG}$ |
| −2 to 2 | −2 to 2 | −1 to 1 |
| $IAE_0^{zB} - IAE_{30}^{zB}$ | $IAE_0^{zB} - IAE_{40}^{zB}$ | $IAE_{30}^{zB} - IAE_{40}^{zB}$ |
| −2 to 2 | −2 to 2 | −1 to 1 |
| Range | Range | Range |
| 0 to 3 | 0 to 3 | 0 to 1.5. |

6. The optical filter according to claim 1, wherein
nine differences each obtained as a difference between one and another of $ISE_\theta^{xR}$, $ISE_\theta^{yG}$, and $ISE_\theta^{zB}$ defined by the following equations (7) to (9) for incident angles $\theta°$ of 0°, 30°, and 40° satisfy requirements shown in Table (VII), and
ranges satisfy requirements shown in Table (VII), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$ $$ISE_\theta^{xR} = \sum_{n=0}^{300/\Delta\lambda} \{x(\lambda(n)) - CR_\theta(\lambda(n))\}^2 \times \Delta\lambda \quad (7)$$

$$ISE_\theta^{yG} = \sum_{n=0}^{300/\Delta\lambda} \{y(\lambda(n)) - CG_\theta(\lambda(n))\}^2 \times \Delta\lambda \quad (8)$$

$$ISE_\theta^{zB} = \sum_{n=0}^{300/\Delta\lambda} \{z(\lambda(n)) - CB_\theta(\lambda(n))\}^2 \times \Delta\lambda \quad (9)$$

TABLE (VII)

| $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|
| −2 to 2 | −2 to 2 | −1 to 1 |
| $ISE_0^{yG} - ISE_{30}^{yG}$ | $ISE_0^{yG} - ISE_{40}^{yG}$ | $ISE_{30}^{yG} - ISE_{40}^{yG}$ |
| −2 to 2 | −2 to 2 | −1 to 1 |
| $ISE_0^{zB} - ISE_{30}^{zB}$ | $ISE_0^{zB} - ISE_{40}^{zB}$ | $ISE_{30}^{zB} - ISE_{40}^{zB}$ |
| −2 to 2 | −2 to 2 | −1 to 1 |
| Range | Range | Range |
| 0 to 2 | 0 to 2 | 0 to 1. |

7. The optical filter according to claim 6, wherein
nine differences each obtained as a difference between one and another of $ISE_\theta^{xR}$, $ISE_\theta^{yG}$, and $ISE_\theta^{zB}$ defined for incident angles $\theta°$ of 0°, 30°, and 40° satisfy requirements shown in Table (VIII), and
ranges satisfy requirements shown in Table (VIII), each range being a difference obtained by subtracting the smallest value of three differences from the largest value of the three differences, the three differences obtained from $IE_\theta^{xR}$, $IE_\theta^{yG}$, and $IE_\theta^{zB}$ collectively defined for the same pair selected from the incident angles $\theta°$

TABLE (VIII)

| $ISE_0^{xR} - ISE_{30}^{xR}$ | $ISE_0^{xR} - ISE_{40}^{xR}$ | $ISE_{30}^{xR} - ISE_{40}^{xR}$ |
|---|---|---|
| −1 to 1 | −1 to 1 | −0.5 to 0.5 |
| $ISE_0^{yG} - ISE_{30}^{yG}$ | $ISE_0^{yG} - ISE_{40}^{yG}$ | $ISE_{30}^{yG} - ISE_{40}^{yG}$ |
| −1 to 1 | −1 to 1 | −0.5 to 0.5 |
| $ISE_0^{zB} - ISE_{30}^{zB}$ | $ISE_0^{zB} - ISE_{40}^{zB}$ | $ISE_{30}^{zB} - ISE_{40}^{zB}$ |
| −1 to 1 | −1 to 1 | −0.5 to 0.5 |
| Range | Range | Range |
| 0 to 1 | 0 to 1 | 0 to 0.5. |

8. An imaging apparatus comprising:
a lens system;
an imaging device that receives light having been transmitted through the lens system;
a color filter that is disposed ahead of the imaging device and is a filter of three colors, R (red), G (green), and B (blue); and
the optical filter according to claim 1 that is disposed ahead of the color filter.

9. The optical filter according to claim 1 further comprising:
a SiO$_2$ layer, wherein
the SiO$_2$ layer is disposed between the first light-absorbing layer and the second light-absorbing layer or between the ultraviolet-absorbing layer and any one of the first light-absorbing layer and the second light-absorbing layer.

10. The optical filter according to claim 1 further comprising:
an anti-reflection film comprising a dielectric multilayer.

* * * * *